United States Patent
Luan et al.

(10) Patent No.: US 12,211,864 B2
(45) Date of Patent: Jan. 28, 2025

(54) CAMERA MODULE, AND PHOTOSENSITIVE ASSEMBLY AND MANUFACTURING METHOD THEREFOR

(71) Applicant: NINGBO SUNNY OPOTECH CO., LTD., Zhejiang (CN)

(72) Inventors: Zhongyu Luan, Zhejiang (CN); Zhen Huang, Zhejiang (CN); Li Liu, Zhejiang (CN); Kai Chen, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 467 days.

(21) Appl. No.: 17/631,605

(22) PCT Filed: Jul. 30, 2020

(86) PCT No.: PCT/CN2020/105726
§ 371 (c)(1),
(2) Date: Jan. 31, 2022

(87) PCT Pub. No.: WO2021/018230
PCT Pub. Date: Feb. 4, 2021

(65) Prior Publication Data
US 2022/0278151 A1    Sep. 1, 2022

(30) Foreign Application Priority Data

Aug. 1, 2019  (CN) .......................... 201910709052.9
Aug. 1, 2019  (CN) .......................... 201910709053.3
(Continued)

(51) Int. Cl.
*H01L 27/146*    (2006.01)
*H01L 23/00*     (2006.01)
(Continued)

(52) U.S. Cl.
CPC ........ *H01L 27/14618* (2013.01); *H01L 24/13* (2013.01); *H01L 24/14* (2013.01);
(Continued)

(58) Field of Classification Search
CPC ... H01L 24/81; H01L 27/14683; H01L 24/14; H01L 24/16; H01L 27/14625;
(Continued)

(56) References Cited

U.S. PATENT DOCUMENTS 6,548,909 B2 *   4/2003   Brofman ............ H01L 23/49827
                                              257/E21.511
2001/0020671 A1 *  9/2001  Ansorge ............ H01L 27/14625
                                              257/E27.131
(Continued)

FOREIGN PATENT DOCUMENTS

CN    105580137    5/2016
CN    208836250    5/2019
(Continued)

OTHER PUBLICATIONS

International Search Report issued Nov. 12, 2020 in International (PCT) Application No. PCT/CN2020/105726, with English translation.
(Continued)

*Primary Examiner* — Mouloucoulaye Inoussa
(74) *Attorney, Agent, or Firm* — Wenderoth, Lind & Ponack, L.L.P.

(57) ABSTRACT

Disclosed in the present application are a camera module, and a photosensitive assembly and a manufacturing method therefor. The photosensitive assembly comprises a circuit board, a photosensitive chip electrically connected to the circuit board, and a shaping member provided on the circuit board. A lower surface of the photosensitive chip is attached to the shaping member to form an accommodating space
(Continued)

with the shaping member and the circuit board. The accommodating space is configured so that the photosensitive chip is bent downward during a process of assembling the photosensitive assembly. In this way, the photosensitive chip is bent into a shape adapted to the actual focal plane during the assembly process, so as to improve the imaging quality.

19 Claims, 32 Drawing Sheets

(30) Foreign Application Priority Data

Aug. 1, 2019 (CN) .......................... 201921235825.6
Aug. 1, 2019 (CN) ........................ 201921235828.X

(51) Int. Cl.
*H01L 23/433* (2006.01)
*H04N 23/52* (2023.01)
*H04N 23/54* (2023.01)

(52) U.S. Cl.
CPC .............. *H01L 24/16* (2013.01); *H01L 24/17* (2013.01); *H01L 24/81* (2013.01); *H01L 24/92* (2013.01); *H01L 27/14683* (2013.01); *H01L 23/433* (2013.01); *H01L 24/32* (2013.01); *H01L 24/45* (2013.01); *H01L 24/48* (2013.01); *H01L 24/73* (2013.01); *H01L 24/83* (2013.01); *H01L 2224/13012* (2013.01); *H01L 2224/13013* (2013.01); *H01L 2224/1357* (2013.01); *H01L 2224/1403* (2013.01); *H01L 2224/14051* (2013.01); *H01L 2224/14154* (2013.01); *H01L 2224/16225* (2013.01); *H01L 2224/32237* (2013.01); *H01L 2224/45139* (2013.01); *H01L 2224/45144* (2013.01); *H01L 2224/45147* (2013.01); *H01L 2224/48105* (2013.01); *H01L 2224/48227* (2013.01); *H01L 2224/73257* (2013.01); *H01L 2224/73265* (2013.01); *H01L 2224/81192* (2013.01); *H01L 2224/81201* (2013.01); *H01L 2224/81205* (2013.01); *H01L 2224/83104* (2013.01); *H01L 2224/9202* (2013.01); *H01L 2224/9205* (2013.01); *H01L 2224/92125* (2013.01); *H01L 2224/92227* (2013.01); *H04N 23/52* (2023.01); *H04N 23/54* (2023.01)

(58) Field of Classification Search
CPC ... H01L 24/92; H01L 27/14618; H01L 24/17; H01L 24/13; H01L 27/14685; H01L 24/45; H01L 23/433; H01L 24/83; H01L 24/73; H01L 24/32; H01L 24/48; H01L 31/0203; H01L 31/02325; H01L 31/035281; H01L 24/08; H01L 27/14687; H01L 27/14601; H01L 31/02005; H01L 21/6835; H01L 24/97; H01L 21/52; H01L 31/1892; H01L 27/14698; H01L 27/14607; H01L 27/14621; H01L 27/14627; H01L 2224/45147; H01L 2224/83385; H01L 2224/13012; H01L 2224/13013; H01L 2224/9205; H01L 2224/73257; H01L 2224/92227; H01L 2224/81205; H01L 2224/45139; H01L 2224/32237; H01L 2224/81201; H01L 2224/48105; H01L 2224/48227; H01L 2224/75; H01L 2224/9202; H01L 2224/92125; H01L 2224/83104; H01L 2224/1403; H01L 2224/81192; H01L 2224/14154; H01L 2224/73265; H01L 2224/14051; H01L 2224/16225; H01L 2924/00011; H01L 2224/45144; H01L 2924/00014; H01L 2924/01049; H01L 2221/68363; H01L 2224/08235; H04N 23/52; H04N 23/54; H04N 1/028; H04N 3/155; H04N 25/6153

See application file for complete search history.

(56) References Cited

U.S. PATENT DOCUMENTS

| | | | |
|---|---|---|---|
| 2001/0040639 A1* | 11/2001 | Iwasaki | H04N 23/54 348/374 |
| 2005/0263836 A1* | 12/2005 | Okada | H01L 24/32 257/415 |
| 2009/0115875 A1* | 5/2009 | Choi | H04N 25/00 257/E31.127 |
| 2012/0217606 A1* | 8/2012 | Itonaga | H01L 31/0203 438/66 |
| 2012/0299140 A1* | 11/2012 | Sekine | H01L 27/14607 257/E31.127 |
| 2013/0075849 A1* | 3/2013 | Suzuki | H01L 24/32 257/E31.127 |
| 2015/0341578 A1 | 11/2015 | Lewkow et al. | |
| 2016/0099285 A1* | 4/2016 | Kumagai | H01L 27/14698 438/66 |
| 2016/0240582 A1 | 8/2016 | Yamamoto et al. | |
| 2016/0351607 A1 | 12/2016 | Liu et al. | |
| 2017/0301710 A1* | 10/2017 | Shin | H01L 27/14605 |
| 2017/0323915 A1* | 11/2017 | Tanaka | H01L 27/14625 |
| 2022/0199572 A1* | 6/2022 | Rochas | H01L 31/0203 |
| 2023/0013088 A1* | 1/2023 | Kimura | H04N 25/70 |
| 2023/0356520 A1* | 11/2023 | Ramaswamy | B32B 43/006 |

FOREIGN PATENT DOCUMENTS

| | | |
|---|---|---|
| CN | 208836254 | 5/2019 |
| CN | 208956159 | 6/2019 |
| CN | 209861012 | 12/2019 |
| CN | 209861013 | 12/2019 |
| JP | 2001-156278 | 6/2001 |
| JP | 2012-28620 | 2/2012 |

OTHER PUBLICATIONS

Extended European Search Report issued Aug. 4, 2022 in European Patent Application No. 20847045.0.
Office Action issued Dec. 14, 2023 in European Patent Application No. 20 847 045.0.

* cited by examiner

CAMERA MODULE, AND PHOTOSENSITIVE ASSEMBLY AND MANUFACTURING METHOD THEREFOR

TECHNICAL FIELD

The present application relates to the field of camera module, and in particular to a camera module, and a photosensitive assembly and a manufacturing method therefor, wherein a flat photosensitive chip is bent into a shape adapted to an actual focal imaging plane through a special manufacturing process. In this way, the imaging quality of the camera module is improved.

TECHNICAL BACKGROUND

Camera modules are important image sensing equipment. As consumers have higher and higher requirements for image quality of terminal equipment (such as smart phones), the size of the photosensitive chips used by the camera modules has gradually increased, which has caused a series of technical problems, such as chip deformation, poor chip heat dissipation, etc. These technical problems cannot be properly solved in the existing manufacturing processes of the camera modules.

Therefore, there is a need for an improved camera module structure and manufacturing solution to provide a camera module that meets the requirements.

SUMMARY

A main objective of the present application is to provide a camera module, a photosensitive assembly and a manufacturing method therefor, wherein a flat photosensitive chip can be bent into a shape adapted to an actual focal imaging plane. In this way, the imaging quality of the camera module is improved.

Another objective of the present application is to provide a camera module, a photosensitive assembly and a manufacturing method therefor, wherein the photosensitive chip of the camera module is still in a plane shape during transportation, so that it can still be transported in form of an array.

Another objective of the present application is to provide a camera module, a photosensitive assembly and a manufacturing method therefor, wherein the chip manufacturer does not need to change the existing photosensitive chip manufacturing process, that is, the photosensitive assembly manufacturing process provided by the present application can be implemented based on an existing planar photosensitive chip.

Another objective of the present application is to provide a camera module, a photosensitive assembly and a manufacturing method therefor, wherein a heat dissipation member for enhancing heat dissipation of the photosensitive chip is included in the accommodating space below the photosensitive chip, so as to enhance the heat dissipation performance of the camera module.

The present application is made to achieve at least one of the above objectives or advantages. An embodiment of the present application provides a photosensitive assembly, comprising:
   a circuit board;
   a photosensitive chip electrically connected to the circuit board; and
   a shaping member disposed on the circuit board, wherein a lower surface of the photosensitive chip is attached to the shaping member to form an accommodating space with the shaping member and the circuit board, wherein the circuit board has at least one opening formed therethrough and communicated with the accommodating space, and wherein the accommodating space and the opening are configured so that the photosensitive chip is bent downward during a process of assembling the photosensitive assembly.

In an embodiment of the present application, the at least one opening is configured so that at least one suction device can be inserted into the accommodating space by means of the at least one opening and attached to at least a part of the lower surface of the photosensitive chip, so as to cause the photosensitive chip to be bent downward by pulling force.

In an embodiment of the present application, the shaping member comprises a first shaping piece and a second shaping piece, the first shaping piece forms the accommodating space with the photosensitive chip and the circuit board, the second shaping piece is disposed on the circuit board and is located in the accommodating space, and a height of the second shaping piece is lower than that of the first shaping piece.

In an embodiment of the present application, an upper surface of at least one of the first shaping piece and the second shaping piece comprises an arc-shaped surface recessed downward and inward, and the arc-shaped surface is configured so that when the photosensitive chip is bent downward, a lower surface adapted to a focal imaging plane of the photosensitive assembly is formed.

In an embodiment of the present application, the circuit board has at least one opening formed therethrough and communicated with the accommodating space, and the at least one opening is configured to discharge gas in the accommodating space during the process of assembling the photosensitive assembly so that the photosensitive chip is bent downward.

In an embodiment of the present application, a position where the opening is formed in the circuit board corresponds to a central area of the photosensitive chip.

In an embodiment of the present application, a position where the opening is formed in the circuit board is located between the first shaping piece and the second shaping piece.

In an embodiment of the present application, a position where a part of the opening is formed in the circuit board corresponds to a central area of the photosensitive chip, and a position where another part of the opening is formed in the circuit board is located between the first shaping piece and the second shaping piece.

In an embodiment of the present application, positions where the openings are formed in the circuit board are symmetrically arranged with respect to a center of the photosensitive chip.

In an embodiment of the present application, positions where another part of the openings are formed in the circuit board are symmetrically arranged with respect to a center of the photosensitive chip.

In an embodiment of the present application, the second shaping pieces are symmetrically arranged with respect to a center of the photosensitive chip.

In an embodiment of the present application, the second shaping pieces are symmetrically arranged on both sides of a center line set by longer sides of the photosensitive chip.

In an embodiment of the present application, a cross-sectional shape of the first shaping piece is a closed annular shape.

In an embodiment of the present application, the first shaping piece comprises a first shaping piece body and an adhesive applied to the first shaping piece body, and the second shaping piece comprises a second shaping piece body and an adhesive applied to the second shaping piece body.

A cross-sectional shape of the second shaping piece is a closed annular shape, wherein the shaping member further comprises an adhesive disposed between the first shaping piece and the second shaping piece, and wherein a height of the adhesive is lower than the height of the second shaping piece.

In an embodiment of the present application, the first shaping piece body and the second shaping piece body are integrally molded on a top surface of the circuit board.

In an embodiment of the present application, the first shaping piece body and the second shaping piece body are made of metal materials.

In an embodiment of the present application, the first shaping piece body and the second shaping piece body are prefabricated and mounted on the circuit board.

In an embodiment of the present application, the first shaping piece body and the second shaping piece body are integrally molded on a top surface of the circuit board through an electroplating process.

In an embodiment of the present application, the photosensitive assembly further comprises a heat dissipation member, wherein the heat dissipation member is formed in the accommodating space, and wherein the heat dissipation member is attached to at least a part of the lower surface of the photosensitive chip.

In an embodiment of the present application, the heat dissipation member is formed by a heat dissipation material entering the accommodating space via the at least one opening.

In an embodiment of the present application, the photosensitive assembly further comprises at least one electronic component arranged in a non-photosensitive area of the photosensitive chip.

In an embodiment of the present application, the photosensitive assembly further comprises a bracket disposed on the circuit board, wherein the bracket forms a light-passing hole corresponding to a photosensitive area of the photosensitive chip.

In an embodiment of the present application, the bracket is integrally molded on the circuit board through a molding process, so as to integrally cover at least a part of the circuit board and at least a part of the at least one electronic component.

In an embodiment of the present application, the bracket is integrally molded on the circuit board through a molding process, so as to integrally cover at least a part of the circuit board, the at least one electronic component and at least a part of the non-photosensitive area of the photosensitive chip.

In an embodiment of the present application, an inner side surface of the bracket is perpendicular to an upper surface of the photosensitive chip.

In an embodiment of the present application, the inner side surface of the bracket extends obliquely outward.

In an embodiment of the present application, the bracket comprises a mounting platform formed on a top surface of the bracket in a recessed manner for supporting a filter element thereon.

In an embodiment of the present application, the photosensitive assembly further comprises a side encapsulation enclosing the outsides of the photosensitive chip and the shaping member, so as to prevent the position of the photosensitive chip from shifting during the molding process.

In an embodiment of the present application, the photosensitive assembly further comprises a filter element held in a photosensitive path of the photosensitive assembly.

In an embodiment of the present application, after the filter element is stacked above the photosensitive element and the bracket is integrally molded on the circuit board through a molding process, the bracket integrally covers at least a part of the circuit board, the at least one electronic component, at least a part of a non-photosensitive area of the photosensitive chip, and at least a part of the filter element.

In an embodiment of the present application, the filter element is supported on the top of the bracket.

In an embodiment of the present application, the filter element is mounted on the mounting platform of the bracket.

In an embodiment of the present application, the photosensitive assembly further comprises a filter element holder, and the filter element holder is mounted on the bracket, and is used for mounting the filter element.

According to another aspect of the present application, the present application further provides a camera module, comprising:
 an optical lens; and
 a photosensitive assembly as described above, wherein the optical lens is held in a photosensitive path of the photosensitive assembly.

In an embodiment of the present application, a curved shape of the lower surface of the photosensitive chip is adapted to a shape of an actual focal imaging plane of the camera module.

In an embodiment of the present application, the optical lens is mounted on the bracket.

In an embodiment of the present application, the camera module further comprises a driving element, wherein the driving element is supported on the bracket, and the optical lens is mounted on the driving element.

In an embodiment of the present application, the optical lens is mounted on the filter element holder.

According to still another aspect of the present application, there is further provided a method for manufacturing a photosensitive assembly, comprising:
 providing a circuit board, a photosensitive chip, a first shaping piece and a second shaping piece, wherein the circuit board comprises at least one opening;
 disposing the first shaping piece and the second shaping piece on the circuit board, wherein a height of the second shaping piece is smaller than that of the first shaping piece;
 attaching a lower surface of the photosensitive chip to the first shaping piece to form an accommodating space with the shaping member and the circuit board, wherein the at least one opening is communicated with the accommodating space, and wherein the second shaping piece is located in the accommodating space;
 attaching a suction device to at least a part of the lower surface of the photosensitive chip through the opening; and
 pulling down the photosensitive chip by the suction device so that the photosensitive chip is bent downward.

In an embodiment of the present application, an upper surface of at least one of the first shaping piece and the second shaping piece comprises an arc-shaped surface recessed downward and inward, and wherein said pulling down the photosensitive chip by the suction device so that the photosensitive chip is bent downward comprises:

bending the photosensitive chip until the lower surface of the photosensitive chip is attached to the arc-shaped surface, so that when the photosensitive chip is bent downward, a lower surface adapted to a focal imaging plane of the photosensitive assembly is formed.

In an embodiment of the present application, after said disposing the first shaping piece and the second shaping piece on the circuit board, and before said attaching the lower surface of the photosensitive chip to the first shaping piece to form an accommodating space with the shaping member and the circuit board, the method further comprises:

applying an adhesive between the first shaping piece and the second shaping piece, wherein a height of an upper surface of the adhesive is lower than that of the second shaping piece.

In an embodiment of the present application, a position where the opening is formed in the circuit board corresponds to a central area of the photosensitive chip.

In an embodiment of the present application, the method further comprises:

injecting a heat dissipation material into the accommodating space through the opening to form the heat dissipation member in the accommodating space, wherein the heat dissipation member is attached to at least a part of the lower surface of the photosensitive chip.

According to still another aspect of the present application, there is further provided a method for manufacturing a photosensitive assembly, comprising:

providing a circuit board and a photosensitive chip, wherein the circuit board comprises at least one opening;

integrally molding a first shaping piece and a second shaping piece on the circuit board, wherein a height of the second shaping piece is smaller than that of the first shaping piece;

attaching a lower surface of the photosensitive chip to the first shaping piece to form an accommodating space with the shaping member and the circuit board, wherein the at least one opening is communicated with the accommodating space, and wherein the second shaping piece is located in the accommodating space;

attaching a suction device to at least a part of the lower surface of the photosensitive chip through the opening; and pulling down the photosensitive chip by the suction device so that the photosensitive chip is bent downward.

In an embodiment of the present application, an upper surface of at least one of the first shaping piece and the second shaping piece comprises an arc-shaped surface recessed downward and inward, and wherein said pulling down the photosensitive chip by the suction device so that the photosensitive chip is bent downward comprises:

bending the photosensitive chip until the lower surface of the photosensitive chip is attached to the arc-shaped surface, so that when the photosensitive chip is bent downward, a lower surface adapted to a focal imaging plane of the photosensitive assembly is formed.

In an embodiment of the present application, said integrally molding the first shaping piece and the second shaping piece on the circuit board comprises:

integrally molding a first shaping piece body and a second shaping piece body on the circuit board through an electroplating process; and applying an adhesive to the first shaping piece body and the second shaping piece body separately.

In an embodiment of the present application, after said integrally molding the first shaping piece and the second shaping piece on the circuit board, and before said attaching the lower surface of the photosensitive chip to the first shaping piece to form the accommodating space with the shaping member and the circuit board, the manufacturing method further comprises:

applying an adhesive between the first shaping piece and the second shaping piece, wherein a height of an upper surface of the adhesive is lower than that of the second shaping piece.

In an embodiment of the present application, an upper surface of at least one of the first shaping piece and the second shaping piece comprises an arc-shaped surface recessed downward and inward, and wherein said pulling down the photosensitive chip by the suction device so that the photosensitive chip is bent downward comprises:

bending the photosensitive chip until the lower surface of the photosensitive chip is attached to the arc-shaped surface, so that when the photosensitive chip is bent downward, a lower surface adapted to a focal imaging plane of the photosensitive assembly is formed.

In an embodiment of the present application, a position where the opening is formed in the circuit board corresponds to a central area of the photosensitive chip.

In an embodiment of the present application, the method further comprises:

injecting a heat dissipation material into the accommodating space through the opening to form the heat dissipation member in the accommodating space, wherein the heat dissipation member is attached to at least a part of the lower surface of the photosensitive chip.

According to still another aspect of the present application, there is further provided a photosensitive assembly, comprising:

a circuit board;

a photosensitive chip electrically connected to the circuit board; and a shaping member disposed on the circuit board, wherein a lower surface of the photosensitive chip is attached to the shaping member to form an accommodating space with the shaping member and the circuit board, and wherein the accommodating space is configured so that the photosensitive chip is bent downward during a process of assembling the photosensitive assembly.

In an embodiment of the present application, the shaping member comprises a first shaping piece and a second shaping piece, the first shaping piece forms the accommodating space with the photosensitive chip and the circuit board, the second shaping piece is disposed on the circuit board and is located in the accommodating space, and a height of the second shaping piece is lower than that of the first shaping piece.

In an embodiment of the present application, an upper surface of at least one of the first shaping piece and the second shaping piece comprises an arc-shaped surface recessed downward and inward, and the arc-shaped surface is configured so that when the photosensitive chip is bent downward, a lower surface adapted to a focal imaging plane of the photosensitive assembly is formed.

In an embodiment of the present application, the circuit board has at least one opening formed therethrough and communicated with the accommodating space, and the at least one opening is configured to discharge gas in the accommodating space during the process of assembling the photosensitive assembly so that the photosensitive chip is bent downward.

In an embodiment of the present application, a position where the opening is formed in the circuit board corresponds to a central area of the photosensitive chip.

In an embodiment of the present application, the second shaping pieces are symmetrically arranged with respect to a center of the photosensitive chip.

In an embodiment of the present application, the second shaping pieces are symmetrically arranged on both sides of a center line set by longer sides of the photosensitive chip.

In an embodiment of the present application, a cross-sectional shape of the first shaping piece is a closed annular shape.

In an embodiment of the present application, a position where the opening is formed in the circuit board is located between the first shaping piece and the second shaping piece.

In an embodiment of the present application, a position where a part of the opening is formed in the circuit board corresponds to a central area of the photosensitive chip, and a position where another part of the opening is formed in the circuit board is located between the first shaping piece and the second shaping piece.

In an embodiment of the present application, a position where the opening is formed in the circuit board is symmetrically arranged with respect to a center of the photosensitive chip.

In an embodiment of the present application, positions where another part of the openings are formed in the circuit board are symmetrically arranged with respect to a center of the photosensitive chip.

In an embodiment of the present application, the second shaping pieces are symmetrically arranged with respect to a center of the photosensitive chip.

In an embodiment of the present application, the second shaping pieces are symmetrically arranged on both sides of a center line set by longer sides of the photosensitive chip.

In an embodiment of the present application, the shaping member further comprises an adhesive applied between the first shaping piece and the second shaping piece, and wherein a height of the adhesive is higher than that of an upper surface of the second shaping piece.

In an embodiment of the present application, the first shaping piece comprises a first shaping piece body and an adhesive applied to the first shaping piece body, and wherein the second shaping piece comprises a second shaping piece body and an adhesive applied to the second shaping piece body.

In an embodiment of the present application, the first shaping piece body and the second shaping piece body are integrally molded on a top surface of the circuit board.

In an embodiment of the present application, the first shaping piece body and the second shaping piece body are prefabricated and mounted on the circuit board. In an embodiment of the present application, the first shaping piece body and the second shaping piece body are made of metal materials.

In an embodiment of the present application, the first shaping piece body and the second shaping piece body are integrally molded on a top surface of the circuit board through an electroplating process.

In an embodiment of the present application, the photosensitive assembly further comprises a heat dissipation member, and the heat dissipation member is formed in the accommodating space and attached to at least a part of the lower surface of the photosensitive chip.

In an embodiment of the present application, the heat dissipation member is formed by a heat dissipation material entering the accommodating space through the at least one opening.

In an embodiment of the present application, at least one of the openings forms a ventilation hole.

In an embodiment of the present application, the photosensitive assembly further comprises at least one electronic component arranged in a non-photosensitive area of the photosensitive chip.

In an embodiment of the present application, the photosensitive assembly further comprises a bracket disposed on the circuit board, wherein the bracket forms a light-passing hole corresponding to a photosensitive area of the photosensitive chip.

In an embodiment of the present application, the bracket is integrally molded on the circuit board through a molding process, so as to integrally cover at least a part of the circuit board and at least a part of the at least one electronic component.

In an embodiment of the present application, the bracket is integrally molded on the circuit board to integrally cover at least a part of the circuit board, the at least one electronic component, and at least a part of a non-photosensitive area of the photosensitive chip.

In an embodiment of the present application, an inner side surface of the bracket is perpendicular to an upper surface of the photosensitive chip.

In an embodiment of the present application, the inner side surface of the bracket extends obliquely outward.

In an embodiment of the present application, the bracket comprises a mounting platform formed on a top surface of the bracket in a recessed manner for supporting a filter element thereon.

In an embodiment of the present application, the photosensitive assembly further comprises a side encapsulation enclosing the outsides of the photosensitive chip and the shaping member, so as to prevent the position of the photosensitive chip from shifting during the molding process.

In an embodiment of the present application, the photosensitive assembly further comprises a filter element held in a photosensitive path of the photosensitive assembly.

In an embodiment of the present application, after the filter element is stacked above the photosensitive element and the bracket is integrally molded on the circuit board through a molding process, the bracket integrally covers at least a part of the circuit board, the at least one electronic component, at least a part of a non-photosensitive area of the photosensitive chip, and at least a part of the filter element.

In an embodiment of the present application, the filter element is supported on the top of the bracket.

In an embodiment of the present application, the filter element is mounted on the mounting platform of the bracket.

In an embodiment of the present application, the photosensitive assembly further comprises a filter element holder, and the filter element holder is mounted on the bracket, and is used for mounting the filter element.

According to still another aspect of the present application, the present application further provides a camera module, comprising:
    an optical lens; and
    a photosensitive assembly as described above, wherein the optical lens is held in a photosensitive path of the photosensitive assembly.

In an embodiment of the present application, a curved shape of the lower surface of the photosensitive chip is adapted to a shape of an actual focal imaging plane of the camera module.

In an embodiment of the present application, the optical lens is mounted on the bracket.

In an embodiment of the present application, the camera module further comprises a driving element, wherein the driving element is supported on the bracket, and the optical lens is mounted on the driving element.

According to still another aspect of the present application, there is further provided a method for manufacturing a photosensitive assembly, comprising:

providing a circuit board, a photosensitive chip, a first shaping piece and a second shaping piece, wherein the circuit board comprises at least one opening;

disposing the first shaping piece and the second shaping piece on the circuit board, wherein a height of the second shaping piece is smaller than that of the first shaping piece;

attaching a lower surface of the photosensitive chip to the first shaping piece to form an accommodating space with the shaping member and the circuit board, wherein the at least one opening is communicated with the accommodating space, and wherein the second shaping piece is located in the accommodating space; and discharging gas in the accommodating space through the at least one opening to generate a pressure difference between an upper surface and the lower surface of the photosensitive chip so that the photosensitive chip is bent downward.

In an embodiment of the present application, an upper surface of at least one of the first shaping piece and the second shaping piece comprises an arc-shaped surface recessed downward and inward, and wherein said discharging gas in the accommodating space through the at least one opening to generate a pressure difference between an upper surface and the lower surface of the photosensitive chip so that the photosensitive chip is bent downward comprises:

bending the photosensitive chip until the lower surface of the photosensitive chip is attached to the arc-shaped surface, so that when the photosensitive chip is bent downward, a lower surface adapted to a focal imaging plane of the photosensitive assembly is formed.

In an embodiment of the present application, a position where the opening is formed in the circuit board corresponds to a central area of the photosensitive chip.

In an embodiment of the present application, the method further comprises:

injecting a heat dissipation material into the accommodating space through the opening to form the heat dissipation member in the accommodating space, wherein the heat dissipation member is attached to at least a part of the lower surface of the photosensitive chip.

According to still another aspect of the present application, there is further provided a method for manufacturing a photosensitive assembly, comprising:

providing a circuit board and a photosensitive chip, wherein the circuit board comprises at least one opening;

integrally molding a first shaping piece and a second shaping piece on the circuit board, wherein a height of the second shaping piece is smaller than that of the first shaping piece;

attaching a lower surface of the photosensitive chip to the first shaping piece to form an accommodating space with the shaping member and the circuit board, wherein the at least one opening is communicated with the accommodating space, and wherein the second shaping piece is located in the accommodating space; and discharging gas in the accommodating space through the at least one opening to generate a pressure difference between an upper surface and the lower surface of the photosensitive chip so that the photosensitive chip is bent downward.

In an embodiment of the present application, said integrally molding the first shaping piece and the second shaping piece on the circuit board comprises:

integrally molding a first shaping piece body and a second shaping piece body on the circuit board through an electroplating process; and applying an adhesive to the first shaping piece body and the second shaping piece body separately.

In an embodiment of the present application, an upper surface of at least one of the first shaping piece and the second shaping piece comprises an arc-shaped surface recessed downward and inward, and wherein said discharging gas in the accommodating space through the at least one opening to generate a pressure difference between an upper surface and the lower surface of the photosensitive chip so that the photosensitive chip is bent downward comprises:

bending the photosensitive chip until the lower surface of the photosensitive chip is attached to the arc-shaped surface, so that when the photosensitive chip is bent downward, a lower surface adapted to a focal imaging plane of the photosensitive assembly is formed.

In an embodiment of the present application, a position where the opening is formed in the circuit board corresponds to a central area of the photosensitive chip.

In an embodiment of the present application, the method further comprises:

injecting a heat dissipation material into the accommodating space through the opening to form the heat dissipation member in the accommodating space, wherein the heat dissipation member is attached to at least a part of the lower surface of the photosensitive chip.

Further objectives and advantages of the present application will be fully embodied through the understanding of the following description and the drawings.

These and other objectives, characteristics and advantages of the present application are fully embodied through the following detailed description, drawings and claims.

BRIEF DESCRIPTION OF THE DRAWINGS

The above and other objectives, features, and advantages of the present application will become more apparent from the detailed description of the embodiments of the present application in conjunction with the drawings. The drawings, which are used to provide a further understanding of the embodiments of the present application and constitute a part of the description, are used to explain the present application together with the embodiments of the present application, and do not constitute a limitation of the present application. In the drawings, the same reference signs generally represent the same members or steps.

DETAILED DESCRIPTION OF THE EMBODIMENTS

Hereinafter, exemplary embodiments according to the present application will be described in detail with reference to the drawings. Obviously, the described embodiments are only a part of the embodiments of the present application, rather than all the embodiments of the present application. It should be understood that the present application is not limited by the exemplary embodiments described herein.
Overview of Application As described above, as consumers have higher and higher requirements for image quality of terminal equipment, the size of the photosensitive chips used by the camera modules has gradually increased, which has caused a series of technical problems. Moreover, these technical problems cannot be properly solved in the existing manufacturing processes of the camera modules. Therefore, there is a need for an improved camera module structure and manufacturing solution therefor to produce a photosensitive assembly and a camera module that meet the performance requirements.

Specifically, the existing camera module is usually assembled through a Chip on Board (COB) process: picking up a photosensitive chip→attaching it to a circuit board-→attaching and mounting a plastic bracket to the circuit board. However, as the size continues to increase, the photosensitive chip is prone to deformation during the pickup process.

Figure 1:
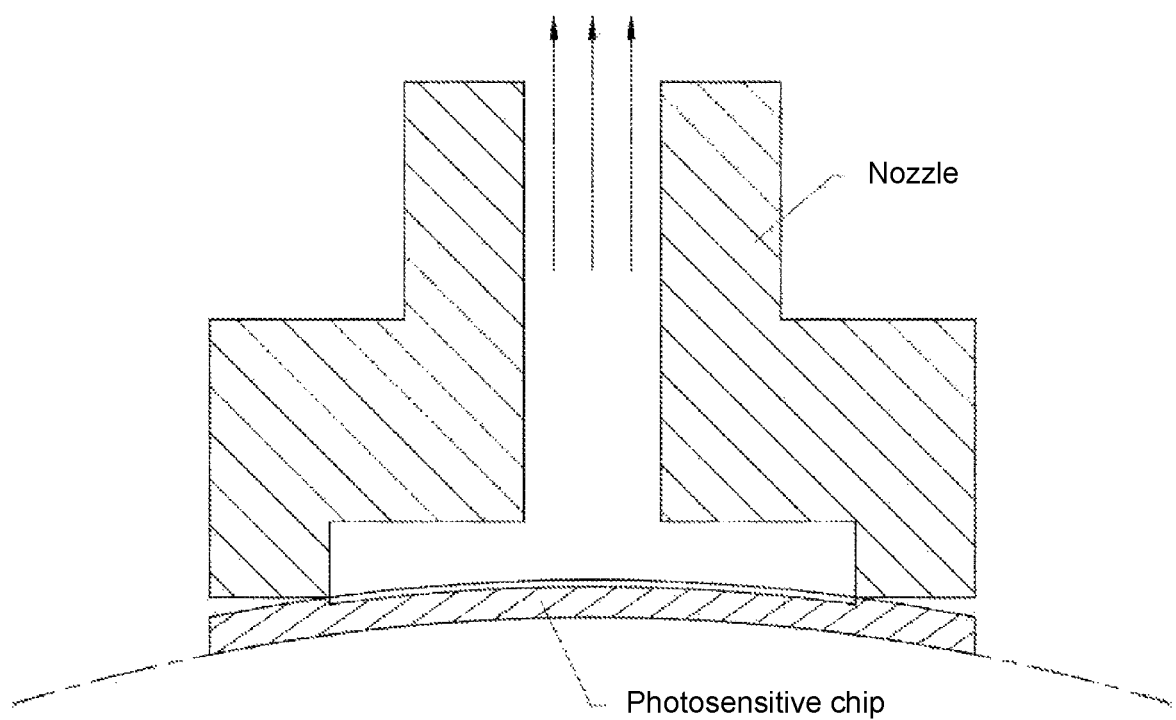
FIG. 1 illustrates a schematic diagram of a pickup process of a photosensitive chip in an existing COB assembly process.

FIG. 1 illustrates a schematic diagram of a pickup process of a photosensitive chip in an existing COB assembly process. As shown in FIG. 1, in the existing COB assembly process, the photosensitive chip is picked up by means of suction, and since the photosensitive area of the photosensitive chip cannot be contacted, the nozzle of the pickup device can only be attached to the non-photosensitive area of the photosensitive chip. During the pick-up process, due to the suction and adhesion effect of the nozzle, the photosensitive chip will bend towards the photosensitive surface of the photosensitive chip due to being sucked, showing an upward convex shape (from the effect shown in FIG. 1, vividly speaking, the curved shape of the photosensitive chip can be defined as a "crying face" shape).

It should be known by those skilled in the art that even if the photosensitive chip is not deformed in a "crying face" shape (that is, the photosensitive chip is flat), due to the different optical path differences between the edge part and the central part of the photosensitive chip relative to the optical lens, when the light center reaches the edge part of the photosensitive chip, undesirable phenomena such as distortion, loss of light at the corners, and drop in the acute angle are prone to occur, resulting in poor imaging effect. After the "crying face" shape of deformation occurs, these undesirable phenomena will be further exacerbated, which will seriously affect the imaging quality.

Figure 2:
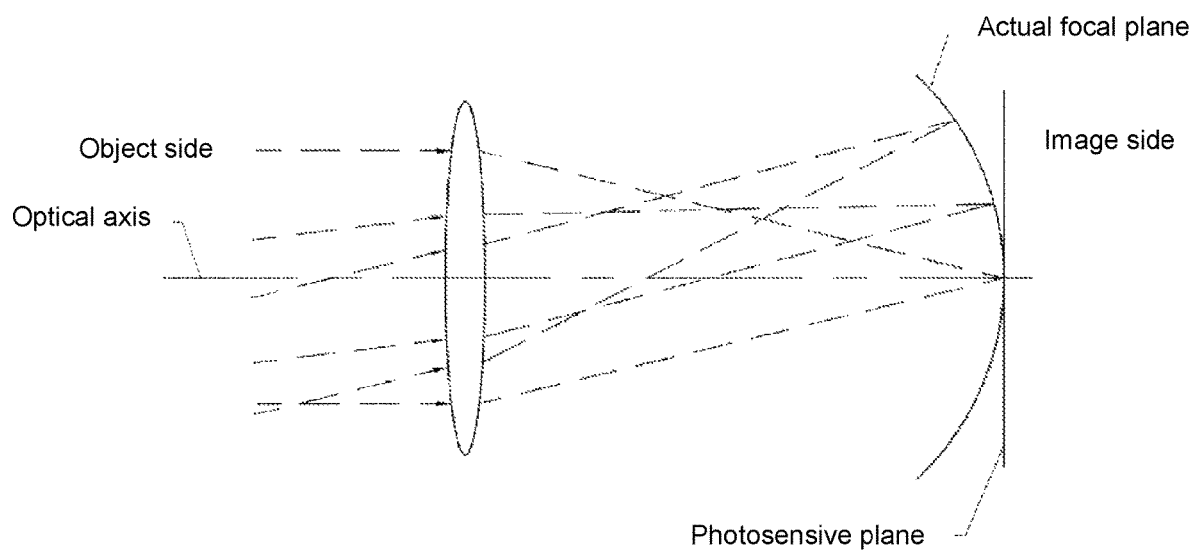
FIG. 2 illustrates a schematic diagram of an imaging optical path of a camera module.

Specifically, FIG. 2 illustrates a schematic diagram of an imaging light path of a camera module. As shown in FIG. 2, during the imaging process of the camera module, (generally, the side where the optical lens is located is defined as an object side, and the side where the photosensitive chip is located is defined as an image side) the actual focal plane (actual focal imaging plane) forms an arc shape that is convex towards the image side, that is, the actual focal plane is an arc-shaped surface. It should be known by those skilled in the art that when the plane where the photosensitive chip is located coincides with the focal plane, the imaging quality is the best. However, in practice, even if multiple lenses are used to modulate the optical system of the camera module, the focal plane will still appear as an arc-shaped surface. This is also the reason why there are still undesirable phenomena such as distortion, loss of light at the corners, and drop in the acute angle even if the photosensitive chip is not deformed during the pickup process. However, due to the "crying face" shape of deformation of the photosensitive chip during the pickup process, it can be seen by comparing the shape of the actual focal plane in FIG. 2 that the deformation of the "crying face" shape is just opposite to that of the actual focal plane, so that the degree of undesirable phenomena such as distortion, loss of light at the corners, and drop in the acute angle is exacerbated, and the imaging quality of the camera module is more seriously affected.

In order to solve the problem of "crying face"-shaped bending of the photosensitive chip, there is currently a technical direction to provide a photosensitive chip with a "smiley face" bending (for related technologies, please refer to Chinese Patent Application No. CN201480052226.4). Although the curved photosensitive chip can alleviate the above technical problem, it brings a series of new problems, and some technical problems are difficult to overcome in the actual industry.

Specifically, firstly, how to mount the curved photosensitive chip in the camera module needs to be solved urgently, because the existing camera module assembly process is aimed at the flat photosensitive chip. Secondly, compared with the flat photosensitive chip, the manufacturing process for the curved photosensitive chip is more complicated and the process is more difficult. In addition, most photosensitive chip manufacturers and camera module manufacturers are currently separated. Compared with flat photosensitive chips, curved photosensitive chips have a big problem in transportation, because the flat photosensitive chips can be transported by means of array, and it is difficult to transport the curved photosensitive chips by means of array.

In addition to the imaging problem, as the size of the photosensitive chip continues to increase (or the frame rate increases), the photosensitive chip will generate a lot of heat during the working process, and how to achieve heat dissipation is also an urgent problem to be solved.

In view of the above technical problems, the basic idea of the present application is to bend the flat photosensitive chip into a shape adapted to the actual focal imaging plane through a special manufacturing process. In this way, the imaging quality of the camera module is improved. Moreover, a heat dissipation member for enhancing heat dissipation is formed on the back side of the photosensitive chip, so as to solve the problem of heat dissipation.

Based on this, the present application proposes a photosensitive assembly, which includes: a circuit board, a photosensitive chip and a shaping member, wherein the circuit board has at least one opening formed therethrough, and the photosensitive chip is electrically connected to the circuit board, and the lower surface of the photosensitive chip is attached to the shaping member to form an accommodating space with the shaping member and the circuit board, and wherein the accommodating space is communicated with the at least one opening, and is configured so that the photosensitive chip is bent downward during the process of assembling the photosensitive assembly. In this way, the flat photosensitive chip is bent into a shape adapted to the actual focal imaging plane through a special manufacturing process, so as to improve the imaging quality of the camera module.

Based on this, the present application further provides a photosensitive assembly, which includes: a photosensitive chip and a shaping member, wherein the circuit board has at least one opening formed therethrough, the photosensitive chip is electrically connected to the circuit board, and the lower surface of the photosensitive chip is attached to the shaping member to form an accommodating space with the shaping member and the circuit board, and wherein the accommodating space is communicated with the at least one opening, and is configured so that the photosensitive chip is bent downward during assembly of the photosensitive assembly. In this way, the flat photosensitive chip is bent into a shape adapted to the actual focal imaging plane through a special manufacturing process, so as to improve the imaging quality of the camera module.

After introducing the basic principles of the present application, various non-limiting embodiments of the present application will be specifically introduced below with reference to the drawings.

Exemplary Photosensitive Assembly and Manufacturing Method Therefor

Figure 3:
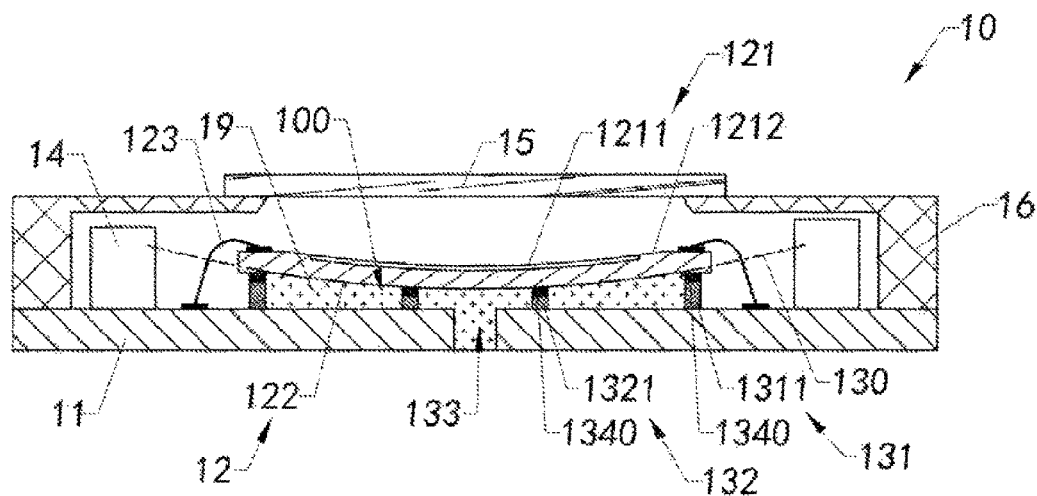
FIG. 3 illustrates a schematic view of a photosensitive assembly according to an embodiment of the present application.
Figure 4A:
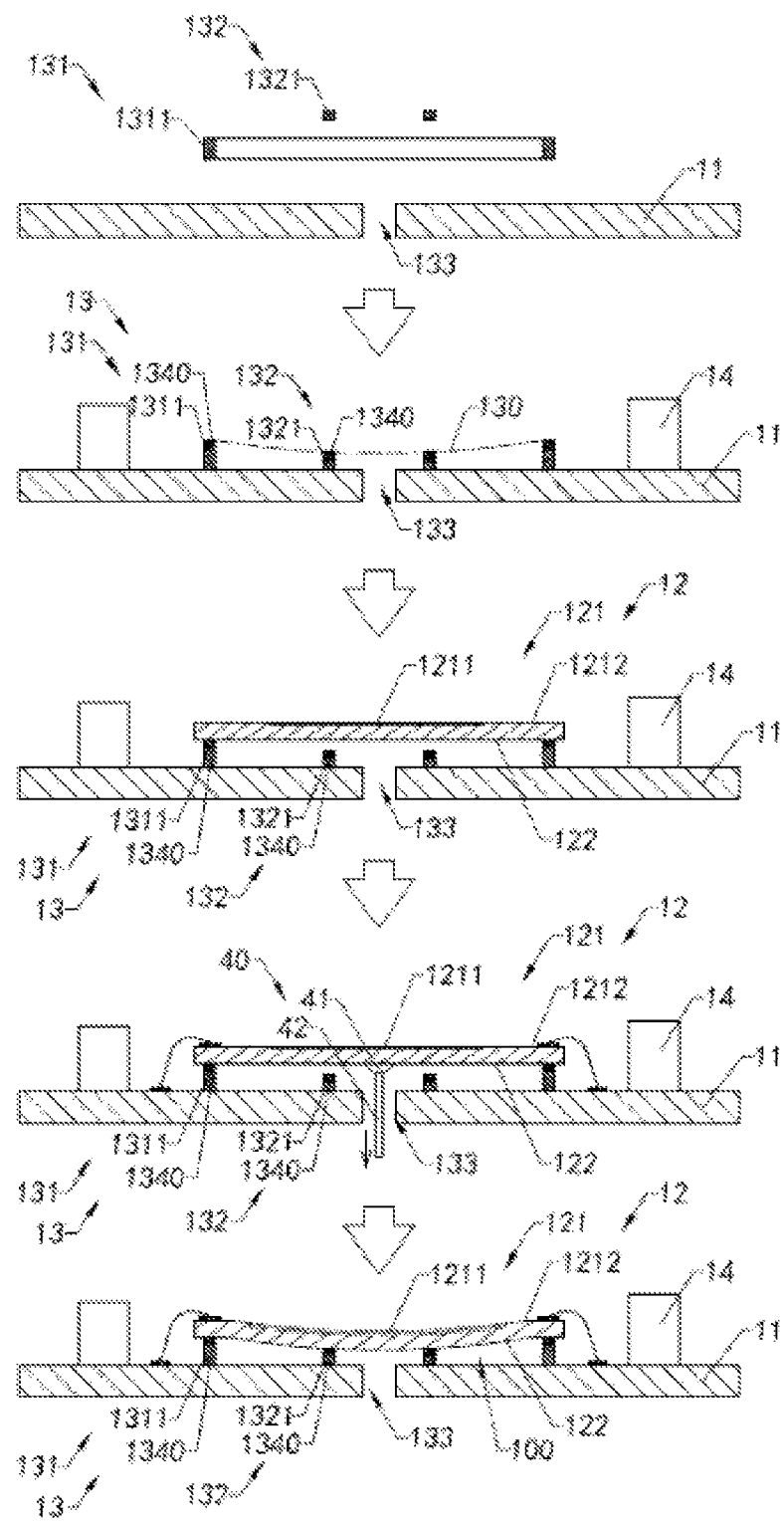
FIGS. 4A and 4B illustrate schematic views of a manufacturing process for the photosensitive assembly according to the embodiment of the present application.
Figure 4B:
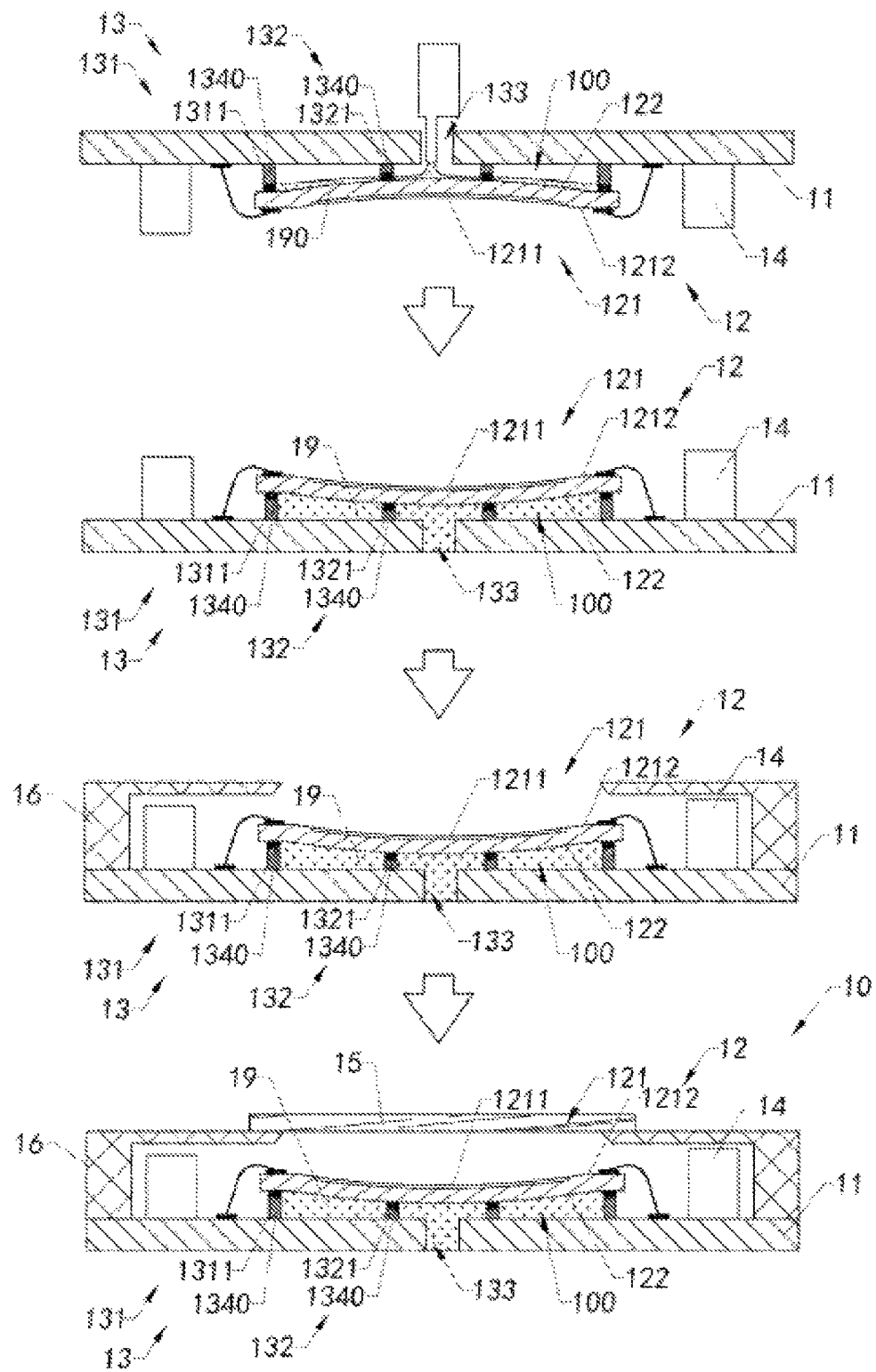

As shown in FIGS. 3 to 4B, one example of a photosensitive assembly therefor according to an embodiment of the present application is explained. As shown in FIG. 3, the photosensitive assembly 10 includes a circuit board 11, a photosensitive chip 12 electrically connected to the circuit board 11, and a shaping member 13, wherein a lower surface 122 of the photosensitive chip 12 is attached to the shaping member 13 to form an accommodating space 100 with the shaping member 13 and the circuit board 11, and the accommodating space 100 is configured so that the photosensitive chip 12 is bent downward during the process of assembling the photosensitive assembly 10. In particular, in the embodiment of the present application, the photosensitive chip 12 is bent into a shape adapted to the actual focal plane, and the imaging quality is improved in this way.

As shown in FIGS. 3 and 4B, in the embodiment of the present application, the shaping member 13 is fixed on a top surface of the circuit board 11, wherein a top surface of the shaping member 13 is attached to the lower surface 122 of the photosensitive chip 12 to form the accommodating space 100 with the photosensitive chip 12 and the circuit board 11. It should be understood that the accommodating space 100 below the photosensitive chip 12 provides a deformation space for the photosensitive chip 12 to bend downward under the action of a specific force. Moreover, in the embodiment of the present application, the shaping member 13 sets a shaping surface 130, wherein the shaping surface 130 is configured to limit the downward bending shape of the photosensitive chip 12, so that the shape of the lower surface 122 of the bent photosensitive chip 12 after bending is adapted to the actual focal plane, and the imaging quality is improved in this way.

Figure 6:
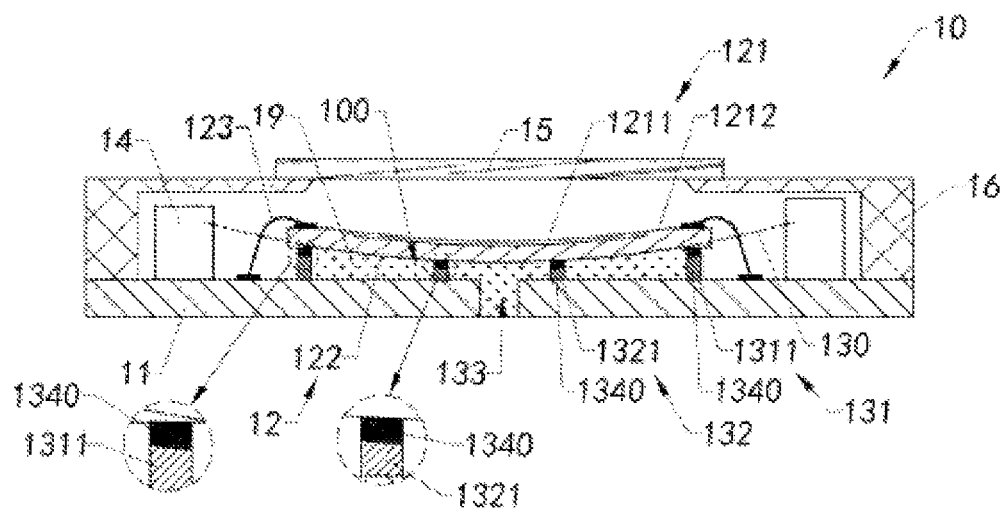
FIG. 6 illustrates an enlarged schematic view of an upper surface of a shaping member in the photosensitive assembly according to the embodiment of the present application.

More specifically, in the embodiment of the present application, the shaping member 13 includes a first shaping piece 131 and a second shaping piece 132, wherein the first shaping piece 131 is fixed on the circuit board 11, and the lower surface 122 of the photosensitive chip 12 is attached to the first shaping piece 131. In this way, an accommodating space 100 is formed between the first shaping piece 131, the photosensitive chip 12 and the circuit board 11. The second shaping piece 132 is fixed on the circuit board 11 and located in the accommodating space 100, and the height of the second shaping piece 132 is lower than that of the first shaping piece 131. In other words, in the embodiment of the present application, the first shaping piece 131 and the second shaping piece 132 are arranged in a stepped shape. In particular, in the embodiment of the present application, an upper surface of at least one of the first shaping piece 131 and the second shaping piece 132 includes an arc-shaped surface recessed downward and inward, and the arc-shaped surface is configured so that when the photosensitive chip 12 is bent downward, a lower surface 122 adapted to the focal imaging plane of the photosensitive assembly 10 is formed, so as to form a downward curved shaping surface 130 through the upper surfaces of the first shaping piece 131 and the second shaping piece 132. Preferably, in the embodiment of the present application, the upper surfaces of the first shaping piece 131 and the second shaping piece 132 both include arc-shaped surfaces recessed downward and inward, as shown in FIG. 6.

Further, the shaping member 13 further includes at least one opening 133 formed through the circuit board 11 and communicated with the accommodating space 100, wherein after the photosensitive chip 12 is attached to the first shaping piece 131 to form the accommodating space 100, the at least one opening 133 is configured so that a suction device 40 can be inserted into the accommodating space 100 and attached to at least a part of the lower surface 122 of the photosensitive chip 12, to cause the photosensitive chip 12 to be bent downward by pulling force. That is to say, in the embodiment of the present application, the specific force for bending the photosensitive chip 12 is the pulling force generated by the suction device 40. That is to say, in the embodiment of the present application, the technical principle of making the photosensitive chip 12 bend downward in the accommodating space 100 is as follows: the suction device 40 for bending the photosensitive chip 12 is inserted into the accommodating space 100 through the opening 133 and sucked to the lower surface 122 of the photosensitive chip 12, so as to force the photosensitive chip 12 to bend downward by pulling the suction device 40 downward.

FIGS. 4A and 4B illustrate an example of the suction device. As shown in FIGS. 4A and 4B, the suction device 40 includes a suction cup 41 and an extension rod 42 extending downward from the suction cup 41, wherein the suction cup 41 is used for suction on at least part of the lower surface 122 of the photosensitive chip 12, and after the suction cup 41 is attached to the photosensitive chip 12, the photosensitive chip 12 may be bent downward by pulling the extension rod 42. It is worth mentioning that, in other examples of the present application, the suction device 40 may also be implemented as other types. In this regard, it is not limited in the present application.

Figure 5:
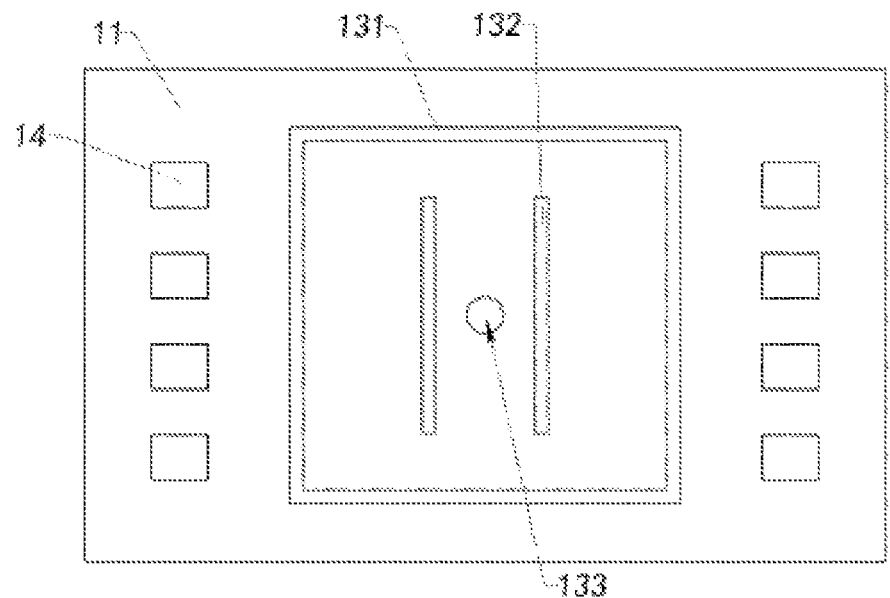
FIG. 5 illustrates a top view of the photosensitive assembly according to the embodiment of the present application.

In particular, in the embodiment of the present application, the first shaping piece 131 has a closed shape, so that the accommodating space 100 formed by the first shaping piece 131, the circuit board 11 and the photosensitive chip 12 is a closed space. This can effectively prevent the dust located outside the first shaping piece 131 from entering the accommodating space 100 through the first shaping piece 131 and causing contamination to the photosensitive chip. As shown in FIG. 5, preferably, the shape of the first shaping piece 131 is adapted to the shape of the circuit board 11 and the photosensitive chip 12. It should be known by those skilled in the art that the shape of the existing circuit board 11 and photosensitive chip 12 is usually a rectangle. Correspondingly, the shape of the first shaping piece 131 is preferably implemented as a closed ⊔-like shape. Of course, it should be understood by those skilled in the art that with the development of the camera module technology and the expansion of its application scenarios, the shape of the circuit board 11 and the photosensitive chip 12 will change. Correspondingly, the shape of the first shaping piece 131 may also be adjusted adaptively. In this regard, it is not limited in the present application.

In some embodiments, the first shaping pieces 131 are symmetrically arranged on the circuit board 11 with respect to the center of the photosensitive chip 12. Preferably, the first shaping pieces 131 are symmetrically arranged with respect to a center line of longer sides of the photosensitive chip. The first shaping piece 131 does not need to form a closed shape, that is, the first shaping piece 131 only needs to ensure that the edges of the shorter sides of the photosensitive chip can be supported. For example, the first shaping piece 131 is implemented to be elongated and disposed on the circuit board 12 along the shorter sides of the photosensitive chip 12.

Preferably, the size of the first shaping piece 131 is adapted to the size of the photosensitive chip 12, so that when the photosensitive chip 12 is attached to the first shaping piece 131, the first shaping piece 131 is supported on the edge portion of the photosensitive chip 12. It should be known by those skilled in the art that the upper surface 121 of the photosensitive chip 12 includes a photosensitive area 1211 and a non-photosensitive area 1212 located around the photosensitive area 1211, wherein, since the photosensitive area 1211 is a sensitive area, it is usually disposed at the center portion of the upper surface 121 of the photosensitive chip 12, and the non-photosensitive area 1212 is located at the edge portion of the upper surface 121 and surrounds the photosensitive area 1211. That is to say, the size of the first shaping piece 131 is adapted to the photosensitive chip 12, so that the first shaping piece 131 is supported on the non-photosensitive area 1212 of the photosensitive chip 12. This can ensure that the photosensitive area 1211 of the photosensitive chip 12 will not be damaged during the subsequent bending process of the photosensitive chip 12. It is worth noting that the premise of the center line of the photosensitive chip 12 mentioned in the present invention is that the photosensitive chip has a regular shape, that is, the photosensitive area 1211 and the non-photosensitive area 1212 of the photosensitive chip 12 are symmetrically distributed with respect to the center. When the photosensitive chip 12 has an irregular shape, the center line of the photosensitive chip 12 in the present invention refers to the center line of the photosensitive area 1211.

More preferably, the shape and size of the first shaping piece 131 is adapted to the size and shape of the photosensitive chip 12, so that when the photosensitive chip 12 is attached to the first shaping piece 131, the first shaping piece 131 is supported on the non-photosensitive area 1212 of the photosensitive chip 12, and the center of the first shaping piece 131 is coaxial with the center of the photosensitive chip 12. That is, the photosensitive chip 12 is coaxially attached to the first shaping piece 131.

As shown in FIG. 3, in the embodiment of the present application, the first shaping piece 131 includes a first shaping piece body 1311 and an adhesive 1340 applied on the first shaping piece body, wherein the first shaping piece body 1311 is disposed on the circuit board 11, and the adhesive 1340 is used for bonding the photosensitive chip 12. It should be understood that the function of the adhesive 1340 is to bond the first shaping piece body 1311 and the photosensitive chip 12, and the thickness and material thereof do not constitute a limitation of the present application. Moreover, in other examples of the present application, the photosensitive chip 12 may also be directly disposed on the first shaping piece body 1311 by using a process such as ultrasonic welding without the adhesive 1340. That is, in other examples of the present application, the adhesive 1340 is a non-essential element. Preferably, in the embodiment of the present application, the adhesive 1340 has certain flexibility and relatively high viscosity.

In particular, before the accommodating space 100 is formed, the second shaping piece 132 should be preset at a preset position of the circuit board 11 in advance, so that after the photosensitive chip 12 is bonded to the first shaping piece 131 to form the accommodating space 100, the second shaping piece 132 is accommodated in the accommodating space 100.

As described previously, the height of the second shaping piece 132 is smaller than the height of the first shaping piece 131. In particular, in the embodiment of the present application, the height setting of the second shaping piece 132 is related to the relative positional relationship between the second shaping piece 132 and the first shaping piece 131. Specifically, the shape of the shaping surface 130 formed by the first shaping piece 131 and the second shaping piece 132 is set based on the shape of the actual focal plane. That is to say, the relative positional relationship between the first shaping piece 131 and the second shaping piece 132 and the setting of the height difference between the two should match the shape of the actual focal plane. More specifically, when the second shaping piece 132 is close to the first shaping piece 131, the height difference between the first shaping piece 131 and the second shaping piece 132 should be reduced, that is, the height of the shaping member 132 should be increased. When the second shaping piece 132 is away from the first shaping piece 131, the height difference between the first shaping piece 131 and the second shaping piece 132 should be increased, that is, the height of the second shaping piece 132 should be reduced. It is worth mentioning that, in the embodiment of the present application, the shape of the shaping surface 130 matches the shape of the actual focal plane, which does not mean that the shape of the shaping surface 130 is completely consistent with or completely coincides with the shape of the actual focal plane, and simply means that the shape of the shaping surface 130 tends to be consistent with the shape of the actual focal plane.

Preferably, in the embodiment of the present application, the second shaping pieces 132 are symmetrically arranged with respect to the center of the photosensitive chip 12. In this way, when the lower surface 122 of the photosensitive chip 12 is attached to the second shaping piece 132 under the action of the pressure difference, the bonding points between the second shaping piece 132 and the photosensitive chip 12 are also symmetrically distributed with respect to the center of the photosensitive chip 12, so as to form a uniform bonding force on opposite sides of or around the photosensitive chip 12 to ensure that the photosensitive chip 12 can be more stably shaped. More specifically, in the embodiment of the present application, the second shaping pieces 132 are symmetrically arranged on both sides of the center line set by the longer sides of the photosensitive chip 12. Of course, it should be understood by those skilled in the art that, in other examples of the present application, the second shaping piece 132 can also be symmetrically arranged with respect to the center of the photosensitive chip 12 in other ways. It is worth mentioning that, in the embodiment of the present application, the shape of the second shaping piece 132 is not limited in the present application, and includes but is not limited to a slender shape, a column shape, and the like.

Similar to the first shaping piece 131, in the embodiment of the present application, the second shaping piece 132 includes a second shaping piece body 1321 and an adhesive 1340 applied on the second shaping piece body 1321. It should be understood that the photosensitive chip 12 is bonded to the upper surface of the second shaping piece 132 by the adhesive 1340 to prevent the photosensitive chip 12 from being broken due to the suspension in the middle, and to prevent any deformation of the photosensitive chip 12 during use (for example, the photosensitive chip gradually tends to be flat). It is worth mentioning that, in the embodiment of the present application, the adhesive 1340 applied to the first shaping piece body 1311 and the adhesive 1340 applied to the second shaping piece body 1321 may be implemented as the same adhesive 1340 or different types of adhesives 1340, and the application amount or thickness of the adhesive 1340 is not limited in the present application.

Preferably, in the embodiment of the present application, the first shaping piece body 1311 and the second shaping piece body 1321 are made of materials with relatively high hardness and relatively high thermal conductivity, for example, metal materials (including pure metal materials, metal and non-metal alloy materials, metal and metal alloy materials). It should be noted that, in the embodiment of the present application, the first shaping piece body 1311 and the second shaping piece body 1321 each extend between the photosensitive chip 12 and the circuit board 11, so that when the first shaping piece body 1311 and the second shaping piece body 1321 are implemented as being made of metal materials with relatively high thermal conductivity, the heat generated by the operation of the photosensitive chip 12 can be efficiently conducted to the circuit board 11 and finally radiated to the outside by means of the first shaping piece body 1311 and the second shaping piece body 1321. For the heat dissipation portion, it will be further described in the subsequent description, and will not be further described here.

When the photosensitive chip 12 is bonded to the first shaping piece 131 to define the accommodating space 100, there is a certain distance between the lower surface 122 of the photosensitive chip 12 and the adhesive 1340 of the second shaping piece 132. Correspondingly, as the suction device 40 pulls the photosensitive chip 12 to bend downward, the photosensitive chip 12 is continuously bent downward under the action of the pulling force, so that the distance between the lower surface 122 of the photosensitive chip 12 and the second shaping piece 132 is continuously reduced until the lower surface 122 of the photosensitive chip 12 is in contact with the adhesive 1340 of the second shaping piece 132, and the photosensitive chip 12 is also bonded to the second shaping piece 132 by the adhesive 1340. When the photosensitive chip 12 is bonded to the first shaping piece 131 and the second shaping piece 132 at the same time, the shape of the photosensitive chip 12 is shaped into the shape of the shaping surface 130, so that the shape of the lower surface 122 of the photosensitive chip 12 is adapted to the actual focal plane.

As shown in FIG. 5, in the embodiment of the present application, the position where the opening 133 is formed in the circuit board 11 corresponds to the central area of the photosensitive chip 12. In this way, when the suction device 40 is inserted into the accommodating space 100 through the opening 133, the suction cup 41 of the suction device 40 can be attached to the central area of the lower surface 122 of the photosensitive chip 12. Thus, the bending force generated by the suction device 40 is the largest in the central area of the photosensitive chip 12 and gradually decreases from the central area to the edge portion, so that the deformation of the photosensitive chip 12 gradually increases from the edge of the photosensitive chip 12 to the center of the photosensitive chip 12 to adapt to the shape of the actual focal plane. It is worth mentioning that, in the embodiment of the present application, the number of the openings 133 may be set to one or more. In this regard, it is not limited in the present application. It should also be understood that, in other examples of the embodiment of the present application, the openings 133 may also be formed at other positions in the circuit board 11.

Figure 7:
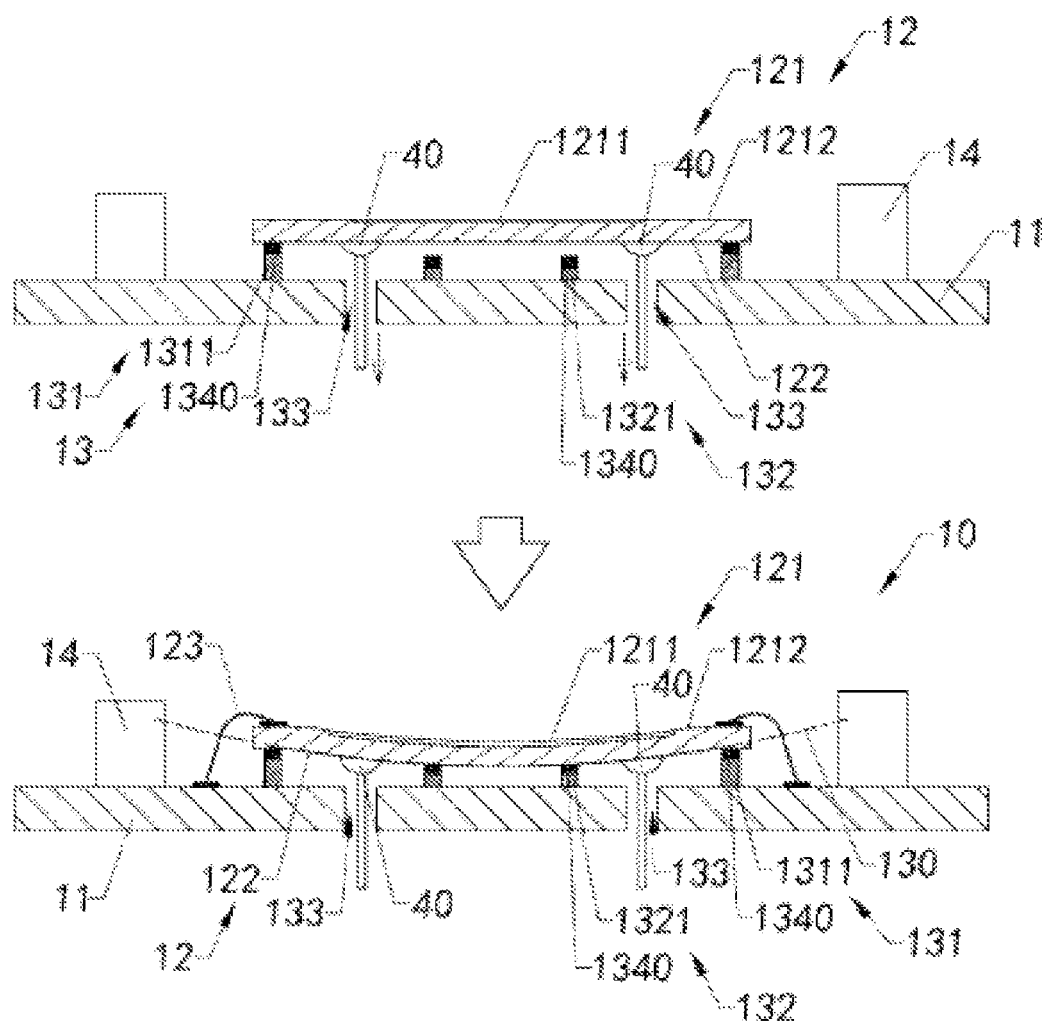
FIG. 7 illustrates a schematic top view of a modified implementation of the photosensitive assembly according to the embodiment of the present application.

FIG. 7 illustrates a schematic top view of a modified implementation of the photosensitive assembly according to the embodiment of the present application. As shown in FIG. 7, in this modified embodiment, the position where the opening 133 is formed in the circuit board 11 is located between the first shaping piece 131 and the second shaping piece 132. Correspondingly, in this modified embodiment, a corresponding number of the suction devices 40 can be used to bend the photosensitive chip. For example, in this modified embodiment, the number of the openings 133 is 2, and correspondingly, the number of the suction devices 40 number is also 2.

Preferably, in this modified embodiment, the positions where the openings 133 are formed in the circuit board 11 are symmetrically arranged with respect to the central area of the photosensitive chip 12. In this way, the attachment positions where the suction devices 40 are attached to the photosensitive chip 12 are also symmetrically arranged with respect to the central area of the photosensitive chip 12, so as to form a more uniform pulling force at positions that are symmetrical with respect to the central area of the photosensitive chip 12, so that the photosensitive chip 12 can be bent downward more symmetrically and gently in a manner that tends to the shape of the shaping surface 130.

Figure 8:
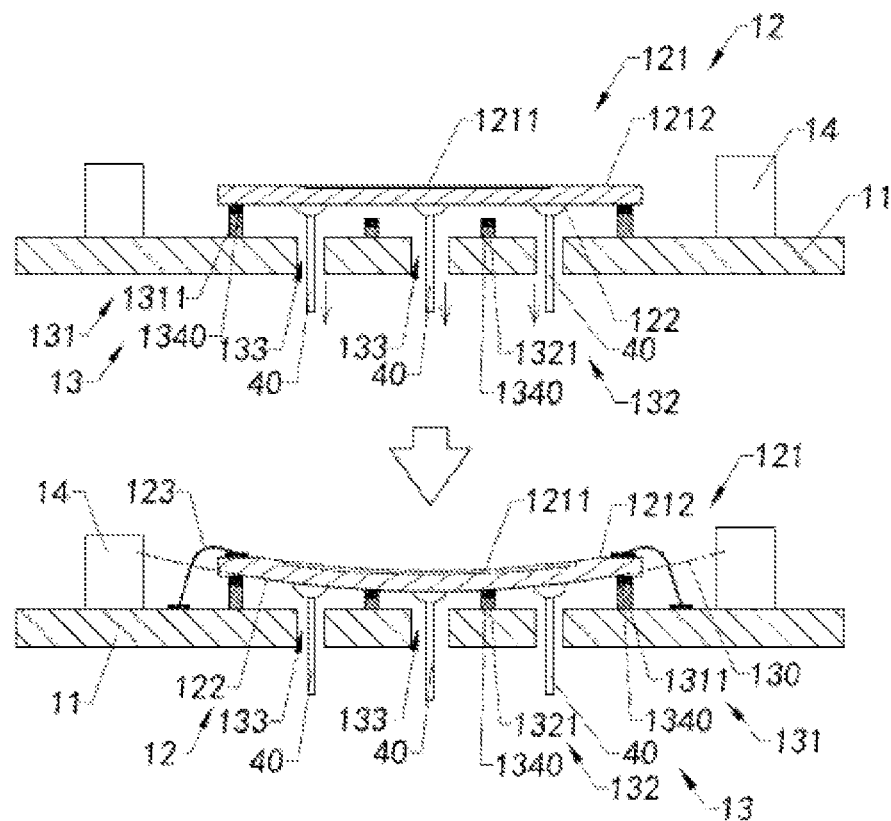
FIG. 8 illustrates a schematic top view of another modified implementation of the photosensitive assembly according to the embodiment of the present application.

FIG. 8 illustrates a schematic top view of another modified implementation of the photosensitive assembly according to the embodiment of the present application. As shown in FIG. 8, in this modified embodiment, the positions where a part of the openings 133 are formed in the circuit board 11 correspond to the central area of the photosensitive chip 12, and the positions where another part of the openings 133 are formed in the circuit board 11 are located between the first shaping piece 131 and the second shaping piece 132. Correspondingly, in this modified embodiment, a corresponding number of suction devices 40 may be used to bend the photosensitive chip. For example, in this modified embodiment, the number of the openings 133 is 3 (wherein 1 opening is disposed in the circuit board 11 at a position corresponding to the central area of the photosensitive chip 12, and the other 2 openings are disposed between the first shaping piece 131 and the second shaping piece 132), and correspondingly, the number of the suction devices 40 is also 3. In particular, in this modified embodiment, the positions where another part of the openings 133 are formed in the circuit board 11 are symmetrically arranged with respect to the center of the photosensitive chip 12. In this way, the attachment positions where the suction devices 40 are attached to the lower surface of the photosensitive chip 12 are also symmetrically arranged with respect to the central area of the photosensitive chip 12, so as to form a more uniform force at positions that are symmetrical with respect to the central area of the photosensitive chip 12, so that the photosensitive chip 12 can be bent downward more symmetrically and gently in a manner that tends to the shape of the shaping surface 130.

Figure 9:
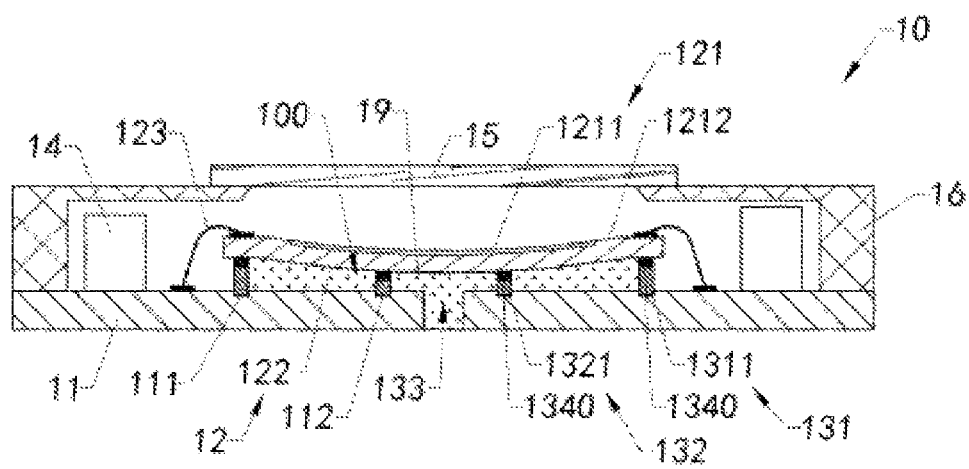
FIG. 9 illustrates a schematic view of still another modified implementation of the photosensitive assembly according to the embodiment of the present application.

In order to facilitate positioning and installation of the first shaping piece 131 and the second shaping piece 132, as shown in FIG. 9, in some examples of the embodiment of the present application, the circuit board 11 further includes a first positioning groove 111 and a second positioning groove 112 formed on the top surface of the circuit board 11 in a recessed manner, wherein the first positioning groove 111 is used for positioning to mount the first shaping piece 131 therein in an adapted manner, and the second positioning groove 112 is used for positioning to mount the second shaping piece 132 therein in an adapted manner.

Figure 10:
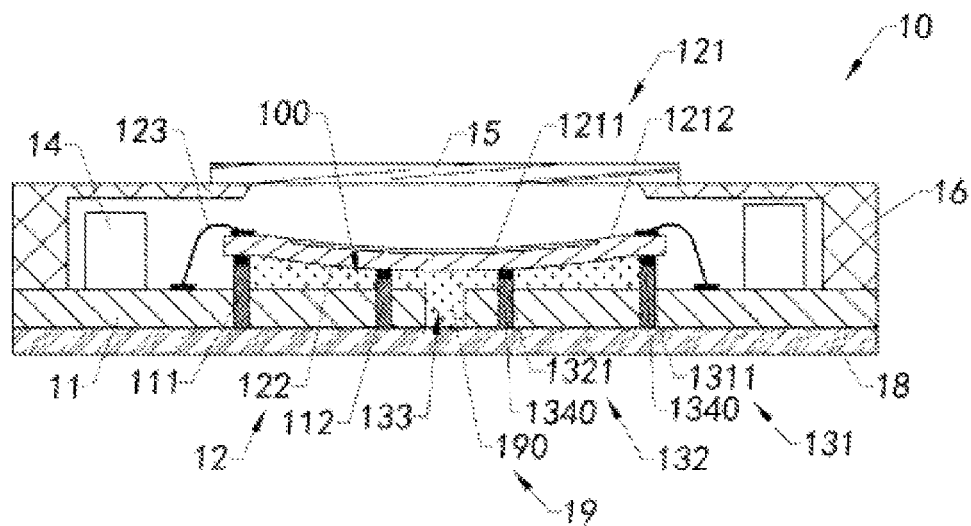
FIG. 10 illustrates a schematic view of still another modified implementation of the photosensitive assembly according to the embodiment of the present application.

In other examples of the present application, in order to facilitate positioning and installation of the first shaping piece 131 and the second shaping piece 132, as shown in FIG. 10, the first positioning groove 111 is implemented as a first positioning through hole penetrating through the circuit board 11, and the second positioning groove 112 is implemented as a second positioning through hole penetrating through the circuit board 11, wherein the first positioning through hole 111 is used for positioning to mount the first shaping piece 131 therein in an adapted manner, and the second positioning through hole 112 is used for positioning to mount the second shaping piece 132 therein in an adapted manner. Moreover, the photosensitive assembly 10 further includes a reinforcing plate 18 attached to the bottom surface of the circuit board 11. Preferably, the reinforcing plate 18 is made of a metal material with relatively high thermal conductivity. In this way, the heat generated by the photosensitive chip 12 can be directly conducted to the reinforcing plate 18 by means of the first shaping piece 131 and the second shaping piece 132 to achieve the purpose of heat dissipation.

It is worth mentioning that, in the embodiment of the present application, the first shaping piece 131 and the second shaping piece 132 are prefabricated pieces, that is, the first shaping piece body 1311 and the second shaping piece body 1321 are prefabricated and then attached to preset positions of the circuit board 11. Alternatively, the first shaping piece 131 and the second shaping piece 132 may also be integrally molded at the preset positions of the circuit board 11. For example, when the first shaping piece body 1311 and the second shaping piece body 1321 are made of metal materials, the first shaping piece body 1311 and the second shaping piece body 1321 may be integrally molded at the preset positions of the circuit board 11 through an electroplating molding process. Of course, it should be easily understood that when the first shaping piece body 1311 and the second shaping piece body 1321 are made of other materials with relatively high hardness and relatively high thermal conductivity, the first shaping piece body 1311 and the second shaping piece body 1321 may be integrally molded at the preset positions of the circuit board 11 using a corresponding integral molding process. In this regard, it is not limited in the present application.

Figure 11:
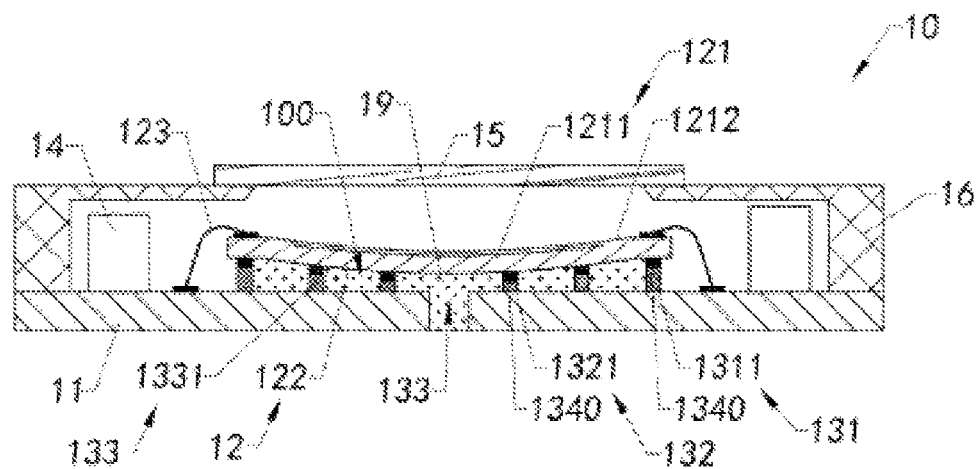
FIG. 11 illustrates a schematic view of still another modified implementation of the photosensitive assembly according to the embodiment of the present application.
Figure 12:
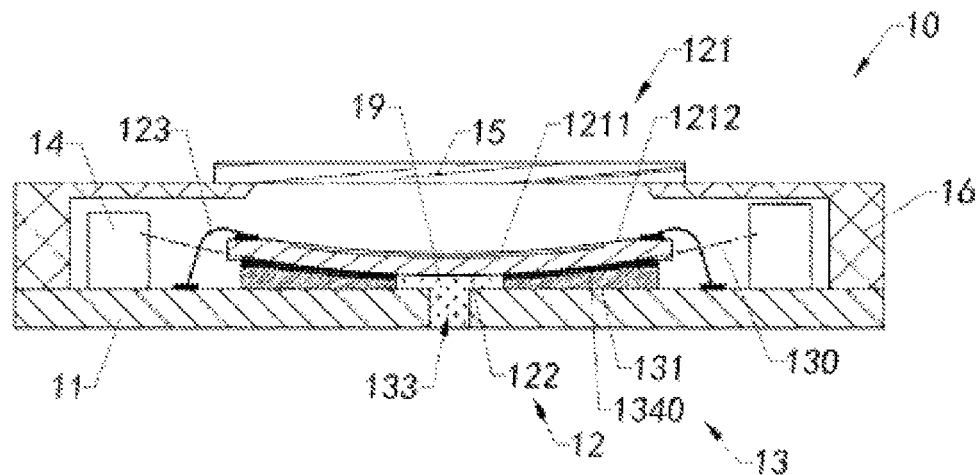
FIG. 12 illustrates a schematic view of still another modified implementation of the photosensitive assembly according to the embodiment of the present application.

It is also worth mentioning that, in other examples of the embodiments of the present application, the shaping member 13 may further include more or less shaping pieces. For example, in a further example of the present application, as shown in FIG. 11, the shaping member 13 further includes a third shaping piece 134 (including a third shaping piece body 134 and an adhesive 1340 applied to the top surface of the third shaping piece body 134), wherein the third shaping piece 134 is disposed between the first shaping piece 131 and the second shaping piece 132, so as to form the shaping surface 130 by the first shaping piece 131, the second shaping piece 132 and the third shaping piece 134. For another example, as shown in FIG. 12, in a further example of the present application, the shaping member 13 only includes the first shaping piece 131, wherein the upper surface of the first shaping piece 131 includes an arc-shaped surface recessed downward and inward, and the arc-shaped surface is configured so that when the photosensitive chip 12 is bent downward, a lower surface 122 that is adapted to the focal imaging plane of the photosensitive assembly 10 is formed.

Figure 13:
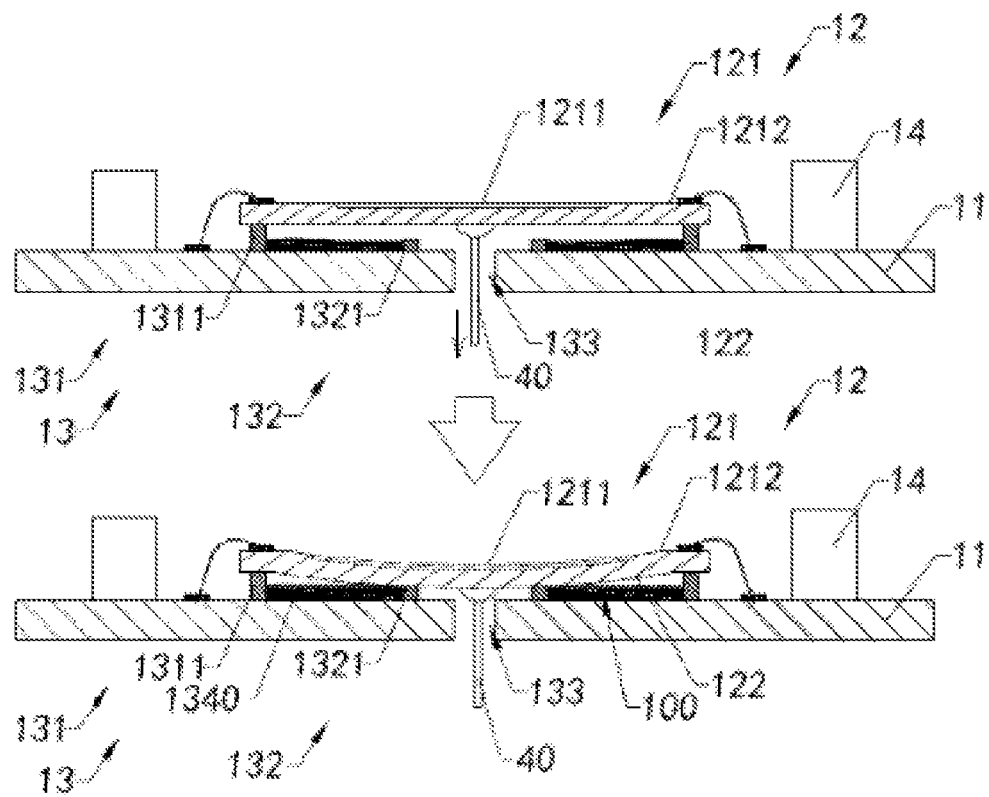
FIG. 13 illustrates a schematic view of still another modified implementation of the photosensitive assembly according to the embodiment of the present application.

FIG. 13 illustrates a schematic view of still another modified implementation of the photosensitive assembly according to the embodiment of the present application. As shown in FIG. 13, in this modified embodiment, the first shaping piece 131 and the second shaping piece 132 both have closed annular shapes, so that an accommodating cavity is formed between the first shaping piece 131 and the second shaping piece 132. In particular, in this modified embodiment, the shaping member 13 further includes an adhesive 1340 disposed between the first shaping piece 131 and the second shaping piece 132, wherein the height of the highest point on the upper surface of the adhesive 1340 is higher than that of the upper surface of the second shaping piece 132. It should be understood that, in this modified embodiment, the adhesive 1340 should have relatively high viscosity to prevent the adhesive 1340 from flowing out from the upper surface of the second shaping piece 132. In this way, after the photosensitive chip 12 is attached to the first shaping piece 131, the photosensitive chip 12 is pulled by the suction device 40 to force the photosensitive chip 12 to bend downward until it is bonded to the adhesive 1340 disposed between the first shaping piece 131 and the second shaping piece 132. It is worth mentioning that, in this modified embodiment, the adhesive 1340 may not be disposed on the upper surface of the second shaping piece 132. It is worth noting that since the height of the adhesive 1340 is higher than that of the second shaping piece 132, the adhesive 1340 may flow to the upper surface of the second shaping piece 132 during the suction, so that the photosensitive chip 12 is bonded to the second shaping piece 132 by the adhesive 1340 after being bent downward. Thus, the bonding is better and the reliability is improved. Further, the adhesive 1340 may not be higher than the second shaping piece 132. For example, the upper surface of the adhesive 1340 is flush with the upper surface of the second shaping piece 132.

In order to improve the heat dissipation performance of the photosensitive assembly, as shown in FIGS. 3 to 4B, in the embodiment of the present application, the photosensitive assembly 10 further includes a heat dissipation member 19 formed in the accommodating space 100, wherein the heat dissipation member 19 is attached to at least a part of the lower surface 122 of the photosensitive chip 12, so that the heat generated by the photosensitive chip 12 can be conducted to the outside by means of the heat dissipation member 19 in contact with the photosensitive chip 12. In this embodiment, the heat dissipation member 19 needs to be filled in the accommodating space 100, so the first shaping piece 131 is preferably implemented in a closed shape.

Preferably, in the embodiment of the present application, the entire accommodating space 100 is fully filled with the heat dissipation member 19, so that the lower surface 122 of the photosensitive chip 12 is completely in contact with the heat dissipation member 19, so as to maximize the heat dissipation area and improve the heat dissipation performance. It is worth mentioning that the formation position and filling ratio of the heat dissipation member 19 in the accommodating space 100 depend on the shape of the second shaping piece 132 and the position setting of the at least one opening 133.

Figure 14:
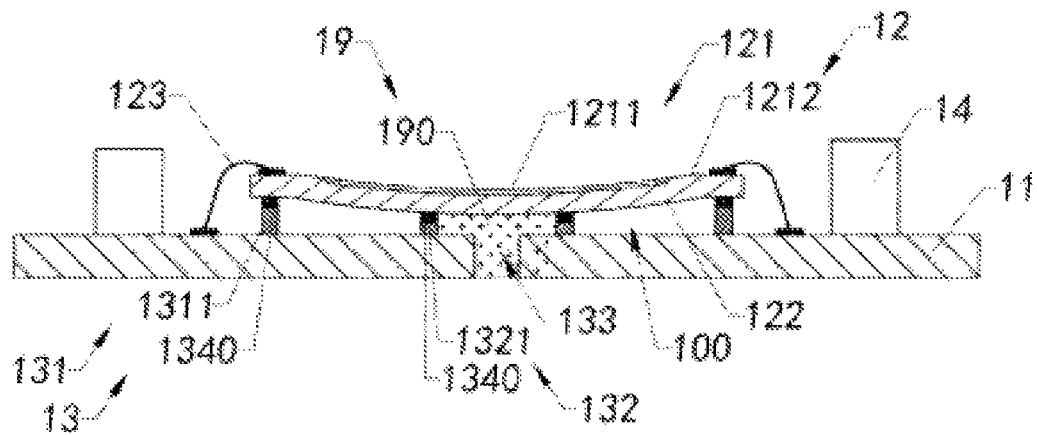
FIG. 14 illustrates a schematic view of still another modified implementation of the photosensitive assembly according to the embodiment of the present application.

Specifically, when the second shaping piece 132 is implemented as a closed □-like shape, and the position where the at least one opening 133 is formed in the circuit board 11 corresponds to the central area of the photosensitive chip 12, the heat dissipation member 19 can only occupy at most the cavity surrounded by the second shaping piece 132, the photosensitive chip 12 and the circuit board 11, as shown in FIG. 14. Of course, even if the second shaping piece 132 is implemented as a closed ⊓-like shape, the heat dissipation member 19 can fully occupy the entire accommodating space 100, and only the positions where a part of the openings 133 are formed in the circuit board 11 needs to be set to correspond to the central area of the photosensitive chip 12. At the same time, the positions where another part of the openings 133 are formed in the circuit board 11 are set to be located between the first shaping piece 131 and the second shaping pieces 132.

In a specific implementation, a heat dissipation material 190 used to make the heat dissipation member 19 can enter the accommodating space 100 through the opening 133 to form the heat dissipation member 19 in the accommodating space 100.

Figure 15:
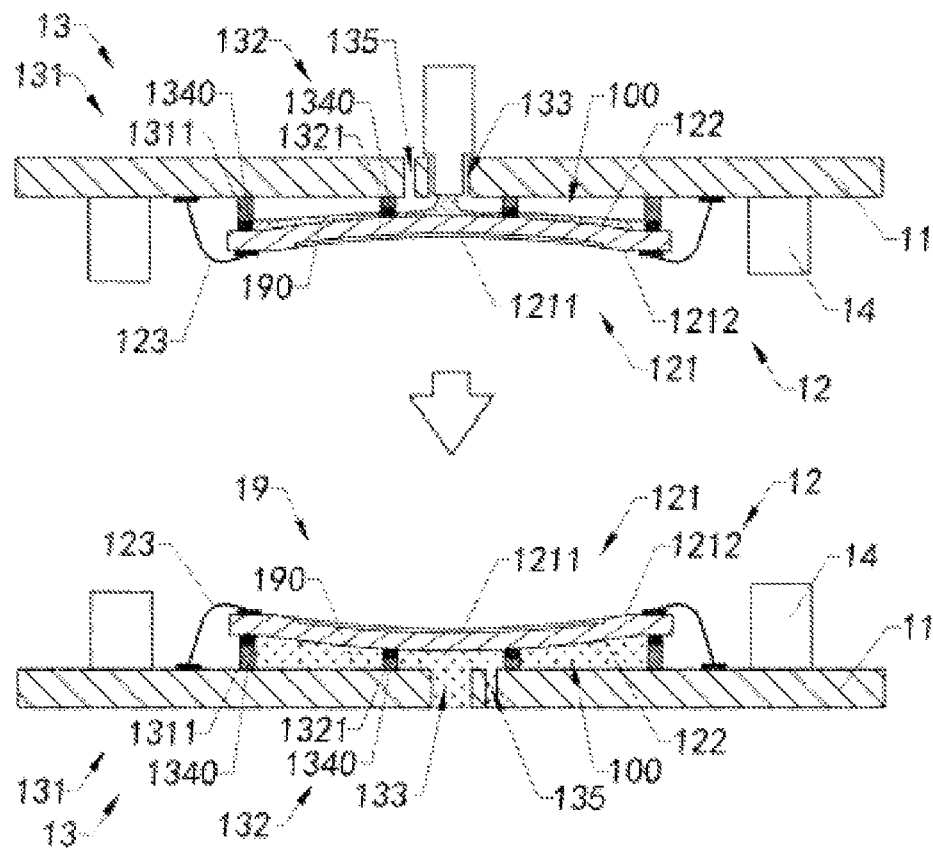
FIG. 15 illustrates a schematic view of still another modified implementation of the photosensitive assembly according to the embodiment of the present application.

For example, when the heat dissipation material 190 is implemented as a fluid-like heat dissipation material 190, the fluid-like heat dissipation material 190 may be injected into the accommodating space 100 through the opening 133, to form the heat dissipation member 19 after curing and molding. In order to facilitate the operation, when performing the injection process, the photosensitive assembly 10 may be turned upside down to prevent the fluid-like heat dissipation material 190 from flowing out of the opening 133. In particular, when the number of the openings 133 is only one, in order to balance the internal and external pressures so that the fluid-like heat dissipation material 190 can be smoothly injected into the accommodating space 100, a ventilation hole 135 may be further provided in the circuit board 11, as shown in FIG. 15. Of course, when the number of the openings 133 exceeds one, the air intake holes, except those being used for injecting the heat dissipation material 190, are functionally equivalent to the ventilation hole 135. That is to say, when the number of the openings 133 exceeds one, at least one of the openings forms the ventilation hole 135.

It is worth mentioning that when the heat dissipation member 19 is cured and formed by the fluid-like heat dissipation material 190, preferably, the entire accommodating space 100 can be fully filled with the heat dissipation material 190. Therefore, on the one hand, after curing and molding, the heat dissipation member 19 is attached to the entire lower surface 122 of the photosensitive chip 12 (a part corresponding to the accommodating space 100) to increase the heat dissipation area. On the other hand, the heat dissipation member 19 extends from the lower surface 122 of the photosensitive chip 12 to the opening 133, that is, the heat dissipation member 19 directly extends to the outside, so as to facilitate heat dissipation. Of course, in other examples of the embodiments of the present application, the photosensitive assembly 10 further includes a reinforcing plate 18 attached to the bottom surface of the circuit board 11. Preferably, the reinforcing plate 18 is made of a metal material with relatively high thermal conductivity. In this way, the heat dissipation performance of the photosensitive assembly 10 is further enhanced.

Figure 16:
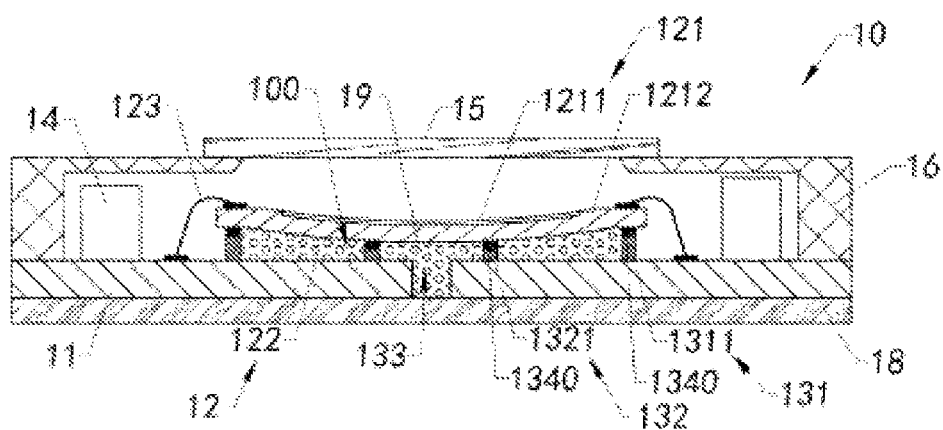
FIG. 16 illustrates a schematic view of still another modified implementation of the photosensitive assembly according to the embodiment of the present application.

Of course, in other examples of the embodiment of the present application, the heat dissipation material 190 may also be implemented in other forms, for example, a granular heat dissipation material 190, as shown in FIG. 16. Correspondingly, the granular heat dissipation material 190 may be filled into the accommodating space 100 to form the heat dissipation member 19. In order to prevent the granular heat dissipation material 190 from leaking out of the opening 133, in this example of the embodiment of the present application, the photosensitive assembly 10 further includes a reinforcing plate 18 for sealing the opening 133, and preferably, the reinforcing plate 18 is made of a metal material with relatively high thermal conductivity, so as to further enhance the heat dissipation performance of the photosensitive assembly 10 while sealing the opening 133.

Further, as shown in FIG. 3, in the embodiment of the present application, the photosensitive assembly 10 further includes at least one electronic component 14, leads for electrically connecting the photosensitive chip 12 to the circuit board 11, a filter element 15 and a bracket 16, wherein the at least one electronic component 14 is disposed on the circuit board 11 and located around the photosensitive chip 12, and includes but is not limited to a capacitor, a resistor, an inductor and the like.

After the photosensitive chip 12 is attached to the first shaping piece 131 and is bent and molded, the electrical connection between the photosensitive chip 12 and the circuit board 11 is realized through the leads 123. Specifically, each lead 123 extends between the photosensitive chip 12 and the circuit board 11 in a curved manner, so as to electrically connect the photosensitive chip 12 to the circuit board 11 through the leads 123. Therefore, the circuit board 11 can supply power to the photosensitive chip 12 through the leads 123, and the photosensitive chip 12 can transmit the collected signals through the leads 123.

It is worth mentioning that, in this specific example, the type of the lead 123 is not limited in the present application. For example, the lead 123 may be a gold wire, a silver wire, or a copper wire. Moreover, the lead 123 can be mounted between the circuit board 11 and the photosensitive chip 12 through a process of "wire bonding", so as to realize the electrical connection between the two.

Specifically, the "wire bonding" process is generally divided into two types: "forward wire bonding" process and "reverse wire bonding" process. The "forward wire bonding" process means that in the process of laying the lead 123, one end of the lead 123 is first formed on a conductive end of the circuit board 11, the lead 123 is then bent and extended, and finally the other end of the lead 123 is formed on the conductive end of the photosensitive chip 12. In this way, the lead 123 is formed between the photosensitive chip 12 and the circuit board 11. The "reverse wire bonding" process means that in the process of laying the lead 123, one end of the lead 123 is first formed on the conductive end of the photosensitive chip 12, the lead 123 is then bent and extended, and finally the other end of the lead 123 is formed on the conductive end of the circuit board 11. In this way, the lead 123 is formed between the photosensitive chip 12 and the circuit board 11. It is worth mentioning that the height of the upward protrusion of the lead 123 formed through the "reverse wire bonding" process is lower relative to the height of the upward protrusion of the lead 123 formed through the "forward wire bonding" process. Therefore, preferably, In this specific implementation, the lead 123 is formed using the "reversed wire bonding" process.

Of course, it should be known by those skilled in the art that, in other examples of the embodiment of the present application, the photosensitive chip 12 and the circuit board 11 may be connected in other ways (the lead 123 may not be used). For example, a back-connected technical solution is used. In this regard, it is not limited in the present application.

As shown in FIG. 3, in the embodiment of the present application, the bracket 16 is disposed on the circuit board 11 for supporting the filter element 15. Specifically, in the embodiment of the present application, the bracket 16 is implemented as a conventional plastic bracket 16, which is prefabricated and attached to the top surface of the circuit board 11, wherein the filter element 15 is mounted on the top of the bracket 16 corresponding to at least the photosensitive area 1211 of the photosensitive chip 12, and is used for filtering the light entering the photosensitive chip 12 to improve the imaging quality. That is to say, in the embodiment of the present application, the photosensitive assembly 10 is based on a conventional COB process.

It should be known by those skilled in the art that the filter element 15 can be implemented in different types, including but not limited to the following: the filter element 15 can be implemented as an infrared cut-off filter, a full transmission spectrum filter and other filters or a combination of multiple filters. Specifically, for example, when the filter element 15 is implemented as a combination of an infrared cut-off filter and a full transmission spectrum filter, that is, the infrared cut-off filter and the full transmission spectrum filter can be switched to be selectively located on the photosensitive path of the photosensitive chip 12. In this way, when used in an environment with sufficient light such as daytime, the infrared cut-off filter can be switched to the photosensitive path of the photosensitive chip 12 to filter infrared rays in the light reflected by an object entering the photosensitive chip 12 through the infrared cut-off filter, and when used in an environment with less light such as night, the full transmission spectrum filter can be switched to the photosensitive path of the photosensitive chip 12 to allow the infrared part in the light reflected by the object entering the photosensitive chip 12 to transmit therethrough.

Figure 17:
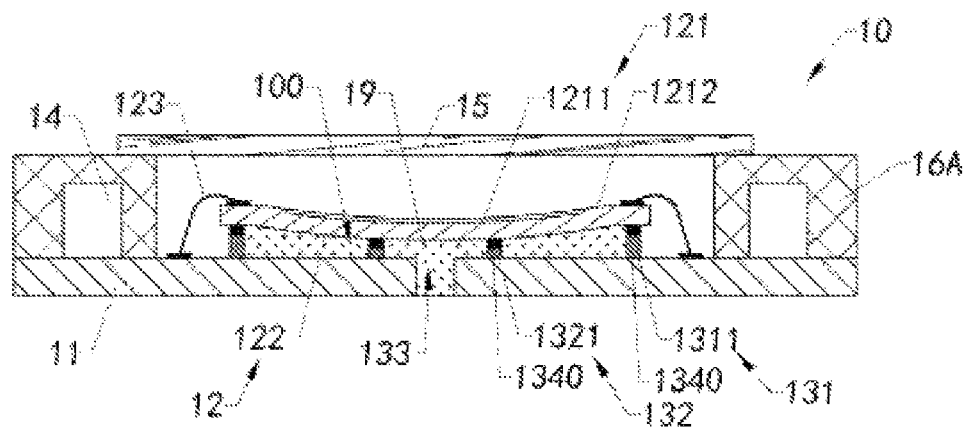
FIG. 17 illustrates a schematic view of still another modified implementation of the photosensitive assembly according to the embodiment of the present application.

FIG. 17 illustrates a schematic view of still another modified implementation of the photosensitive assembly according to the embodiment of the present application. As shown in FIG. 17, in this modified implementation, the photosensitive assembly 10 is fabricated based on a Molding on Board (MOB) process. Specifically, in this modified embodiment, the bracket 16 is implemented as a molded bracket 16A, which is integrally molded on the circuit board 11 through a molding process, so as to integrally cover at least a part of the circuit board 11 and at least part of the electronic components 14.

In a specific fabrication process, the circuit board 11 may be placed in a lower mold, and then an upper mold matched with the lower mold is provided to form a molding cavity between the upper and lower molds after the two molds are clamped, wherein the upper mold includes a pressing block that is pressed against the circuit board 11 when the molds are clamped. Further, the molding material is injected into the molding cavity, and after curing, molding, and drafting, the molded bracket 16A integrally covering at least a part of the circuit board 11 and at least a part of the electronic components 14 is obtained.

It is worth mentioning that the shape of the inner side surface of the molded bracket 16A is determined by the shape of the pressing block. For example, when the side surface of the pressing block is perpendicular to the circuit board 11, the inner side surface of the molded bracket 16A is perpendicular to the upper surface 121 of the photosensitive chip 12. For another example, when the inner side surface of the pressing block is inclined to the circuit board 11, the inner side surface of the molded bracket 16A extends obliquely outward.

It is worth mentioning that when the photosensitive assembly 10 is made based on the MOB process, preferably after the molded bracket 16 is integrally formed at the preset position of the circuit board 11, the first shaping piece 131 and the second shaping piece 132 of the shaping assembly are then mounted at the preset positions of the circuit board 11. Such a manufacturing sequence is advantageous to engineering implementation.

Figure 18:
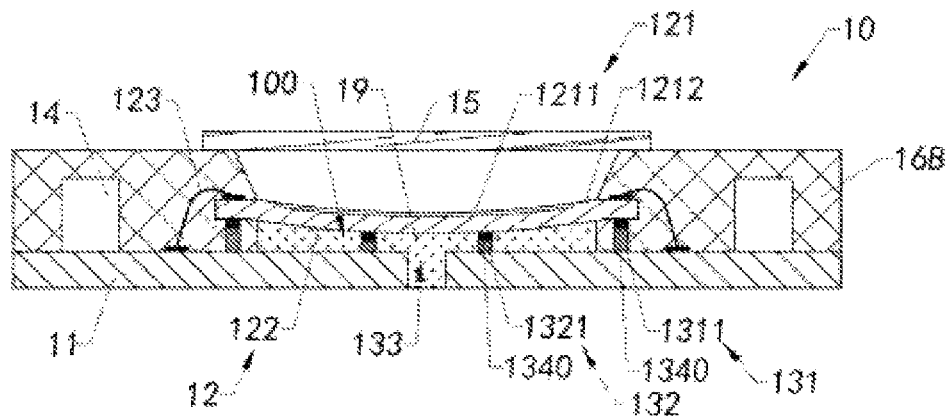
FIG. 18 illustrates a schematic view of still another modified implementation of the photosensitive assembly according to the embodiment of the present application.

FIG. 18 illustrates a schematic view of still another modified implementation of the photosensitive assembly according to the embodiment of the present application. As shown in FIG. 18, in this modified implementation, the photosensitive assembly 10 is fabricated based on the Molding on Chip (MOC) process. Specifically, in this modified embodiment, the bracket 16 is implemented as a molded bracket 16B, which is integrally molded on the circuit board 11 through a molding process to integrally cover at least a part of the circuit board 11, the at least one electronic component 14 and at least a part of the non-photosensitive area 1212 of the photosensitive chip 12.

In a specific fabrication process, after the photosensitive chip 12 is attached to the first shaping piece 131 and is bent and formed to be attached to the second shaping piece 132 (for the convenience of description, this state is called semi-finished assembly), the semi-finished assembly is placed in a lower mold, and an upper mold matched with the lower mold is provided to form a molding cavity between the upper and lower molds after the two molds are clamped. The upper mold includes a pressing block, wherein the pressing block is pressed against the non-photosensitive area 1212 of the photosensitive chip 12 when the molds are clamped. Further, the molding material is injected into the molding cavity, and after curing, molding and drafting, the molded bracket 16B integrally covering at least a part of the circuit board 11, the at least one electronic component 14, and at least a part of the non-photosensitive area 1212 of the photosensitive chip 12 is obtained, wherein the area occupied by the pressing block correspondingly forms the light-passing hole for the photosensitive chip 12.

Figure 19:
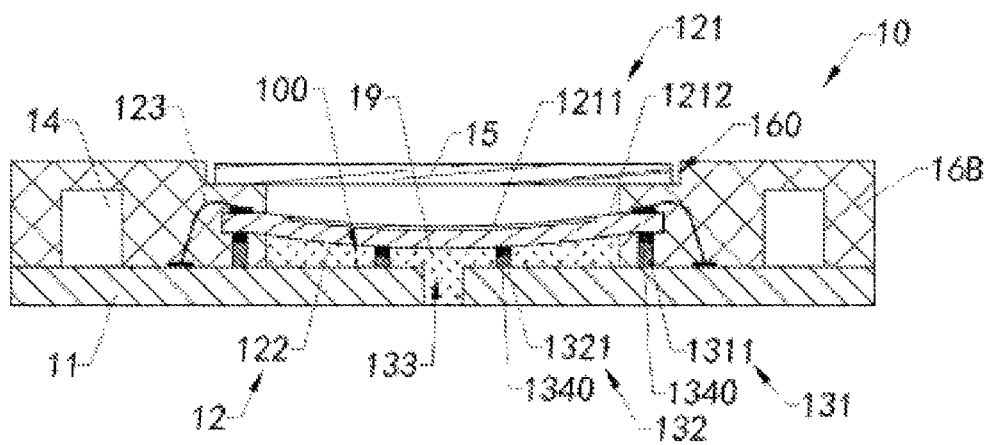
FIG. 19 illustrates a schematic view of still another modified implementation of the photosensitive assembly according to the embodiment of the present application.

It is worth mentioning that the shape of the inner side surface of the molded bracket 16B is determined by the shape of the pressing block. For example, when the side surface of the pressing block is perpendicular to the circuit board 121 of the photosensitive chip 12, the inner side surface of the molded bracket 16B is perpendicular to the upper surface 121 of the photosensitive chip 12. For another example, when the inner side surface of the pressing block is inclined to the upper surface 121 of the photosensitive chip 12, the inner side surface of the molded bracket 16B extends obliquely outward. In particular, when the inner side surface of the pressing block has a stepped shape, the inner side surface of the molded bracket 16 also has a stepped shape, so as to form a mounting platform 160 for mounting the filter element 15 on the top surface of the molded bracket 16B. For the convenience of description, this technical solution is defined as an IOM (IR Filter on Molding) solution in the present application, as shown in FIG. 19.

It is worth mentioning that when the photosensitive assembly 10 is made based on the MOC process, the first shaping piece 131 and the second shaping piece 132 of the shaping assembly are mounted or integrally molded at the preset positions of the circuit board 11 in advance before the molded bracket 16 is integrally molded at preset positions of the circuit board 11 and the photosensitive chip 12. Such a manufacturing sequence is advantageous to engineering implementation.

Figure 20:
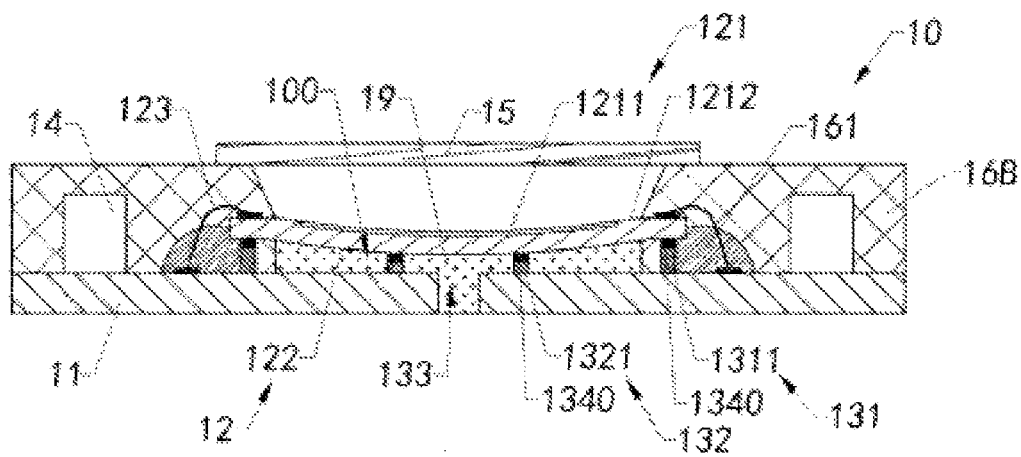
FIG. 20 illustrates a schematic view of still another modified implementation of the photosensitive assembly according to the embodiment of the present application.

It is worth mentioning that, in order to prevent the positional deviation caused by the photosensitive chip 12 being impacted by the injected molding material during the execution of the MOC process, in some examples of this modified embodiment of the present application, the photosensitive assembly 10 further includes a side encapsulation 161 that encloses side parts of the photosensitive chip 12 and the first shaping piece 131. The side encapsulation 161 is used to prevent the position of the photosensitive chip 12 from shifting during the execution of the molding process, as shown in FIG. 20. It should be understood that the side encapsulation 161 can not only prevent the position of the photosensitive chip 12 from shifting, but also effectively reduce the stress generated by the the molded bracket 16B from being transmitted to the photosensitive chip 12.

Figure 21:
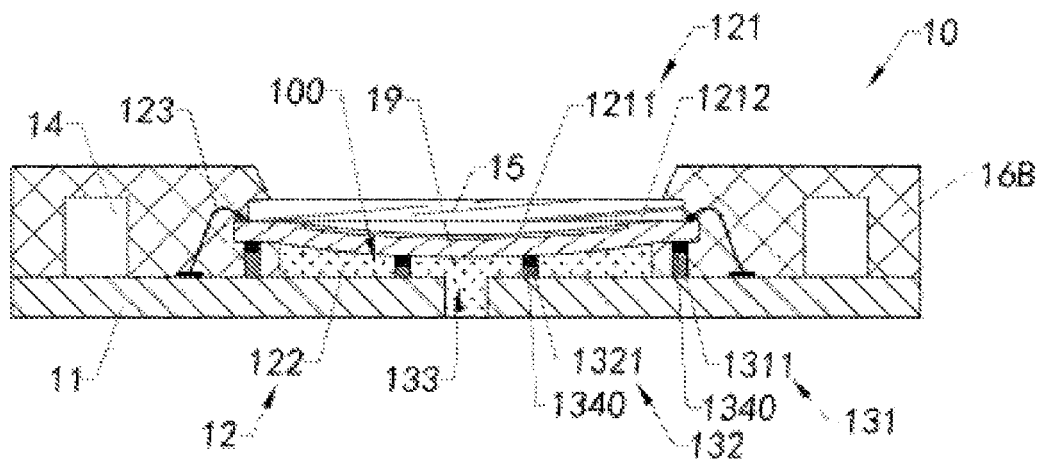
FIG. 21 illustrates a schematic view of still another modified implementation of the photosensitive assembly according to the embodiment of the present application.

FIG. 21 illustrates a schematic view of still another modified implementation of the photosensitive assembly according to the embodiment of the present application. As shown in FIG. 21, in this modified implementation, the filter element 15 is stacked above the photosensitive chip 12, and the bracket 16 is implemented as a molded bracket 16C, which is integrally molded through a molding process to cover at least a part of the circuit board 11, the at least one electronic component 14, at least a part of the non-photosensitive area 1212 of the photosensitive chip 12 and at least a part of the filter element 15.

In a specific manufacturing process, after the photosensitive chip 12 is attached to the first shaping piece 131 and is bent and formed to be attached to the second shaping piece 132, the filter element 15 is stacked above the photosensitive chip 12 to form a semi-finished assembly. Further, the semi-finished assembly is placed in a lower mold, and an upper mold matched with the lower mold is provided to form a molding cavity between the upper and lower molds after the two molds are clamped. The upper mold includes a pressing block, wherein the pressing block is pressed against the filter element 15 when the molds are clamped. Further, the molding material is injected into the molding cavity, and after curing, molding and drafting, the molded bracket 16C integrally covering at least a part of the circuit board 11, the at least one electronic component 14, and at least a part of the non-photosensitive area 1212 of the photosensitive chip 12 is obtained, wherein the area occupied by the pressing block correspondingly forms the light-passing hole for the photosensitive chip 12.

It is worth mentioning that the shape of the inner side surface of the molded bracket 16C is determined by the shape of the pressing block. For example, when the side surface of the pressing block is perpendicular to the filter element 15, the inner side surface of the molded bracket 16C is perpendicular to the filter element 15. For another example, when the inner side surface of the pressing block is inclined to the filter element 15, the inner side surface of the molded bracket 16C extends obliquely outward. For the convenience of description, this technical solution is defined as an IOC (IR Filter on Chip) solution in the present application.

It is worth mentioning that, in the embodiment of the present application, in addition to the filter element 15 being supported on the bracket 16 (including the plastic bracket 16, and the molded brackets 16A, 16B, 16C) and the photosensitive chip 12, the filter element 15 may also be mounted in other ways, as long as the filter element 15 is held in the photosensitive path of the photosensitive assembly 10. For example, in other examples of the embodiments of the present application, the photosensitive assembly 10 further includes a filter element holder 17, and the filter element holder 17 is mounted on the bracket 16, and is used for mounting the filter element 15. For another example, when the photosensitive assembly 10 cooperates with the optical lens 20 to form a camera module, the filter element 15 may also be supported in the optical lens 20, or may be formed on the surface of the lens element in the optical lens 20 in the form of coating. In this regard, it is not limited in the present application.

In summary, the photosensitive assembly based on the embodiment of the present application is explained, wherein the flat photosensitive chip is bent into a shape adapted to the actual focal imaging plane through a special manufacturing process, so as to improve the imaging quality of the camera module.

The manufacturing process for the photosensitive assembly 10 will be described below from the perspective of the manufacturing steps.

As shown in FIGS. 4A and 4B, the manufacturing process for the photosensitive assembly 10 based on the embodiment of the present application is explained, which is used for fabricating the photosensitive assembly as described above and its modified implementation.

Specifically, the method for manufacturing the photosensitive assembly 10 according to the embodiment of the present application includes the following steps:

First, a circuit board 11, a photosensitive chip 12, a first shaping piece 131 and a second shaping piece 132 are provided, wherein the circuit board 11 includes at least one opening 133. It is worth mentioning that the openings 133 in the circuit board 11 may also be formed through a perforation process after the accommodating space 100 is formed. In this regard, it is not limited in the present application.

Next, the first shaping piece 131 and the second shaping piece 132 are fixed at preset positions of the circuit board 11.

Then, the photosensitive chip 12 is attached to the first shaping piece 131 to define an accommodating space 100 between the first shaping piece 131, the circuit board 11 and the photosensitive chip 12, wherein the opening 133 formed in the circuit board 11 is communicated with the accommodating space 100, wherein the second shaping piece 132 is located in the accommodating space 100, and the height of the second shaping piece 132 is lower than that of the first shaping piece 131, and wherein the upper surface of at least one of the first shaping piece and the second shaping piece includes an arc-shaped surface recessed downward and inward.

Then, the suction device 40 is attached to at least a part of the lower surface 122 of the photosensitive chip 12 through the opening 133.

Next, the photosensitive chip 12 is pulled down by the suction device 40, so that the photosensitive chip 12 is bent downward.

In the embodiment of the present application, the suction device 40 includes a suction cup 41 and an extension rod 42 extending downward from the suction cup 41, wherein the suction cup 41 is used for suction on at least part of the lower surface 122 of the photosensitive chip 12, and after the suction cup 41 is attached to the photosensitive chip 12, the photosensitive chip 12 may be bent downward by pulling the extension rod 42. It is worth mentioning that, in other examples of the present application, the suction device 40 may also be implemented as other types. In this regard, it is not limited in the present application.

Preferably, the position where the opening 133 is formed in the circuit board 11 corresponds to the central area of the photosensitive chip 12. In this way, when the suction device 40 is inserted into the accommodating space 100 through the opening 133, the suction cup 41 of the suction device 40 can be attached to the central area of the lower surface 122 of the photosensitive chip 12. Thus, the bending force generated by the suction device 40 is the largest in the central area of the photosensitive chip 12 and gradually decreases from the central area to the edge portion, so that the deformation of the photosensitive chip 12 gradually increases from the edge of the photosensitive chip 12 to the center of the photosensitive chip 12 to adapt to the shape of the actual focal plane. It is worth mentioning that, in the embodiment of the present application, the number of the openings 133 may be set to one or more. In this regard, it is not limited in the present application. It should also be understood that, in other examples of the embodiment of the present application, the openings 133 may also be formed at other positions in the circuit board 11.

Preferably, in the embodiment of the present application, the first shaping piece 131 should have a closed shape (for example, it is implemented to have a ⊔-like shape), and the second shaping pieces 132 are symmetrically arranged with respect to the center of the photosensitive chip 12. It is worth mentioning that the height setting of the second shaping piece 132 is related to the relative positional relationship between the second shaping piece 132 and the first shaping piece 131. Specifically, the shape of the shaping surface 130 defined by the first shaping piece 131 and the second shaping piece 132 for defining the curved shape of the photosensitive chip 12 is set based on the shape of the actual focal plane. More specifically, when the second shaping piece 132 is close to the first shaping piece 131, the height difference between the first shaping piece 131 and the second shaping piece 132 should be reduced (that is, the height of the second shaping piece 132 should be increased); and when the second shaping piece 132 is away from the first shaping piece 131, the height difference between the first shaping piece 131 and the second shaping piece 132 should be increased (that is, the height of the second shaping piece 132 should be reduced).

In particular, in the embodiment of the present application, an upper surface of at least one of the first shaping piece 131 and the second shaping piece 132 includes an arc-shaped surface recessed downward and inward, and the arc-shaped surface is configured so that when the photosensitive chip 12 is bent downward, a lower surface 122 adapted to the focal imaging plane of the photosensitive assembly 10 is formed, so as to form a downward curved shaping surface 130 through the upper surfaces of the first shaping piece 131 and the second shaping piece 132. Preferably, in the embodiment of the present application, the upper surfaces of the first shaping piece 131 and the second shaping piece 132 both include arc-shaped surfaces recessed downward and inward.

Correspondingly, the process of bending the photosensitive chip 12 includes:
bending the photosensitive chip 12 until the lower surface 122 of the photosensitive chip 12 is attached to the arc-shaped surface, so that when the photosensitive chip 12 is bent downward, a lower surface adapted to a focal imaging plane of the photosensitive assembly 10 is formed.

As shown in FIG. 4B, the manufacturing method further includes the following step:
forming a heat dissipation member 19 in the accommodating space 100 defined by the first shaping piece 131, the photosensitive chip 12 and the circuit board 11, wherein the heat dissipation member 19 is attached to at least a part of the lower surface 122 of the photosensitive chip 12.

Preferably, in the embodiment of the present application, the entire accommodating space 100 is fully filled with the heat dissipation member 19, so that the lower surface 122 (a part corresponding to the accommodating space 100) of the photosensitive chip 12 is completely in contact with the heat dissipation member 19, so as to maximize the heat dissipation area and improve the heat dissipation performance.

In a specific implementation, when the heat dissipation material 190 is implemented as a fluid-like heat dissipation material 190, the process of forming the heat dissipation member 19 in the accommodating space 100 includes: injecting the fluid-like heat dissipation material 190 into the accommodating space 100 through the opening 133 to form the heat dissipation member 19 after curing and molding.

In order to facilitate the operation, when performing the injection process, the photosensitive assembly 10 may be turned upside down to prevent the fluid-like heat dissipation material 190 from flowing out of the opening 133. In particular, when the number of the openings 133 is only one, in order to balance the internal and external pressures so that the fluid-like heat dissipation material 190 can be smoothly injected into the accommodating space 100, a ventilation hole 135 may be further provided in the circuit board 11. Of course, when the number of the openings 133 exceeds one, the air intake holes, except those being used for injecting the heat dissipation material 190, are functionally equivalent to the ventilation hole 135. That is to say, when the number of the openings 133 exceeds one, at least one of the openings forms the ventilation hole 135.

After the heat dissipation member 19 is molded, a reinforcing plate 18 may be further attached to the bottom surface of the circuit board 11, wherein preferably, the reinforcing plate 18 is made of a metal material with relatively high thermal conductivity. In this way, the heat dissipation performance of the photosensitive assembly 10 is further enhanced.

In a specific implementation, the heat dissipation material 190 is implemented in a granular heat dissipation material 190. The process of forming the heat dissipation member 19 in the accommodating space 100 includes: injecting the fluid-like heat dissipation material 190 into the accommodating space 100 through the opening 133; and attaching a reinforcing plate 18 to the bottom surface of the circuit board 11 to seal the opening 133 through the reinforcing plate 18. Preferably, the reinforcing plate 18 is made of a metal material with relatively high thermal conductivity, so as to further enhance the heat dissipation performance of the photosensitive assembly 10 while sealing the opening 133.

Further, the manufacturing process for the photosensitive assembly 10 further includes: disposing the bracket 16 on the circuit board 11, and mounting a filter element 15 on the bracket 16.

Specifically, in the COB process, the bracket 16 is implemented as a conventional plastic bracket 16. Correspondingly, the process of disposing the bracket 16 on the circuit board 11 is embodied in the following step: attaching and mounting the plastic bracket 16 to the circuit board 11. Further, the filter element 15 is attached and mounted to the bracket 16.

In the MOB process, the bracket 16 is implemented as a molded bracket 16A. Correspondingly, the process of disposing the bracket 16 on the circuit board 11 includes: integrally molding the molded bracket 16A on the circuit board 11 through a molding process, wherein the molded bracket 16A covers at least a part of the circuit board 11 and at least a part of the at least one electronic component 14. Further, the filter element 15 is attached and mounted to the molded bracket 16A.

It is worth mentioning that, in the MOB process, the first shaping piece 131 and the second shaping piece 132 are mounted at preset positions of the circuit board 11 after the molded bracket 16 is integrally molded at a preset position of the circuit board 11. Such a manufacturing sequence is advantageous to engineering implementation.

In the MOC process, the bracket 16 is implemented as a molded bracket 16B. Correspondingly, the process of disposing the bracket 16 on the circuit board 11 includes: integrally forming the molded bracket 16B on the circuit board 11 through a molding process, wherein the molded bracket 16B covers at least a part of the circuit board 11, the at least one electronic component 14, and at least a part of the non-photosensitive area 1212 of the photosensitive chip 12. Further, the filter element 15 is attached and mounted to the molded bracket 16B.

In order to prevent the positional deviation caused by the photosensitive chip 12 being impacted by the injected molding material during the execution of the MOC process, before performing the MOC process to form the molded bracket 16B, the process further includes applying a side encapsulation 161 on the side parts of the photosensitive chip 12 and the first shaping piece 131, so that the side encapsulation 161 encloses the side parts of the photosensitive chip 12 and the first shaping piece 131. In this way, the position of the photosensitive chip 12 is prevented from being shifted during the molding process.

In the IOC process, the bracket 16 is implemented as a molded bracket 16C. Correspondingly, the process of disposing the bracket 16 on the circuit board 11 includes: stacking the filter element 15 on the photosensitive chip 12, and integrally molding the molded bracket 16C on the circuit board 11, wherein the molded bracket 16C integrally covers at least a part of the circuit board 11, the at least one electronic component 14, at least a part of a non-photosensitive area 1212 of the photosensitive chip 12, and at least a part of the filter element 15.

It is worth mentioning that in the MOB, MOC and IOC processes, the shape of the inner side surface of the molded bracket 16 is determined by the shape of the pressing block. In particular, when the inner side surface of the pressing block has a stepped shape, the inner side surface of the molded bracket 16 also has a stepped shape, so as to form a mounting platform 160 for mounting the filter element 15 on a top surface of the molded bracket 16. Correspondingly, in these examples, the filter element 15 is mounted on the mounting platform 160.

It is also worth mentioning that, in the embodiment of the present application, in addition to the filter element 15 being supported on the bracket 16 (including the plastic bracket 16, and the molded brackets 16A, 16B, 16C) and the photosensitive chip 12, the filter element 15 may also be mounted in other ways, as long as the filter element 15 is held in the photosensitive path of the photosensitive assembly 10. For example, in other examples of the embodiments of the present application, the photosensitive assembly 10 further includes a filter element holder 17, and the filter element holder 17 is mounted on the bracket 16, and is used for mounting the filter element 15. For another example, when the photosensitive assembly 10 cooperates with the optical lens 20 to form a camera module, the filter element 15 may also be supported in the optical lens 20, or may be formed on the surface of the lens element in the optical lens 20 in the form of coating. In this regard, it is not limited in the present application.

Figure 22A:
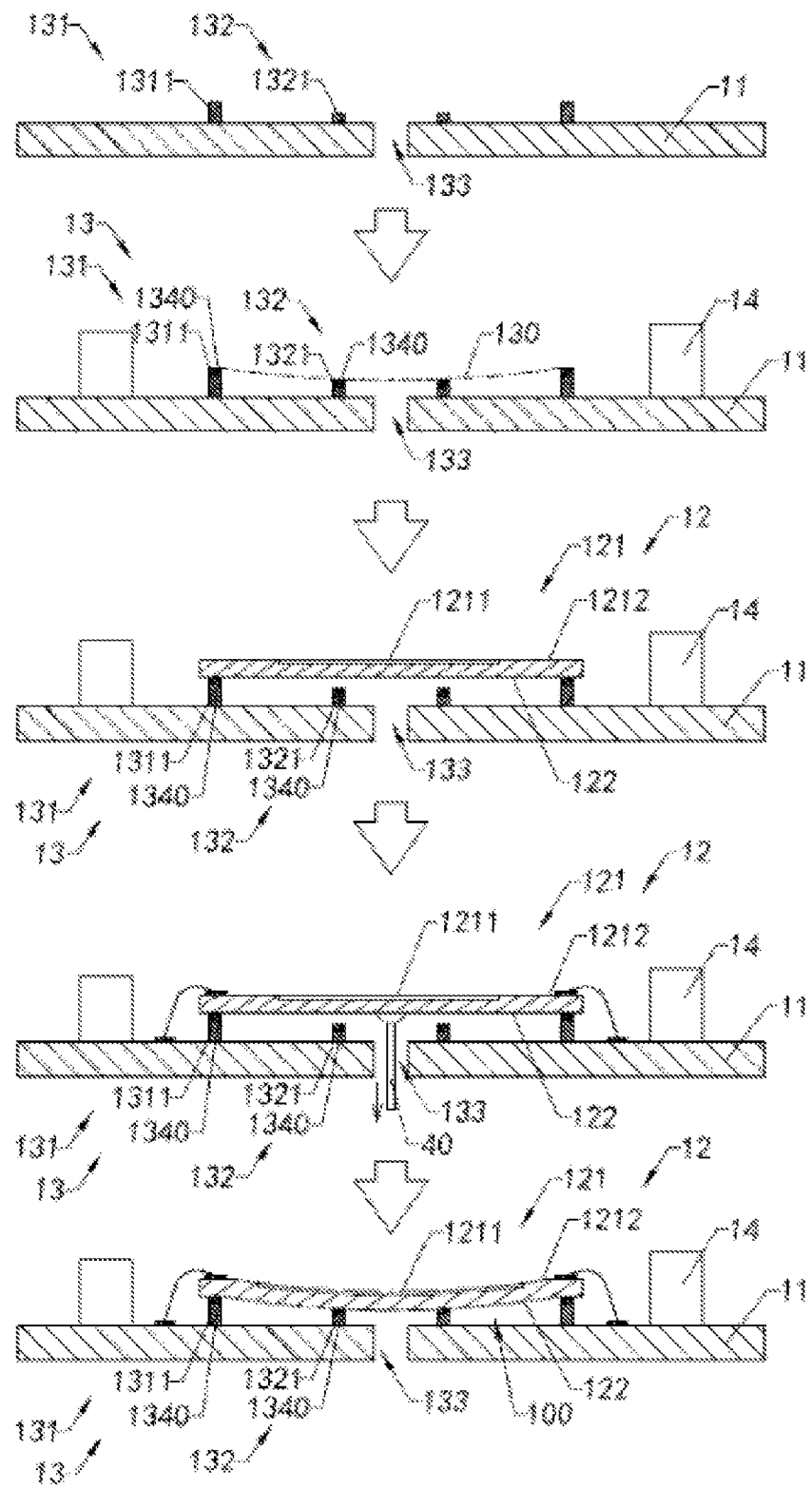
FIGS. 22A and 22B illustrate schematic views of another manufacturing process for the photosensitive assembly according to the embodiment of the present application.
Figure 22B:
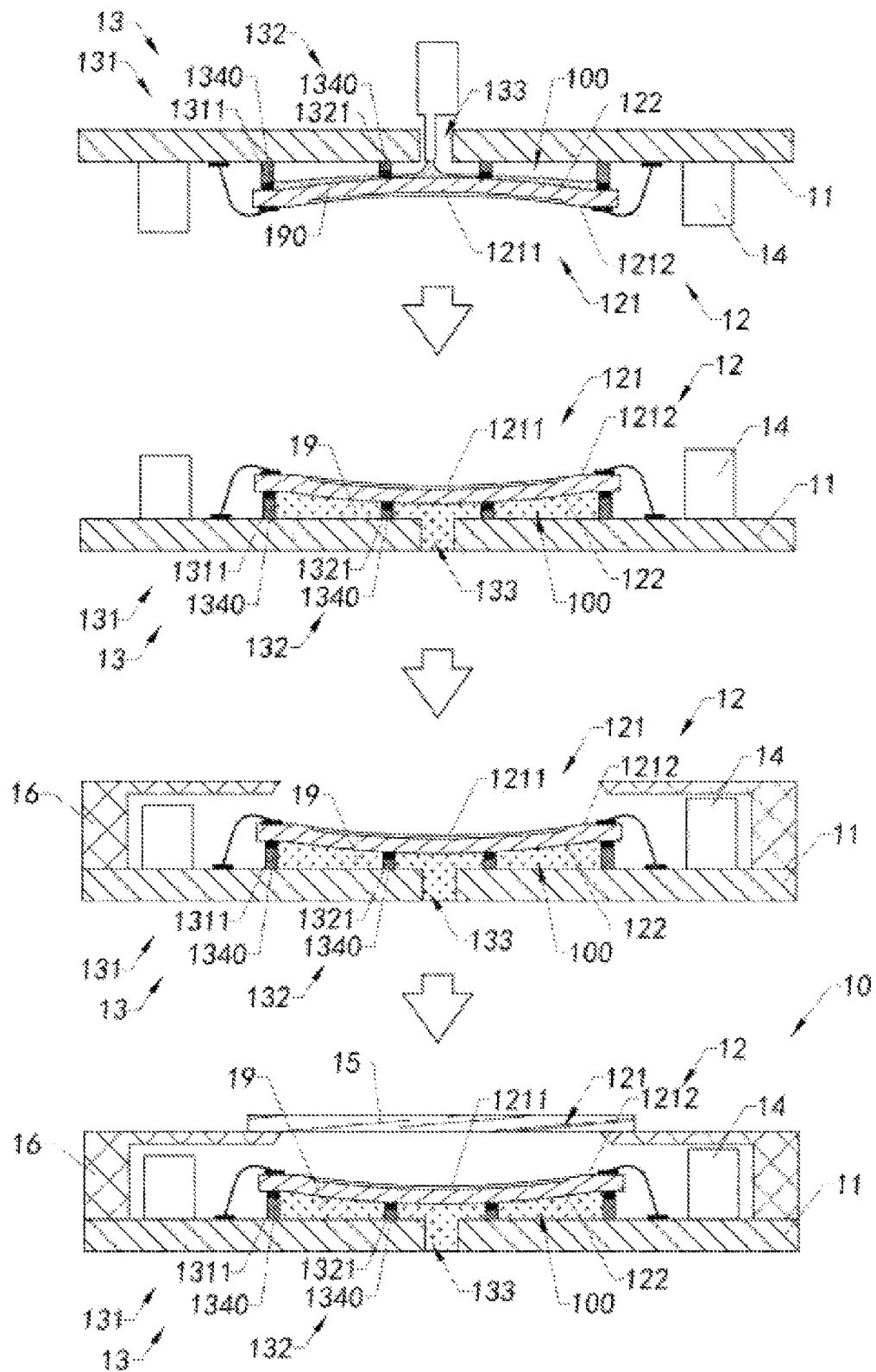
Figure 23:
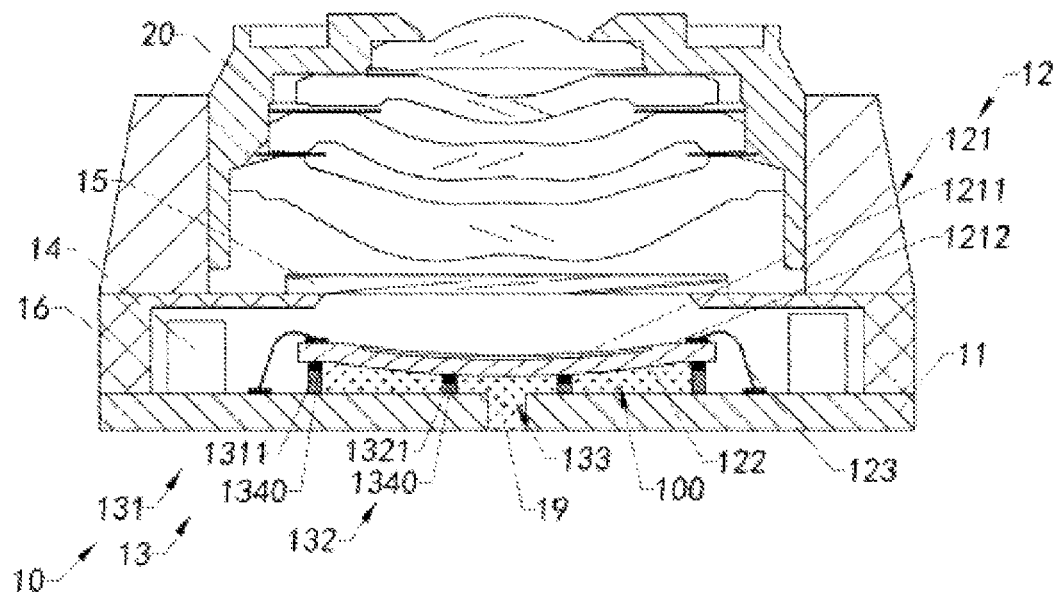
FIG. 23 illustrates a schematic view of a camera module according to an embodiment of the present application, wherein the camera module is a fixed-focus camera module.
Figure 24:
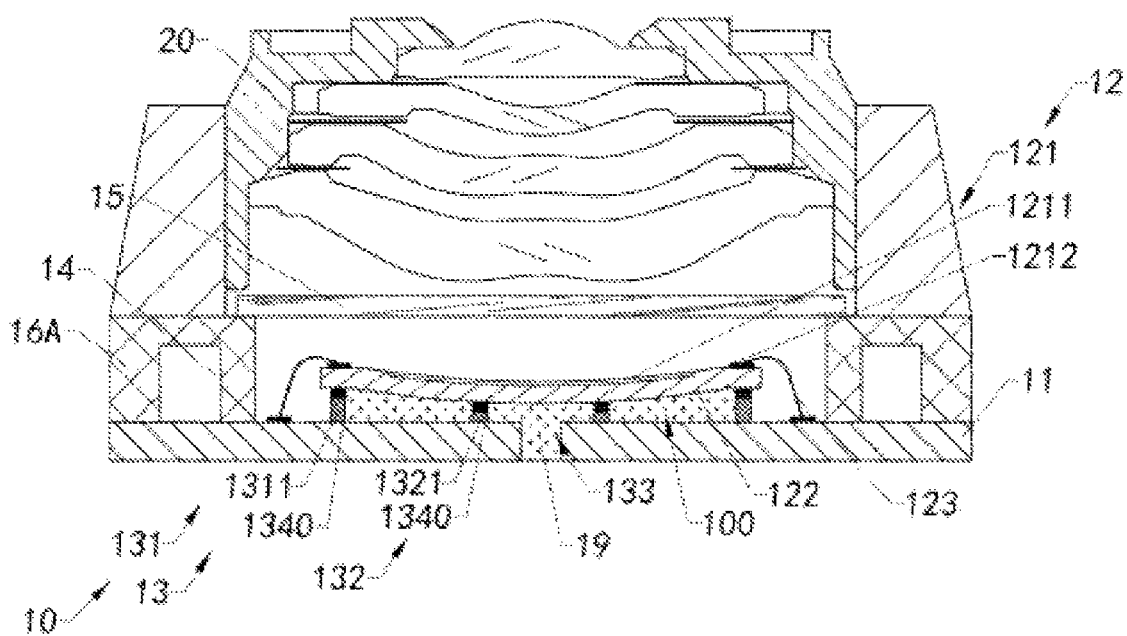
FIG. 24 illustrates a schematic view of another modified implementation of the camera module according to the embodiment of the present application.
Figure 25:
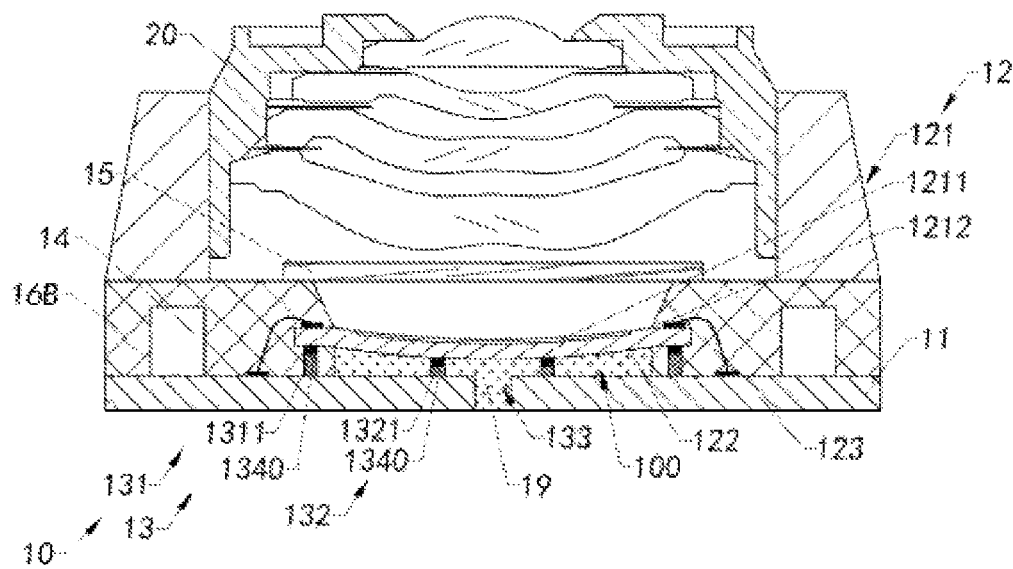
FIG. 25 illustrates a schematic view of still another modified implementation of the camera module according to the embodiment of the present application.
Figure 26:
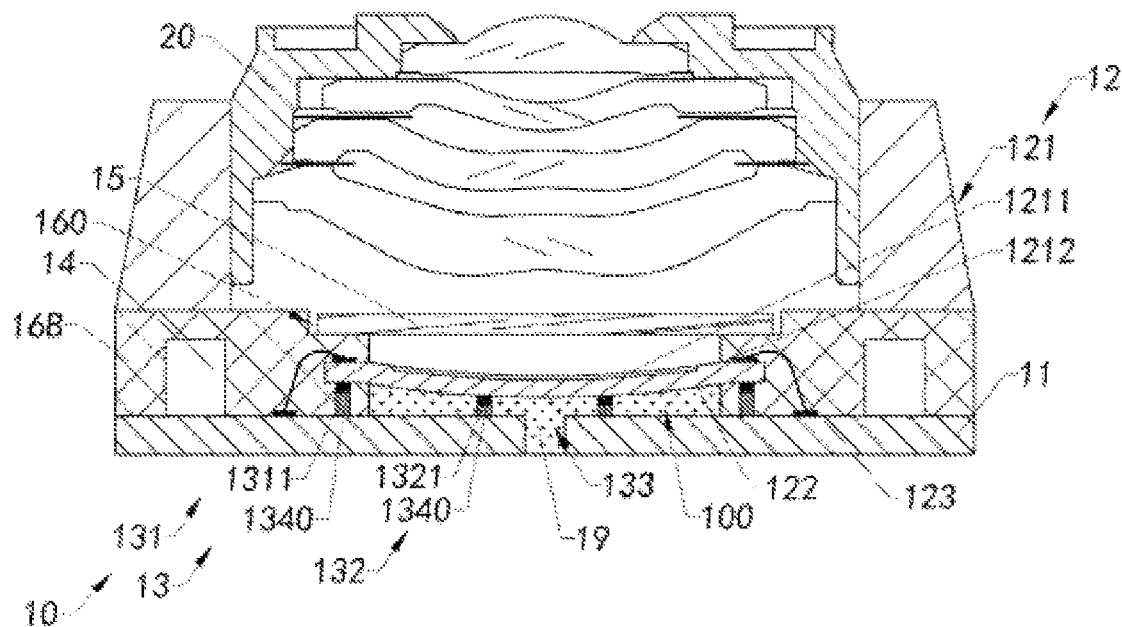
FIG. 26 illustrates a schematic view of still another modified implementation of the camera module according to the embodiment of the present application.
Figure 27:
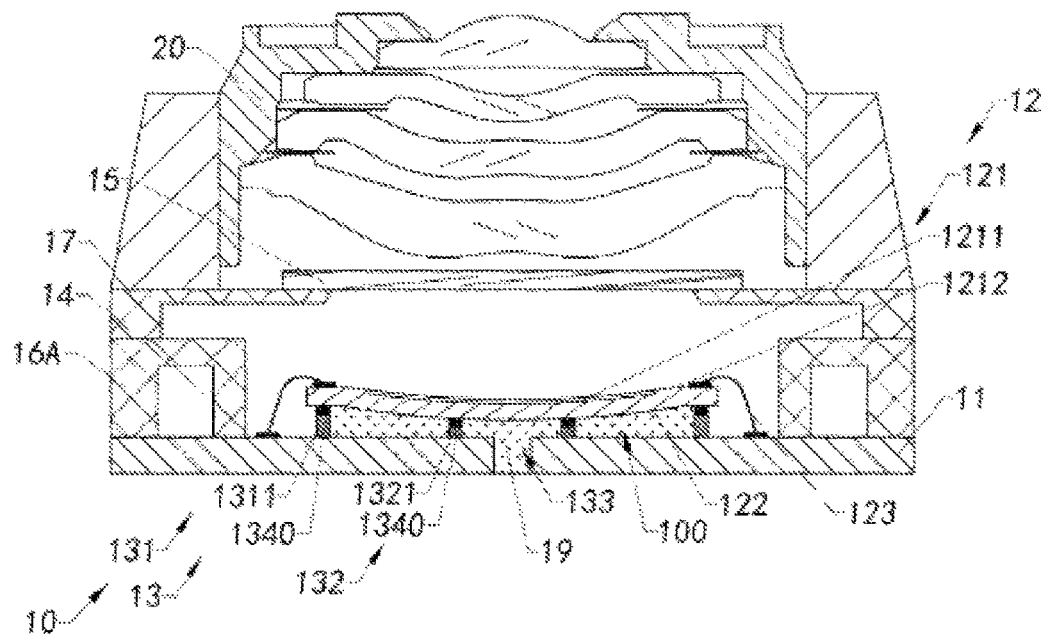
FIG. 27 illustrates a schematic view of still another modified implementation of the camera module according to the embodiment of the present application.

As shown in FIGS. 22A and 22B, a second manufacturing process for the photosensitive assembly 10 based on the embodiment of the present application is explained, which is used for fabricating the photosensitive assembly 10 as described above and its modified implementation.

Specifically, as shown in FIG. 22A, the manufacturing process for the photosensitive assembly 10 according to the embodiment of the present application includes the following steps:

First of all, a circuit board 11 and a photosensitive chip 12 are provided, wherein the circuit board 11 comprises at least one opening 133. It is worth mentioning that the openings 133 in the circuit board 11 may also be formed through a perforation process after the accommodating space 100 is formed. In this regard, it is not limited in the present application.

Next, a first shaping piece 131 and a second shaping piece 132 are integrally molded on the circuit board 11, wherein the height of the second shaping piece 132 is lower than that of the first shaping piece 131. In this way, the first shaping piece and the second shaping piece 132 define a recessed shaping surface 130.

Then, the photosensitive chip 12 is attached to the first shaping piece 131 to define an accommodating space 100 between the first shaping piece 131, the circuit board 11 and the photosensitive chip 12 in this way, wherein the opening 133 is communicated with the accommodating space 100.

Next, the suction device 40 is attached to at least a part of the lower surface 122 of the photosensitive chip 12 through the opening 133.

Then, the photosensitive chip 12 is pulled down by the suction device 40, so that the photosensitive chip 12 is bent downward.

That is to say, compared with the first fabrication process, in the second fabrication process, the first shaping piece 131 and the second shaping piece 132 are integrally molded on the circuit board 11 instead of being prefabricated and then mounted.

Specifically, in the embodiment of the present application, the process of integrally molding a first shaping piece 131 and a second shaping piece 132 on the circuit board 11 includes:

integrally molding a first shaping piece body 1311 and a second shaping piece body 1321 on the circuit board 11 through an electroplating molded process; and applying an adhesive 1340 on the first shaping piece body 1311 and the second shaping piece body 1321 separately to form the first shaping piece 131 by the first shaping piece body 1311 and the adhesive 1340, and form the second shaping piece 132 by the second shaping piece body 1321 and the adhesive 1340.

In the embodiment of the present application, the suction device 40 includes a suction cup 41 and an extension rod 42 extending downward from the suction cup 41, wherein the suction cup 41 is used for suction on at least part of the lower surface 122 of the photosensitive chip 12, and after the suction cup 41 is attached to the photosensitive chip 12, the photosensitive chip 12 may be bent downward by pulling the extension rod 42. It is worth mentioning that, in other examples of the present application, the suction device 40 may also be implemented as other types. In this regard, it is not limited in the present application.

Preferably, the position where the opening 133 is formed in the circuit board 11 corresponds to the central area of the photosensitive chip 12. In this way, when the suction device 40 is inserted into the accommodating space 100 through the opening 133, the suction cup 41 of the suction device 40 can be attached to the central area of the lower surface 122 of the photosensitive chip 12. Thus, the bending force generated by the suction device 40 is the largest in the central area of the photosensitive chip 12 and gradually decreases from the central area to the edge portion, so that the deformation of the photosensitive chip 12 gradually increases from the edge of the photosensitive chip 12 to the center of the photosensitive chip 12 to adapt to the shape of the actual focal plane. It is worth mentioning that, in the embodiment of the present application, the number of the openings 133 may be set to one or more. In this regard, it is not limited in the present application. It should also be understood that, in other examples of the embodiment of the present application, the openings 133 may also be formed at other positions in the circuit board 11.

Preferably, in the embodiment of the present application, the first shaping piece 131 should have a closed shape (for example, it is implemented to have a ⊔-like shape), and the second shaping pieces 132 are symmetrically arranged with respect to the center of the photosensitive chip 12. It is worth mentioning that the height setting of the second shaping piece 132 is related to the relative positional relationship between the second shaping piece 132 and the first shaping piece 131. Specifically, the shape of the shaping surface 130 defined by the first shaping piece 131 and the second shaping piece 132 for defining the curved shape of the photosensitive chip 12 is set based on the shape of the actual focal plane. More specifically, when the second shaping piece 132 is close to the first shaping piece 131, the height difference between the first shaping piece 131 and the second shaping piece 132 should be reduced (that is, the height of the second shaping piece 132 should be increased); and when the second shaping piece 132 is away from the first shaping piece 131, the height difference between the first shaping piece 131 and the second shaping piece 132 should be increased (that is, the height of the second shaping piece 132 should be reduced).

In particular, in the embodiment of the present application, an upper surface of at least one of the first shaping piece 131 and the second shaping piece 132 includes an arc-shaped surface recessed downward and inward, and the arc-shaped surface is configured so that when the photosensitive chip 12 is bent downward, a lower surface 122 adapted to the focal imaging plane of the photosensitive assembly 10 is formed, so as to form a downward curved shaping surface 130 through the upper surfaces of the first shaping piece 131 and the second shaping piece 132. Preferably, in the embodiment of the present application, the upper surfaces of the first shaping piece 131 and the second shaping piece 132 both include arc-shaped surfaces recessed downward and inward.

Correspondingly, the process of bending the photosensitive chip 12 includes:
bending the photosensitive chip 12 until the lower surface 122 of the photosensitive chip 12 is attached to the arc-shaped surface, so that when the photosensitive chip 12 is bent downward, a lower surface adapted to a focal imaging plane of the photosensitive assembly 10 is formed.

As shown in FIG. 22B, the fabrication process for the photosensitive assembly 10 further includes the following step:
injecting a heat dissipation material into the accommodating space 100 through the opening 133 to form the heat dissipation member in the accommodating space 100, wherein the heat dissipation member is attached to at least a part of the lower surface 122 of the photosensitive chip 12.

Preferably, in the embodiment of the present application, the entire accommodating space 100 is fully filled with the heat dissipation member 19, so that the lower surface 122 (a part corresponding to the accommodating space 100) of the photosensitive chip 12 is completely in contact with the heat dissipation member 19, so as to maximize the heat dissipation area and improve the heat dissipation performance.

In a specific implementation, when the heat dissipation material 190 is implemented as a fluid-like heat dissipation material 190, the process of forming the heat dissipation member 19 in the accommodating space 100 includes: injecting the fluid-like heat dissipation material 190 into the accommodating space 100 through the opening 133 to form the heat dissipation member 19 after curing and molding.

In order to facilitate the operation, when performing the injection process, the photosensitive assembly 10 may be turned upside down to prevent the fluid-like heat dissipation material 190 from flowing out of the opening 133. In particular, when the number of the openings 133 is only one, in order to balance the internal and external pressures so that the fluid-like heat dissipation material 190 can be smoothly injected into the accommodating space 100, a ventilation hole 135 may be further provided in the circuit board 11. Of course, when the number of the openings 133 exceeds one, the openings 133, except those being used for injecting the heat dissipation material 190, are functionally equivalent to the ventilation hole 135. That is to say, when the number of the openings 133 exceeds one, at least one of the openings 133 forms the ventilation hole 135.

After the heat dissipation member 19 is molded, a reinforcing plate 18 may be further attached to the bottom surface of the circuit board 11, wherein preferably, the reinforcing plate 18 is made of a metal material with relatively high thermal conductivity. In this way, the heat dissipation performance of the photosensitive assembly 10 is further enhanced.

Further, the manufacturing process for the photosensitive assembly 10 further includes: disposing the bracket 16 on the circuit board 11, and mounting a filter element 15 on the bracket 16.

Specifically, in the COB process, the bracket 16 is implemented as a conventional plastic bracket 16. Correspondingly, the process of disposing the bracket 16 on the circuit board 11 is embodied in the following step: attaching and mounting the plastic bracket 16 to the circuit board 11. Further, the filter element 15 is attached and mounted to the bracket 16.

In the MOB process, the bracket 16 is implemented as a molded bracket 16A. Correspondingly, the process of disposing the bracket 16 on the circuit board 11 includes: integrally molding the molded bracket on the circuit board 11 through a molding process, wherein the molded bracket 16A covers at least a part of the circuit board 11 and at least a part of the at least one electronic component 14. Further, the filter element 15 is attached and mounted to the molded bracket.

In the MOC process, the bracket 16 is implemented as a molded bracket. Correspondingly, the process of disposing the bracket 16 on the circuit board 11 includes: integrally forming the molded bracket on the circuit board 11 through a molding process, wherein the molded bracket covers at least a part of the circuit board 11, the at least one electronic component 14, and at least a part of the non-photosensitive area 1212 of the photosensitive chip 12. Further, the filter element 15 is attached and mounted to the molded bracket.

In order to prevent the positional deviation caused by the photosensitive chip 12 being impacted by the injected molding material during the execution of the MOC process, before performing the MOC process to form the molded bracket, the process further includes applying a side encapsulation 161 on the side parts of the photosensitive chip 12 and the shaping member 13, so that the side encapsulation 161 encloses the side parts of the photosensitive chip 12 and the shaping member 13. In this way, the position of the photosensitive chip 12 is prevented from being shifted during the molding process.

In the IOC process, the bracket 16 is implemented as a molded bracket. Correspondingly, the process of disposing the bracket 16 on the circuit board 11 includes: stacking the filter element 15 on the photosensitive chip 12, and integrally molding the molded bracket 16C on the circuit board 11, wherein the molded bracket 16C integrally covers at least a part of the circuit board 11, the at least one electronic component 14, at least a part of a non-photosensitive area 1212 of the photosensitive chip 12, and at least a part of the filter element 15.

It is worth mentioning that in the MOB, MOC and IOC processes, the shape of the inner side surface of the molded bracket 16 is determined by the shape of the pressing block. In particular, when the inner side surface of the pressing block has a stepped shape, the inner side surface of the molded bracket 16 also has a stepped shape, so as to form a mounting platform 160 for mounting the filter element 15 on a top surface of the molded bracket 16. Correspondingly, in these examples, the filter element 15 is mounted on the mounting platform 160.

It is also worth mentioning that, in the embodiment of the present application, in addition to the filter element 15 being supported on the bracket 16 (including the plastic bracket and the molded brackets) and the photosensitive chip 12, the filter element 15 may also be mounted in other ways, as long as the filter element 15 is held in the photosensitive path of the photosensitive assembly 10. For example, in other examples of the embodiments of the present application, the photosensitive assembly 10 further includes a filter element holder 17, and the filter element holder 17 is mounted on the bracket 16, and is used for mounting the filter element 15. For another example, when the photosensitive assembly 10 cooperates with the optical lens 20 to form a camera module, the filter element 15 may also be supported in the optical lens 20, or may be formed on the surface of the lens element in the optical lens 20 in the form of coating. In this regard, it is not limited in the present application.

In summary, the manufacturing method for the photosensitive assembly 10 based on the embodiment of the present application is explained, wherein the flat photosensitive chip 12 is bent into a shape adapted to the actual focal imaging plane through the special manufacturing process, so as to improve the imaging quality of the camera module. Moreover, the heat dissipation member 19 for enhancing heat dissipation is formed on the back side of the photosensitive chip 12, so as to improve the heat dissipation performance.

Exemplary First Camera Module

The application of the photosensitive assembly 10 as described above to a camera module will be specifically described below. It is known by those skilled in the art that the camera module includes an auto-focus camera module and a fixed-focus camera module.

When the camera module is implemented as a fixed-focus camera module, the camera module includes photosensitive assembly as described above and an optical lens 20, wherein the optical lens 20 is held in a photosensitive path of the photosensitive assembly 10. Specifically, the optical lens 20 is usually mounted on the bracket 16 to hold the optical lens 20 on the photosensitive path of the photosensitive assembly 10, and for its specific effect, reference may be made to FIGS. 23 to 27. It is worth mentioning that the drawings only illustrate several typical photosensitive assemblies in the embodiments of the present application, and the corresponding modified implementations thereof are not listed one by one. In this regard, it should be fully understood by those skilled in the art.

During the imaging process, the external light first passes through the optical lens 20, and is then collected by the photosensitive chip 12 after being filtered by the filter element 15. In particular, in the embodiment of the present application, the photosensitive chip 12 is bent based on the shape of the actual focal plane, and in this way, the imaging quality of the camera module is improved.

Figure 28:
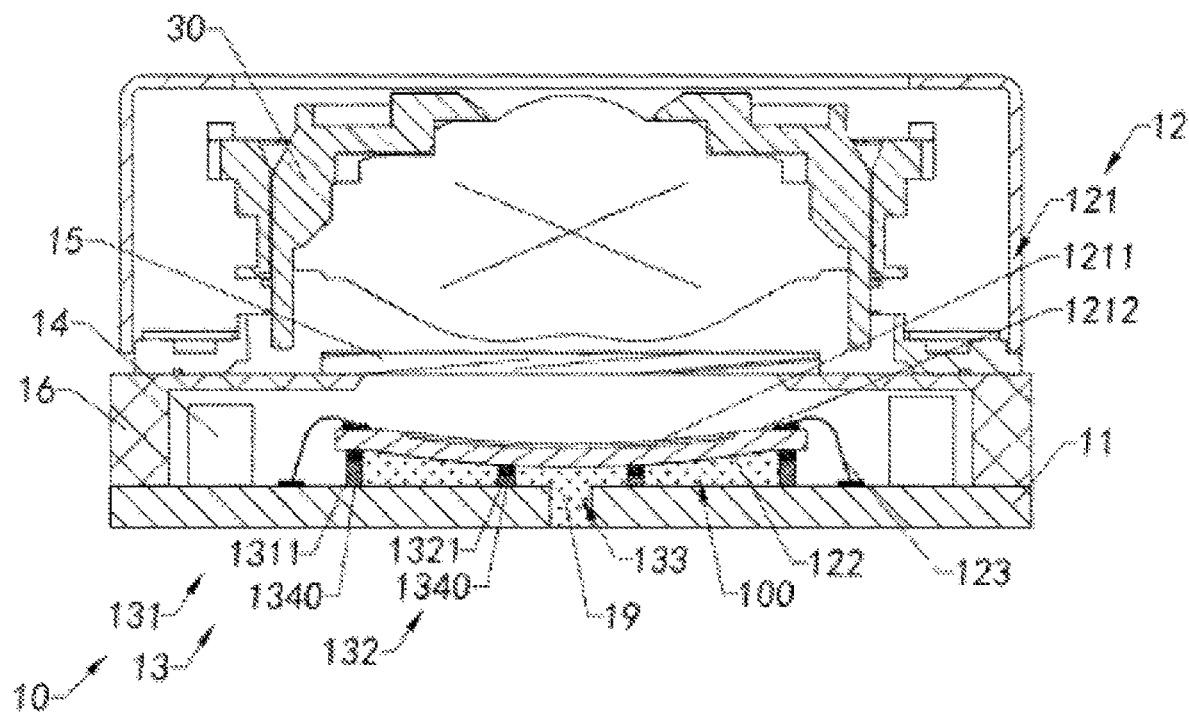
FIG. 28 illustrates a schematic view of a camera module according to an embodiment of the present application, wherein the camera module is an auto-focus camera module.

When the camera module is implemented as an auto-focus camera module, as shown in FIG. 28, the camera module includes photosensitive assembly as described above, an optical lens 20 and a driving element 30, wherein the driving element 30 is mounted on the bracket 16, and the optical lens 20 is mounted on the driving element 30. In this way, the driving element 30 can carry the optical lens 20 to move along the photosensitive path of the photosensitive assembly 10, so as to realize the auto-focus function. It is worth mentioning that the drawings only illustrate a typical photosensitive assembly in the embodiment of the present application, and the corresponding modified implementations are not listed one by one. In this regard, it should be fully understood by those skilled in the art.

In summary, the camera module based on the embodiment of the present application is explained, wherein the flat photosensitive chip 12 is bent into a shape adapted to the actual focal imaging plane through the special manufacturing process, so as to improve the imaging quality of the camera module.

Exemplary Second Photosensitive Assembly and Manufacturing Method Therefor

Figure 29:
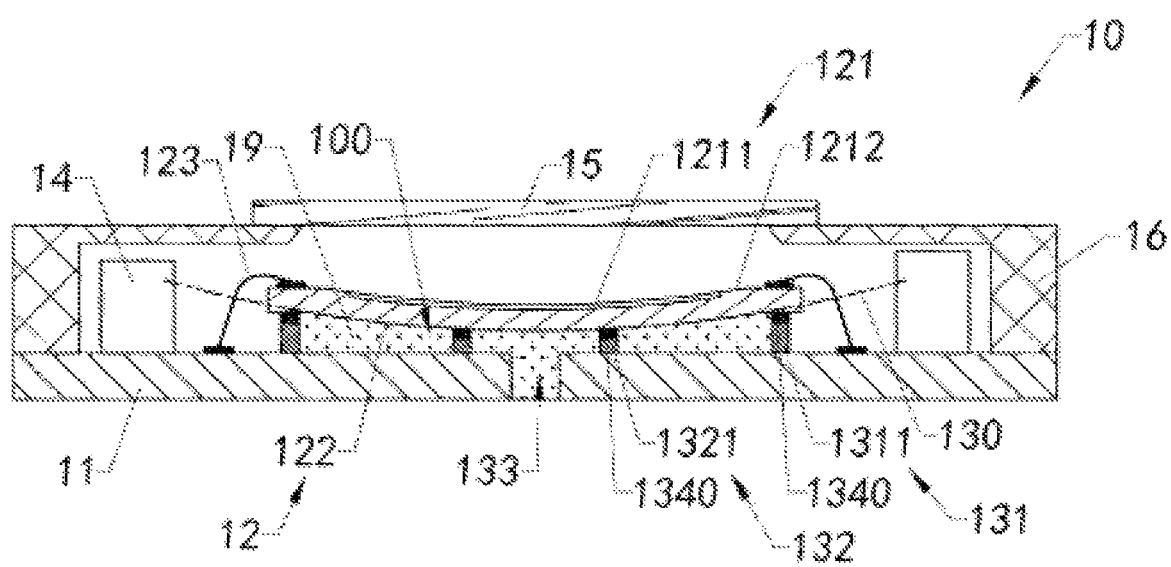
FIG. 29 illustrates a schematic view of a photosensitive assembly according to an embodiment of the present application.
Figure 30A:
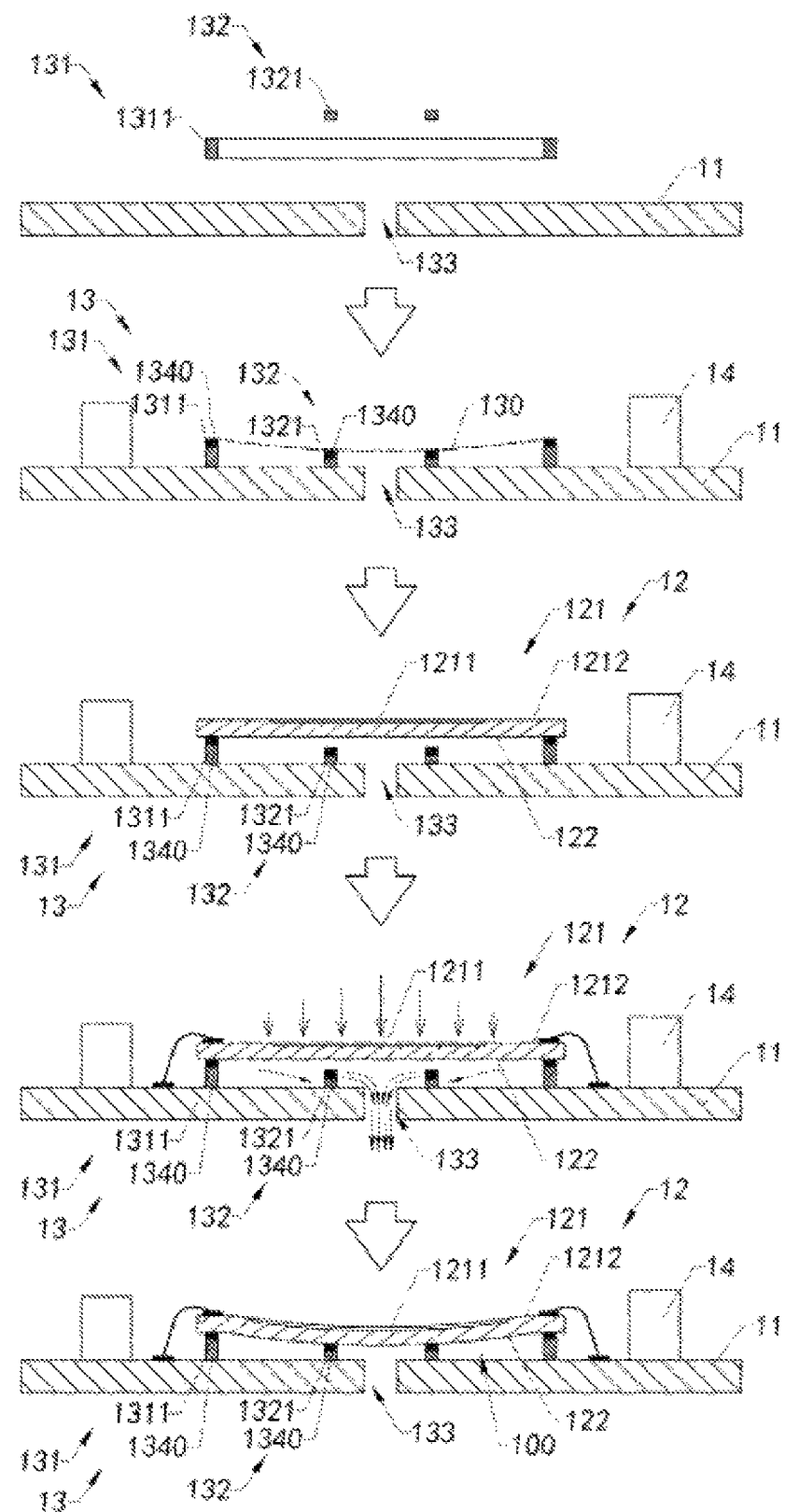
FIGS. 30A and 30B illustrate schematic views of a manufacturing process for the photosensitive assembly according to the embodiment of the present application.
Figure 30B:
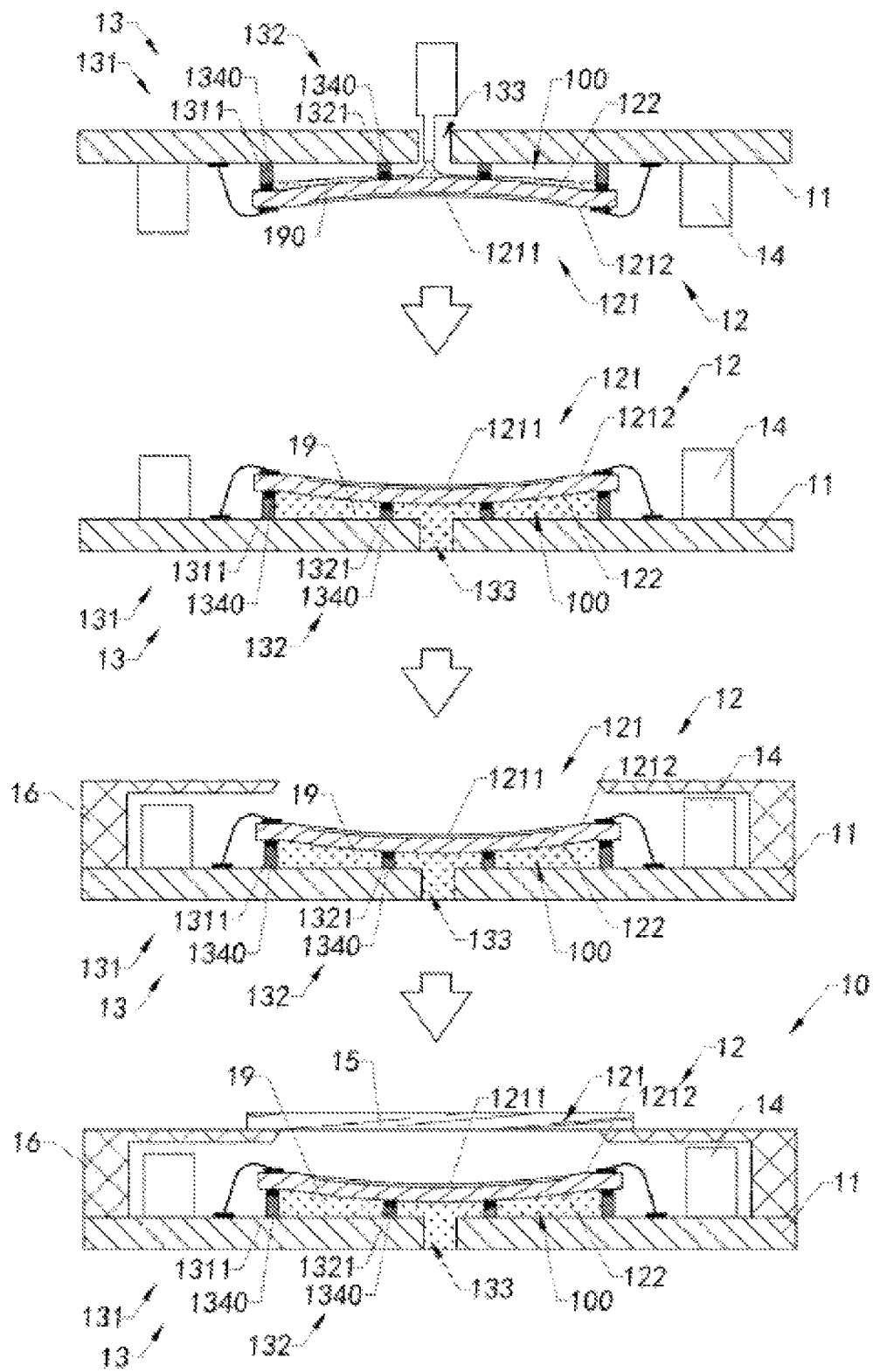

As shown in FIGS. 29 to 30B, another example of a photosensitive assembly and a manufacturing process therefor according to an embodiment of the present application is explained. As shown in FIG. 29, the photosensitive assembly 10 includes a circuit board 11, a photosensitive chip 12 electrically connected to the circuit board 11, and a shaping member 13, wherein a lower surface 122 of the photosensitive chip 12 is attached to the shaping member 13 to form an accommodating space 100 with the shaping member 13 and the circuit board 11, and the accommodating space 100 is configured so that the photosensitive chip 12 is bent downward during the process of assembling the photosensitive assembly 10. In particular, in the embodiment of the present application, the photosensitive chip 12 is bent into a shape adapted to the actual focal plane, and the imaging quality is improved in this way.

As shown in FIGS. 29 to 30B, in the embodiment of the present application, the shaping member 13 is fixed on a top surface of the circuit board 11, wherein a top surface of the shaping member 13 is attached to the lower surface 122 of the photosensitive chip 12 to form the accommodating space 100 with the photosensitive chip 12 and the circuit board 11. It should be understood that the accommodating space 100 below the photosensitive chip 12 provides a deformation space for the photosensitive chip 12 to bend downward under the action of a specific force. Moreover, in the embodiment of the present application, the shaping member 13 sets a shaping surface 130, wherein the shaping surface 130 is configured to limit the downward bending shape of the photosensitive chip 12, so that the shape of the lower surface 122 of the bent photosensitive chip 12 is adapted to the actual focal plane, and the imaging quality is improved in this way.

Figure 32:
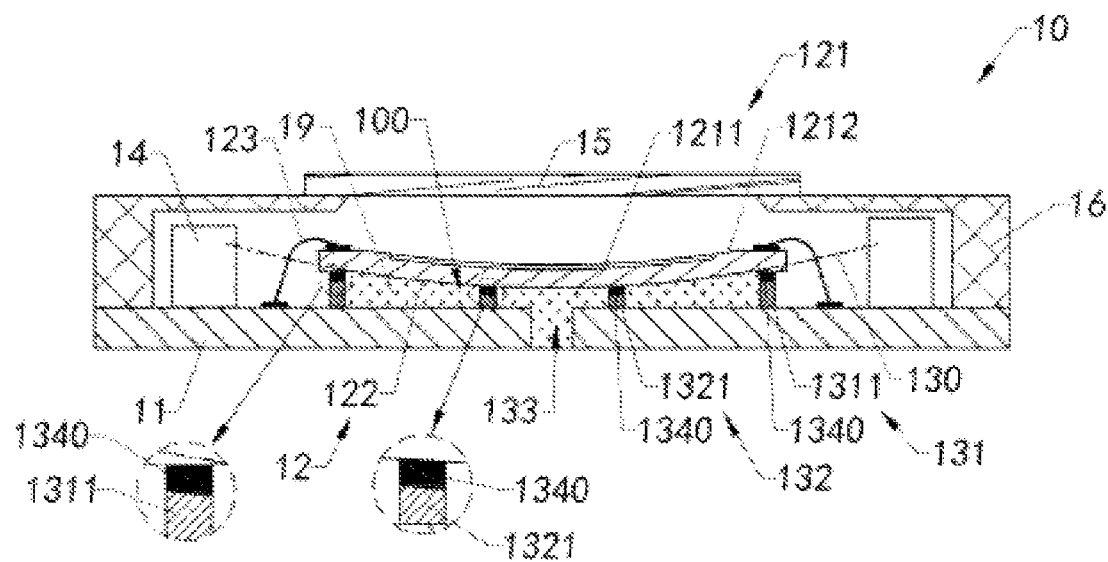
FIG. 32 illustrates an enlarged schematic view of an upper surface of a shaping member in the photosensitive assembly according to the embodiment of the present application.

More specifically, in the embodiment of the present application, the shaping member 13 includes a first shaping piece 131 and a second shaping piece 132, wherein the first shaping piece 131 is fixed on the circuit board 11, and the lower surface 122 of the photosensitive chip 12 is attached to the first shaping piece 131. In this way, an accommodating space 100 is formed between the first shaping piece 131, the photosensitive chip 12 and the circuit board 11. The second shaping piece 132 is fixed on the circuit board 11 and located in the accommodating space 100, and the height of the second shaping piece 132 is lower than that of the first shaping piece 131. In other words, in the embodiment of the present application, the first shaping piece 131 and the second shaping piece 132 are arranged in a stepped shape. In particular, in the embodiment of the present application, an upper surface of at least one of the first shaping piece 131 and the second shaping piece 132 includes an arc-shaped surface recessed downward and inward, and the arc-shaped surface is configured so that when the photosensitive chip 12 is bent downward, a lower surface 122 adapted to the focal imaging plane of the photosensitive assembly 10 is formed, so as to form a downward curved shaping surface 130 through the upper surfaces of the first shaping piece 131 and the second shaping piece 132. Preferably, in the embodiment of the present application, the upper surfaces of the first shaping piece 131 and the second shaping piece 132 both include arc-shaped surfaces recessed downward and inward, as shown in FIG. 32.

Further, the shaping member 13 further includes at least one opening 133 formed through the circuit board 11 and communicated with the accommodating space 100, wherein after the photosensitive chip 12 is attached to the first shaping piece 131 to form the accommodating space 100, and the gas in the accommodating space 100 can be discharged through the opening 133 to form a pressure difference between the upper and lower surfaces 121, 122 of the photosensitive chip 12, so as to force the photosensitive chip 12 to bend downward until it is attached to the shaping surface 130 formed by the first shaping piece 131 and the second shaping piece 132.

Figure 31:
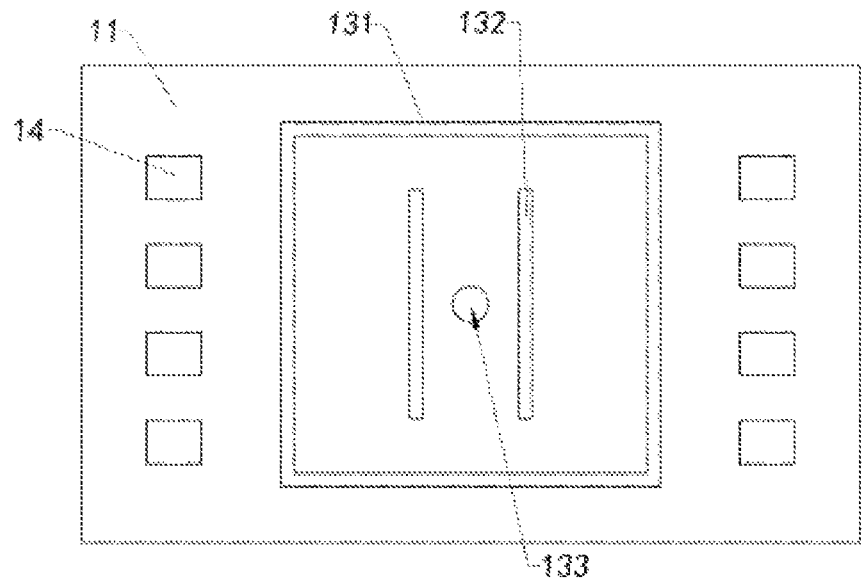
FIG. 31 illustrates a top view of the photosensitive assembly according to the embodiment of the present application.

In order to form the accommodating space 100, in the embodiment of the present application, the first shaping piece 131 has a closed shape. As shown in FIG. 31, preferably, the shape of the first shaping piece 131 is adapted to the shape of the circuit board 11 and the photosensitive chip 12. It should be known by those skilled in the art that the shape of the existing circuit board 11 and photosensitive chip 12 is usually a rectangle. Correspondingly, the shape of the first shaping piece 131 is preferably implemented as a closed □-like shape. Of course, it should be understood by those skilled in the art that with the development of the camera module technology and the expansion of its application scenarios, the shape of the circuit board 11 and the photosensitive chip 12 will change. Correspondingly, the shape of the first shaping piece 131 may also be adjusted adaptively. In this regard, it is not limited in the present application.

It should be understood that the □-shaped first shaping piece 131 has an opening. Correspondingly, after the first shaping piece 131 is fixed on the circuit board 11, the opening is shielded by the photosensitive chip 12 attached to the first shaping piece 131, so that the photosensitive chip 12, the circuit board 11 and the first shaping piece 131 enclose to form the accommodating space 100. Preferably, the size of the first shaping piece 131 is adapted to the size of the photosensitive chip 12, so that when the photosensitive chip 12 is attached to the first shaping piece 131, the first shaping piece 131 is supported on the edge portion of the photosensitive chip 12. It should be known by those skilled in the art that the upper surface 121 of the photosensitive chip 12 includes a photosensitive area 1211 and a non-photosensitive area 1212 located around the photosensitive area 1211, wherein, since the photosensitive area 1211 is a sensitive area, it is usually disposed at the center portion of the upper surface 121 of the photosensitive chip 12, and the non-photosensitive area 1212 is located at the edge portion of the upper surface 121 and surrounds the photosensitive area 1211. That is to say, the size of the first shaping piece 131 is adapted to the photosensitive chip 12, so that the first shaping piece 131 is supported on the non-photosensitive area 1212 of the photosensitive chip 12. This can ensure that the photosensitive area 1211 of the photosensitive chip 12 will not be damaged during the subsequent bending process of the photosensitive chip 12. It is worth noting that the premise of the center line of the photosensitive chip 12 mentioned in the present invention is that the photosensitive chip has a regular shape, that is, the photosensitive area 1211 and the non-photosensitive area 1212 of the photosensitive chip 12 are symmetrically distributed with respect to the center. When the photosensitive chip 12 has an irregular shape, the center line of the photosensitive chip 12 in the present invention refers to the center line of the photosensitive area 1211.

More preferably, the shape and size of the first shaping piece 131 is adapted to the size and shape of the photosensitive chip 12, so that when the photosensitive chip 12 is attached to the first shaping piece 131, the first shaping piece 131 is supported on the non-photosensitive area 1212 of the photosensitive chip 12, and the center of the first shaping piece 131 is coaxial with the center of the photosensitive chip 12. That is, the photosensitive chip 12 is coaxially attached to the first shaping piece 131.

As shown in FIG. 29, in the embodiment of the present application, the first shaping piece 131 includes a first shaping piece body 1311 and an adhesive 1340 applied on the first shaping piece body, wherein the first shaping piece body 1311 is disposed on the circuit board 11, and the adhesive 1340 is used for bonding the photosensitive chip 12. It should be understood that the function of the adhesive 1340 is to bond the first shaping piece body 1311 and the photosensitive chip 12, and the thickness and material thereof do not constitute a limitation of the present application. Moreover, in other examples of the present application, the photosensitive chip 12 may also be directly disposed on the first shaping piece body 1311 by using a process such as ultrasonic welding without the adhesive 1340. That is, in other examples of the present application, the adhesive 1340 is a non-essential element. Preferably, in the embodiment of the present application, the adhesive 1340 has certain flexibility and relatively high viscosity.

In particular, before the accommodating space 100 is formed, the second shaping piece 132 should be preset at a preset position of the circuit board 11 in advance, so that after the photosensitive chip 12 is bonded to the first shaping piece 131 to form the accommodating space 100, the second shaping piece 132 is accommodated in the accommodating space 100.

As described previously, the height of the second shaping piece 132 is smaller than the height of the first shaping piece 131. In particular, in the embodiment of the present application, the height setting of the second shaping piece 132 is related to the relative positional relationship between the second shaping piece 132 and the first shaping piece 131. Specifically, the shape of the shaping surface 130 formed by the first shaping piece 131 and the second shaping piece 132 is set based on the shape of the actual focal plane. That is to say, the relative positional relationship between the first shaping piece 131 and the second shaping piece 132 and the setting of the height difference between the two should match the shape of the actual focal plane. More specifically, when the second shaping piece 132 is close to the first shaping piece 131, the height difference between the first shaping piece 131 and the second shaping piece 132 should be reduced, that is, the height of the shaping member 132 should be increased. When the second shaping piece 132 is away from the first shaping piece 131, the height difference between the first shaping piece 131 and the second shaping piece 132 should be increased, that is, the height of the second shaping piece 132 should be reduced. It is worth mentioning that, in the embodiment of the present application, the shape of the shaping surface 130 matches the shape of the actual focal plane, which does not mean that the shape of the shaping surface 130 is completely consistent with or completely coincides with the shape of the actual focal plane, and simply means that the shape of the shaping surface 130 tends to be consistent with the shape of the actual focal plane.

Preferably, in the embodiment of the present application, the second shaping pieces 132 are symmetrically arranged with respect to the center of the photosensitive chip 12. In this way, when the lower surface 122 of the photosensitive chip 12 is attached to the second shaping piece 132 under the action of the pressure difference, the bonding points between the second shaping piece 132 and the photosensitive chip 12 are also symmetrically distributed with respect to the center of the photosensitive chip 12, so as to form a uniform bonding force on opposite sides of or around the photosensitive chip 12 to ensure that the photosensitive chip 12 can be more stably shaped. More specifically, in the embodiment of the present application, the second shaping pieces 132 are symmetrically arranged on both sides of the center line set by the longer sides of the photosensitive chip 12. Of course, it should be understood by those skilled in the art that, in other examples of the present application, the second shaping piece 132 can also be symmetrically arranged with respect to the center of the photosensitive chip 12 in other ways. It is worth mentioning that, in the embodiment of the present application, the shape of the second shaping piece 132 is not limited in the present application, and includes but is not limited to a slender shape, a column shape, and the like.

Similar to the first shaping piece 131, in the embodiment of the present application, the second shaping piece 132 includes a second shaping piece body 1321 and an adhesive 1340 applied on the second shaping piece body 1321. It should be understood that the photosensitive chip 12 is bonded to the upper surface of the second shaping piece 132 by the adhesive 1340 to prevent the photosensitive chip 12 from being broken due to the suspension in the middle, and to prevent any deformation of the photosensitive chip 12 during use (for example, the photosensitive chip gradually tends to be flat). It is worth mentioning that, in the embodiment of the present application, the adhesive 1340 applied to the first shaping piece body 1311 and the adhesive 1340 applied to the second shaping piece body 1321 may be implemented as the same adhesive 1340 or different types of adhesives 1340, and the application amount or thickness of the adhesive 1340 is not limited in the present application.

Preferably, in the embodiment of the present application, the first shaping piece body 1311 and the second shaping piece body 1321 are made of materials with relatively high hardness and relatively high thermal conductivity, for example, metal materials (including pure metal materials, metal and non-metal alloy materials, metal and metal alloy materials). It should be noted that, in the embodiment of the present application, the first shaping piece body 1311 and the second shaping piece body 1321 each extend between the photosensitive chip 12 and the circuit board 11, so that when the first shaping piece body 1311 and the second shaping piece body 1321 are implemented as being made of metal materials with relatively high thermal conductivity, the heat generated by the operation of the photosensitive chip 12 can be efficiently conducted to the circuit board 11 and finally radiated to the outside by means of the first shaping piece body 1311 and the second shaping piece body 1321. For the heat dissipation portion, it will be further described in the subsequent description, and will not be further described here.

When the photosensitive chip 12 is bonded to the first shaping piece 131 to define the accommodating space 100, there is a certain distance between the lower surface 122 of the photosensitive chip 12 and the adhesive 1340 of the second shaping piece 132. Correspondingly, as the gas in the accommodating space 100 is sucked out through the opening 133, the photosensitive chip 12 is continuously bent downward under the action of the pressure difference, so that the distance between the lower surface 122 of the photosensitive chip 12 and the second shaping piece 132 is continuously reduced until the lower surface 122 of the photosensitive chip 12 is in contact with the adhesive 1340 of the second shaping piece 132, and the photosensitive chip 12 is also bonded to the second shaping piece 132 by the adhesive 1340. When the photosensitive chip 12 is bonded to the first shaping piece 131 and the second shaping piece 132 at the same time, the shape of the photosensitive chip 12 is shaped into the shape of the shaping surface 130, so that the shape of the lower surface 122 of the photosensitive chip 12 is adapted to the actual focal plane.

As shown in FIG. 31, in the embodiment of the present application, the position where the opening 133 is formed in the circuit board 11 corresponds to the central area of the photosensitive chip 12. In this way, when the gas in the accommodating space 100 is discharged by a suction device such as an air pump, the gas in the accommodating space 100 can flow out of the opening 133 from the surrounding in a specific manner (the flow rate of gas near the center of the photosensitive chip 12 is fast, and the flow rate of gas near the edge of the photosensitive chip 12 is slow). Based on the relationship between the pressure and the flow rate, it can be known that the pressure difference formed at each position between the upper and lower surfaces 121 and 122 of the photosensitive chip 12 gradually increases from the edge position to the central area of the photosensitive chip 12. Thus, under the influence of the pressure difference that gradually increases, the deformation degree of the photosensitive chip 12 gradually increases from the edge of the photosensitive chip 12 to the center of the photosensitive chip 12, so as to be bent and deformed downward in a manner that tends to the shaping surface 130. That is to say, in the embodiment of the present application, the position where the opening 133 is formed in the circuit board 11 is set to correspond to the central area of the photosensitive chip 12, which is advantageous for the deformation of the photosensitive chip 12 to more tend to the shape of the actual focal plane, and the gradually changing pressure difference (without stress abrupt change) is advantageous to prevent the photosensitive chip 12 from breaking suddenly during the deformation process. It is worth mentioning that, in the embodiment of the present application, the number of the openings 133 may be set to one or more. In this regard, it is not limited in the present application.

Of course, it should be understood that, in other examples of the embodiment of the present application, the openings 133 may also be formed at other positions in the circuit board 11.

Figure 33:
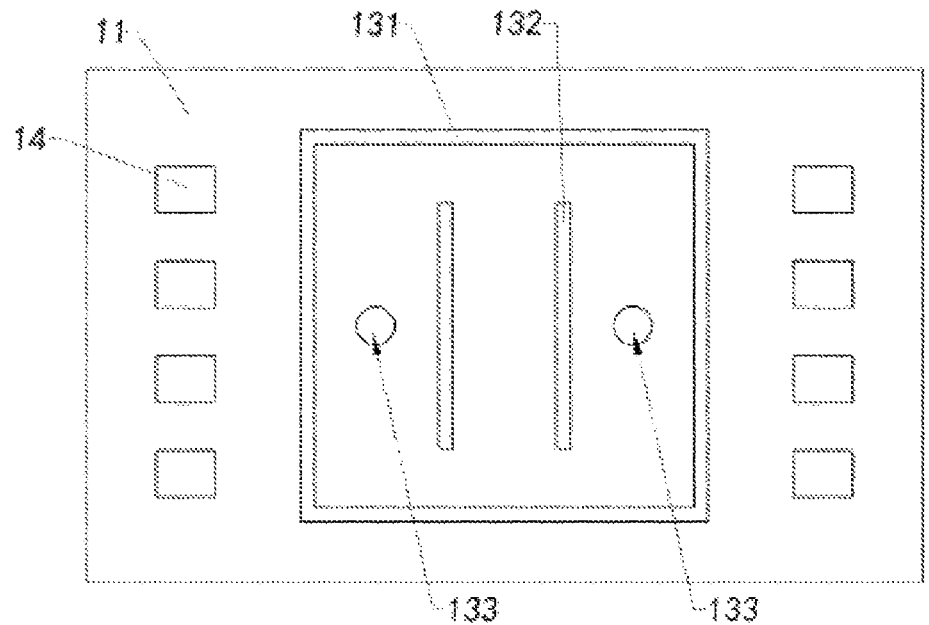
FIG. 33 illustrates a schematic top view of a modified implementation of the photosensitive assembly according to the embodiment of the present application.

FIG. 33 illustrates a schematic top view of a modified implementation of the photosensitive assembly according to the embodiment of the present application. As shown in FIG. 33, in this modified embodiment, the position where the opening 133 is formed in the circuit board 11 is located between the first shaping piece 131 and the second shaping piece 132. Preferably, in this modified embodiment, the positions where the openings 133 are formed in the circuit board 11 are symmetrically arranged with respect to the center of the photosensitive chip 12, so that the gas in the accommodating space 100 is discharged by a suction device such as an air pump, the gas in the accommodating space 100 can be discharged relatively uniformly and symmetrically along the openings 133. Thus, a relatively uniform pressure difference is formed at each position symmetrical with respect to the center of the photosensitive chip 12, so that the photosensitive chip 12 can be more symmetrically and gently bent downward in a manner that tends to the shape of the shaping surface 130.

Figure 34:
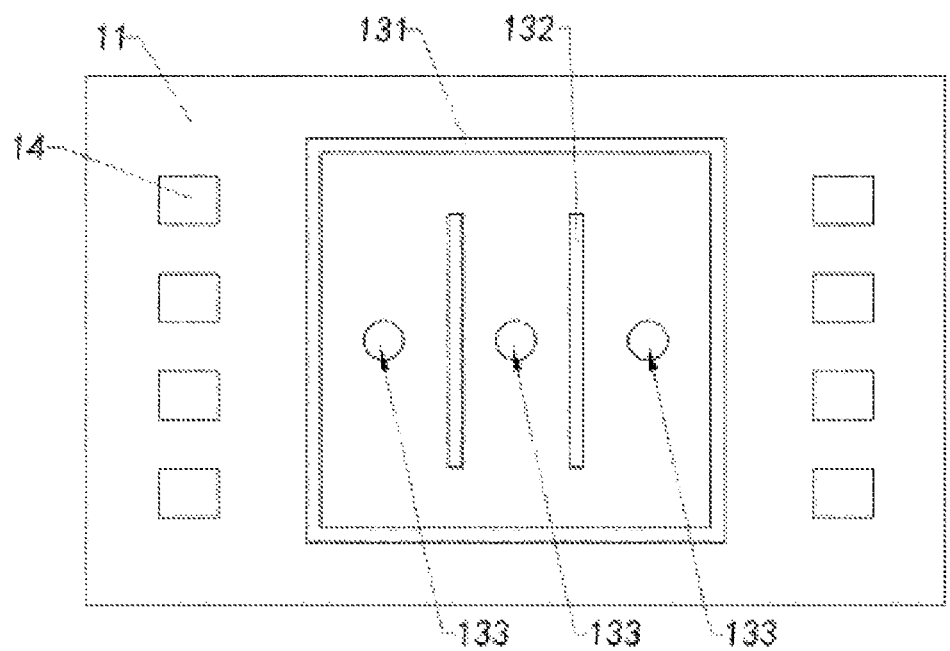
FIG. 34 illustrates a schematic top view of another modified implementation of the photosensitive assembly according to the embodiment of the present application.

FIG. 34 illustrates a schematic top view of another modified implementation of the photosensitive assembly according to the embodiment of the present application. As shown in FIG. 34, in this modified embodiment, the positions where a part of the openings 133 are formed in the circuit board 11 correspond to the central area of the photosensitive chip 12, and the positions where another part of the openings 133 are formed in the circuit board 11 are located between the first shaping piece 131 and the second shaping piece 132. In particular, in this modified embodiment, the positions where another part of the openings 133 are formed in the circuit board 11 are symmetrically arranged with respect to the center of the photosensitive chip 12.

Figure 35:
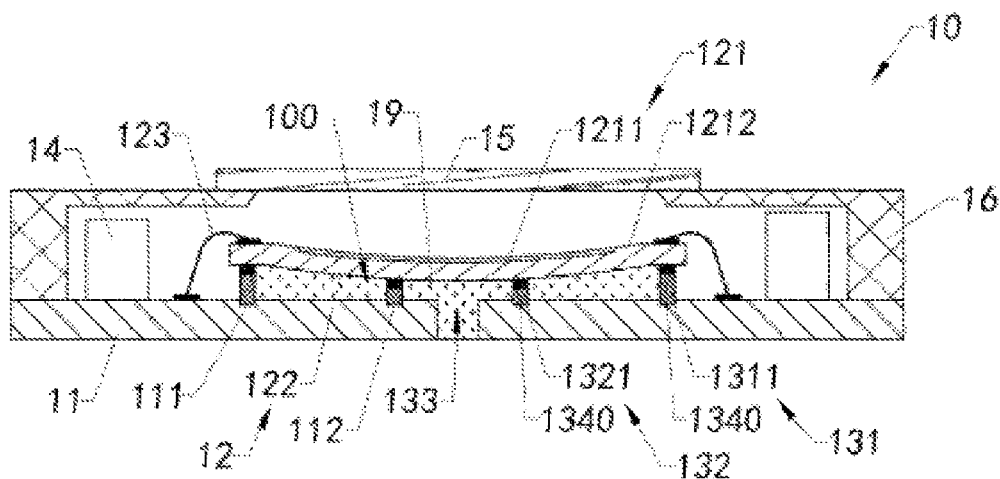
FIG. 35 illustrates a schematic view of still another modified implementation of the photosensitive assembly according to the embodiment of the present application.

In order to facilitate positioning and installation of the first shaping piece 131 and the second shaping piece 132, as shown in FIG. 35, in some examples of the embodiment of the present application, the circuit board 11 further includes a first positioning groove 111 and a second positioning groove 112 formed on the top surface of the circuit board 11 in a recessed manner, wherein the first positioning groove 111 is used for positioning to mount the first shaping piece 131 therein in an adapted manner, and the second positioning groove 112 is used for positioning to mount the second shaping piece 132 therein in an adapted manner.

Figure 36:
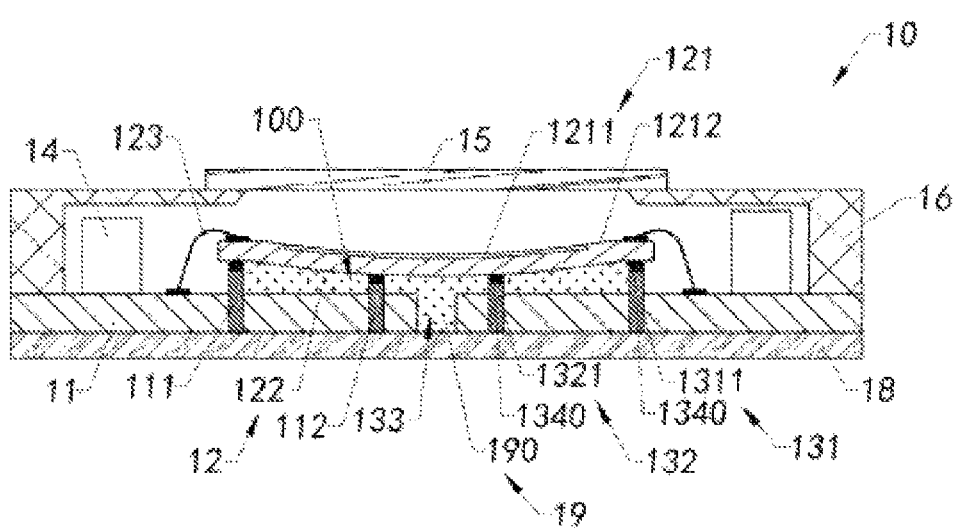
FIG. 36 illustrates a schematic view of still another modified implementation of the photosensitive assembly according to the embodiment of the present application.

In other examples of the present application, in order to facilitate positioning and installation of the first shaping piece 131 and the second shaping piece 132, as shown in FIG. 36, the first positioning groove 111 is implemented as a first positioning through hole penetrating through the circuit board 11, and the second positioning groove 112 is implemented as a second positioning through hole penetrating through the circuit board 11, wherein the first positioning through hole 111 is used for positioning to mount the first shaping piece 131 therein in an adapted manner, and the second positioning through hole 112 is used for positioning to mount the second shaping piece 132 therein in an adapted manner. Moreover, the photosensitive assembly 10 further includes a reinforcing plate 18 attached to the bottom surface of the circuit board 11. Preferably, the reinforcing plate 18 is made of a metal material with relatively high thermal conductivity. In this way, the heat generated by the photosensitive chip 12 can be directly conducted to the reinforcing plate 18 by means of the first shaping piece 131 and the second shaping piece 132 to achieve the purpose of heat dissipation.

It is worth mentioning that, in the embodiment of the present application, the first shaping piece 131 and the second shaping piece 132 are prefabricated pieces, that is, the first shaping piece body 1311 and the second shaping piece 1321 are prefabricated and then attached to preset positions of the circuit board 11. Alternatively, the first shaping piece 131 and the second shaping piece 132 may also be integrally molded at the preset positions of the circuit board 11. For example, when the first shaping piece body 1311 and the second shaping piece body 1321 are made of metal materials, the first shaping piece body 1311 and the second shaping piece body 1321 may be integrally molded at the preset positions of the circuit board 11 through an electroplating molding process. Of course, it should be easily understood that when the first shaping piece body 1311 and the second shaping piece body 1321 are made of other materials with relatively high hardness and relatively high thermal conductivity, the first shaping piece 131 and the second shaping piece 132 may be integrally molded at the preset positions of the circuit board 11 using a corresponding integral molding process. In this regard, it is not limited in the present application.

Figure 37:
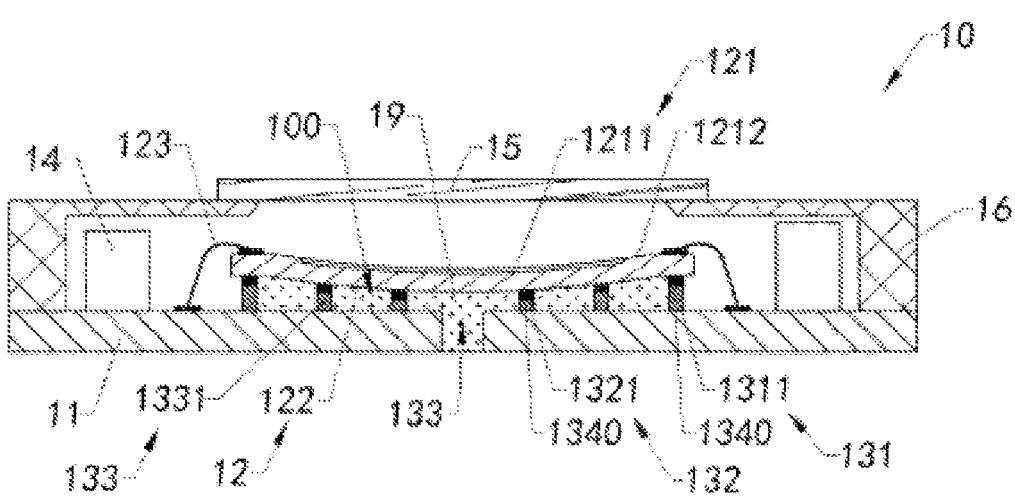
FIG. 37 illustrates a schematic view of still another modified implementation of the photosensitive assembly according to the embodiment of the present application.
Figure 38:
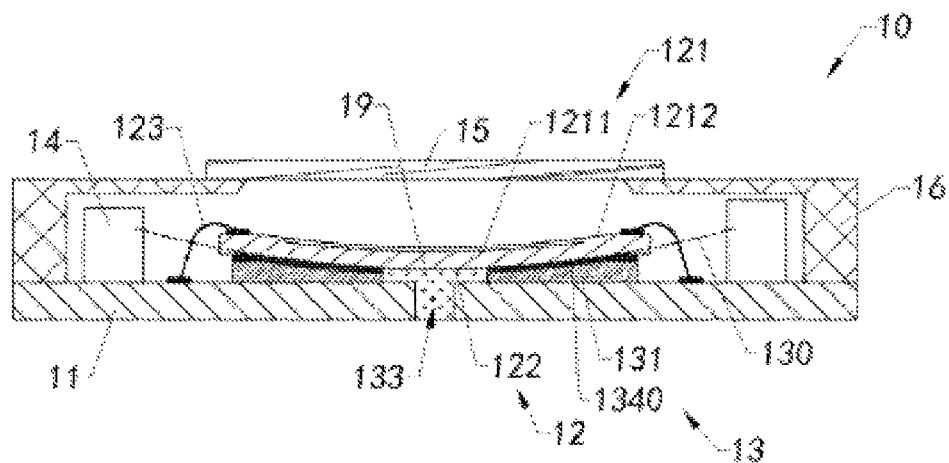
FIG. 38 illustrates a schematic view of still another modified implementation of the photosensitive assembly according to the embodiment of the present application.

It is also worth mentioning that, in other examples of the embodiments of the present application, the shaping member 13 may further include more or less shaping pieces. For example, in a further example of the present application, as shown in FIG. 37, the shaping member 13 further includes a third shaping piece 134 (including a third shaping piece body 134 and an adhesive 1340 applied to the top surface of the third shaping piece body 134), wherein the third shaping piece 134 is disposed between the first shaping piece 131 and the second shaping piece 132, so as to form the shaping surface 130 by the first shaping piece 131, the second shaping piece 132 and the third shaping piece 134. For another example, as shown in FIG. 38, in a further example of the present application, the shaping member 13 only includes the first shaping piece 131, wherein the upper surface of the first shaping piece 131 includes an arc-shaped surface recessed downward and inward, and the arc-shaped surface is configured so that when the photosensitive chip 12 is bent downward, a lower surface 122 that is adapted to the focal imaging plane of the photosensitive assembly 10 is formed.

Figure 39:
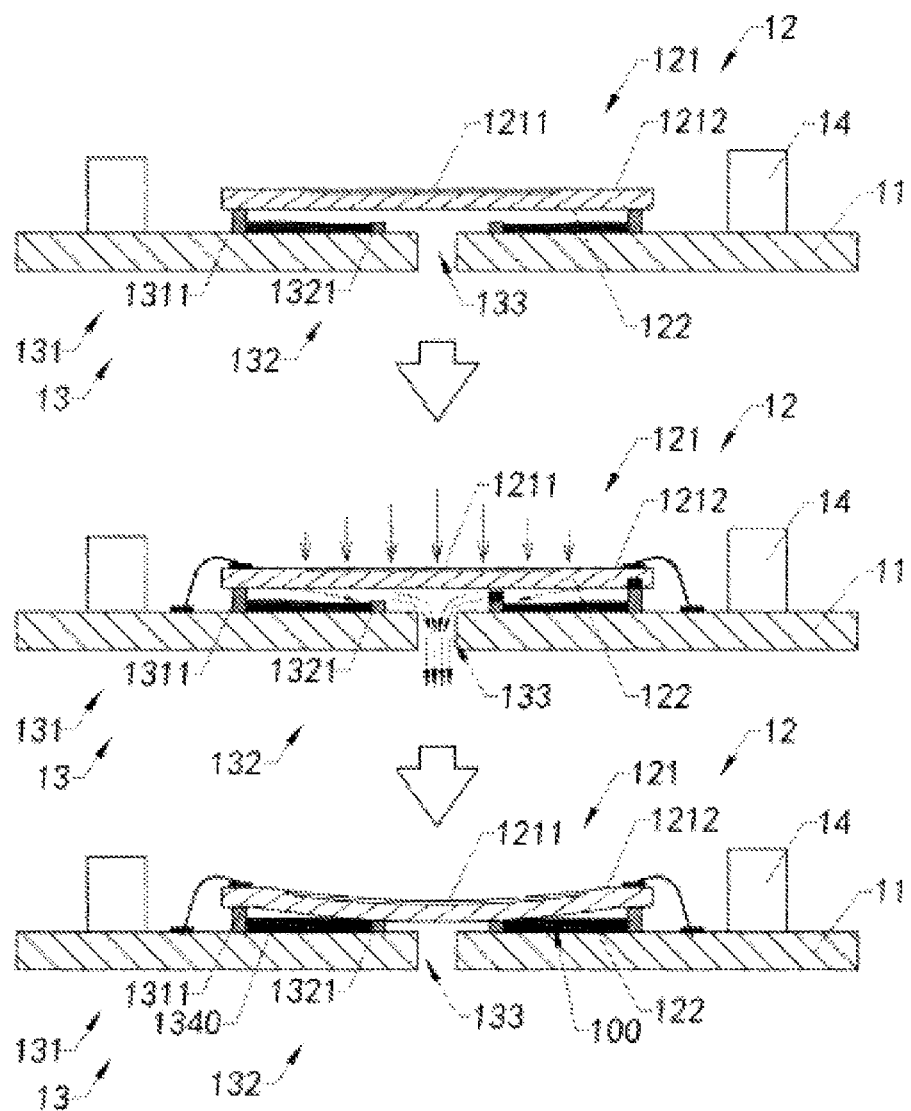
FIG. 39 illustrates a schematic view of still another modified implementation of the photosensitive assembly according to the embodiment of the present application.

FIG. 39 illustrates a schematic view of still another modified implementation of the photosensitive assembly according to the embodiment of the present application. As shown in FIG. 39, in this modified embodiment, the first shaping piece 131 and the second shaping piece 132 both have closed annular shapes, so that an accommodating cavity is formed between the first shaping piece 131 and the second shaping piece 132. In particular, in this modified embodiment, the shaping member 13 further includes an adhesive 1340 disposed between the first shaping piece 131 and the second shaping piece 132, wherein the height of the highest point on the upper surface of the adhesive 1340 is higher than that of the upper surface of the second shaping piece 132. It should be understood that, in this modified embodiment, the adhesive 1340 should have relatively high viscosity to prevent the adhesive 1340 from flowing out from the upper surface of the second shaping piece 132. In this way, after the photosensitive chip 12 is attached to the first shaping piece 131, the pressure difference generated by sucking and discharging the gas in the accommodating space 100 can force the photosensitive chip 12 to bend downward until it is bonded to the adhesive 1340 disposed between the first shaping piece 131 and the second shaping piece 132. It is worth mentioning that, in this modified embodiment, the adhesive 1340 may not be disposed on the upper surface of the second shaping piece 132. It is worth noting that since the height of the adhesive 1340 is higher than that of the second shaping piece 132, the adhesive 1340 may flow to the upper surface of the second shaping piece 132 during the suction, so that the photosensitive chip 12 is bonded to the second shaping piece 132 by the adhesive 1340 after being bent downward. Thus, the bonding is better and the reliability is improved. Further, the adhesive 1340 may not be higher than the second shaping piece 132. For example, the upper surface of the adhesive 1340 is flush with the upper surface of the second shaping piece 132.

In order to improve the heat dissipation performance of the photosensitive assembly, as shown in FIGS. 29 to 30B, in the embodiment of the present application, the photosensitive assembly 10 further includes a heat dissipation member 19 formed in the accommodating space 100, wherein the heat dissipation member 19 is attached to at least a part of the lower surface 122 of the photosensitive chip 12, so that the heat generated by the photosensitive chip 12 can be conducted to the outside by means of the heat dissipation member 19 in contact with the photosensitive chip 12.

Preferably, in the embodiment of the present application, the entire accommodating space 100 is fully filled with the heat dissipation member 19, so that the lower surface 122 of the photosensitive chip 12 is completely in contact with the heat dissipation member 19, so as to maximize the heat dissipation area and improve the heat dissipation performance. It is worth mentioning that the formation position and filling ratio of the heat dissipation member 19 in the accommodating space 100 depend on the shape of the second shaping piece 132 and the position setting of the at least one opening 133.

Figure 40:
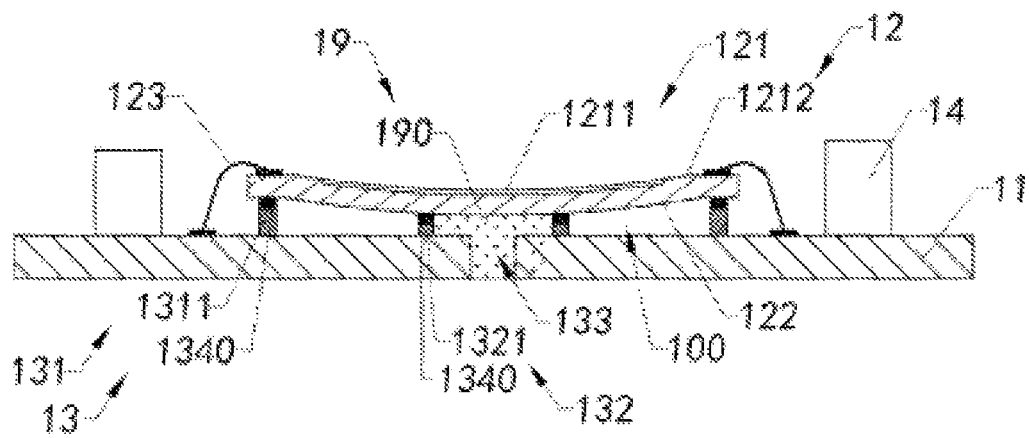
FIG. 40 illustrates a schematic view of still another modified implementation of the photosensitive assembly according to the embodiment of the present application.

Specifically, when the second shaping piece 132 is implemented as a closed ☐-like shape, and the position where the at least one opening 133 is formed in the circuit board 11 corresponds to the central area of the photosensitive chip 12, the heat dissipation member 19 can only occupy at most the cavity surrounded by the second shaping piece 132, the photosensitive chip 12 and the circuit board 11, as shown in FIG. 40. Of course, even if the second shaping piece 132 is implemented as a closed ⊔-like shape, the heat dissipation member 19 can occupy the entire accommodating space 100, and only the positions where a part of the openings 133 are formed in the circuit board 11 needs to be set to correspond to the central area of the photosensitive chip 12. At the same time, the positions where another part of the openings 133 are formed in the circuit board 11 are set to be located between the first shaping piece 131 and the second shaping pieces 132.

In a specific implementation, a heat dissipation material 190 used to make the heat dissipation member 19 can enter the accommodating space 100 through the opening 133 to form the heat dissipation member 19 in the accommodating space 100.

Figure 41:
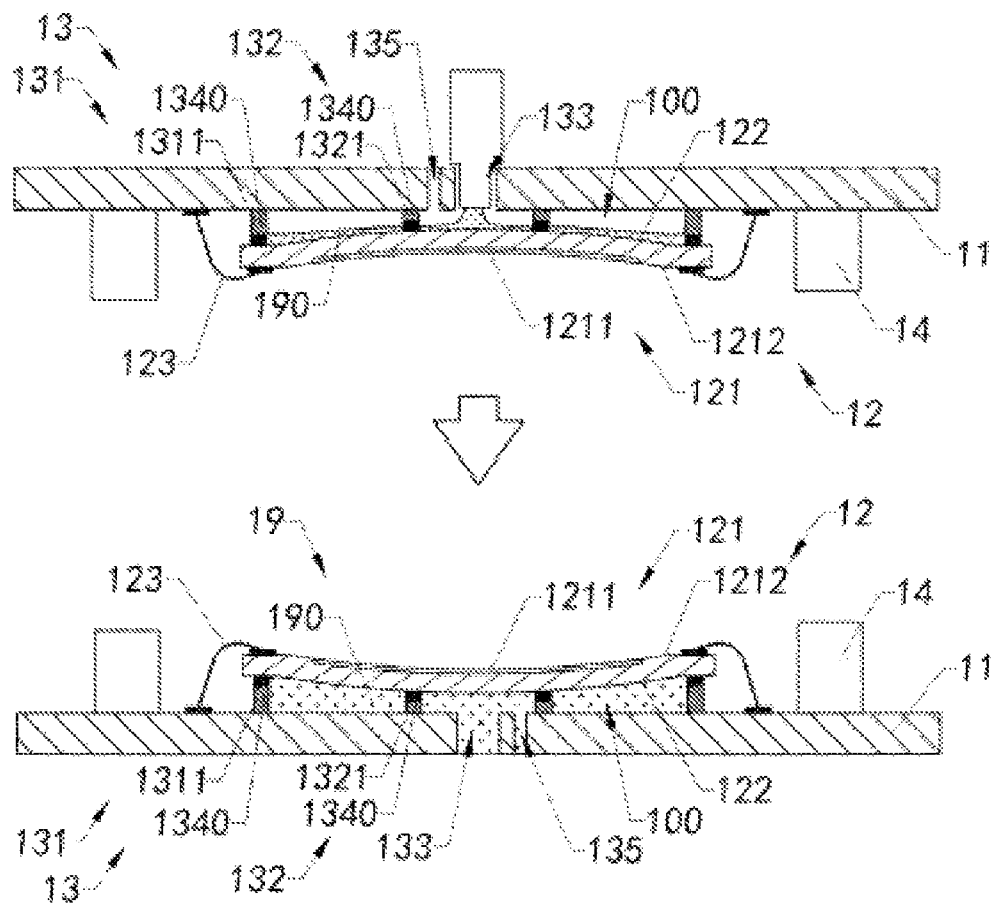
FIG. 41 illustrates a schematic view of still another modified implementation of the photosensitive assembly according to the embodiment of the present application.

For example, when the heat dissipation material 190 is implemented as a fluid-like heat dissipation material 190, the fluid-like heat dissipation material 190 may be injected into the accommodating space 100 through the opening 133, to form the heat dissipation member 19 after curing and molding. In order to facilitate the operation, when performing the injection process, the photosensitive assembly 10 may be turned upside down to prevent the fluid-like heat dissipation material 190 from flowing out of the opening 133. In particular, when the number of the openings 133 is only one, in order to balance the internal and external pressures so that the fluid-like heat dissipation material 190 can be smoothly injected into the accommodating space 100, a ventilation hole 135 may be further provided in the circuit board 11, as shown in FIG. 41. Of course, when the number of the openings 133 exceeds one, the air intake holes, except those being used for injecting the heat dissipation material 190, are functionally equivalent to the ventilation hole 135. That is, when the number of the openings 133 exceeds one, at least one of the openings forms the ventilation hole 135.

It is worth mentioning that when the heat dissipation member 19 is cured and formed by the fluid-like heat dissipation material 190, preferably, the entire accommodating space 100 can be fully filled with the heat dissipation material 190. Therefore, on the one hand, after curing and molding, the heat dissipation member 19 is attached to the entire lower surface 122 of the photosensitive chip 12 (a part corresponding to the accommodating space 100) to increase the heat dissipation area. On the other hand, the heat dissipation member 19 extends from the lower surface 122 of the photosensitive chip 12 to the opening 133, that is, the heat dissipation member 19 directly extends to the outside, so as to facilitate heat dissipation. Of course, in other examples of the embodiments of the present application, the photosensitive assembly 10 further includes a reinforcing plate 18 attached to the bottom surface of the circuit board 11. Preferably, the reinforcing plate 18 is made of a metal material with relatively high thermal conductivity. In this way, the heat dissipation performance of the photosensitive assembly 10 is further enhanced.

Figure 42:
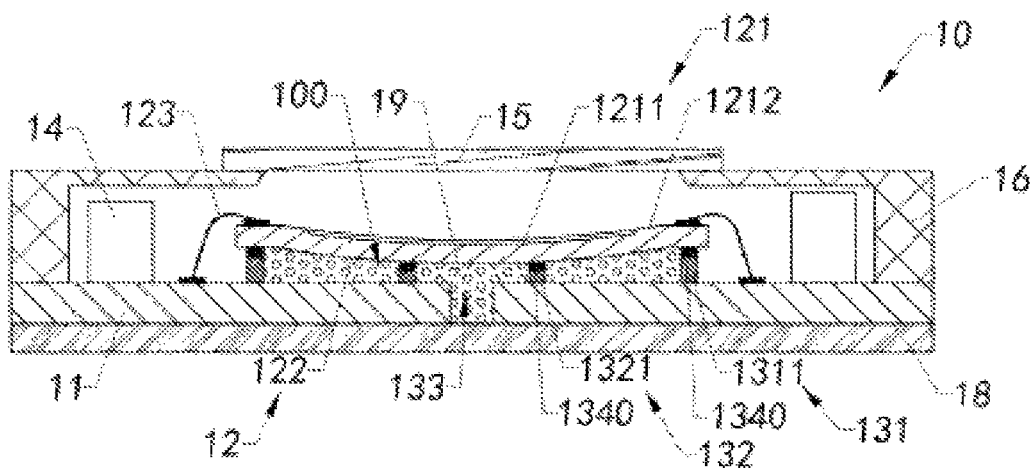
FIG. 42 illustrates a schematic view of still another modified implementation of the photosensitive assembly according to the embodiment of the present application.

Of course, in other examples of the embodiment of the present application, the heat dissipation material 190 may also be implemented in other forms, for example, a granular heat dissipation material 190, as shown in FIG. 42. Correspondingly, the granular heat dissipation material 190 may be filled into the accommodating space 100 to form the heat dissipation member 19. In order to prevent the granular heat dissipation material 190 from leaking out of the opening 133, in this example of the embodiment of the present application, the photosensitive assembly 10 further includes a reinforcing plate 18 for sealing the opening 133, and preferably, the reinforcing plate 18 is made of a metal material with relatively high thermal conductivity, so as to further enhance the heat dissipation performance of the photosensitive assembly 10 while sealing the opening 133.

Further, as shown in FIG. 29, in the embodiment of the present application, the photosensitive assembly 10 further includes at least one electronic component 14, leads for electrically connecting the photosensitive chip 12 to the circuit board 11, a filter element 15 and a bracket 16, wherein the at least one electronic component 14 is disposed on the circuit board 11 and located around the photosensitive chip 12, and includes but is not limited to a capacitor, a resistor, an inductor and the like.

After the photosensitive chip 12 is attached to the first shaping piece 131 and is bent and molded, the electrical connection between the photosensitive chip 12 and the circuit board 11 is realized through the leads 123. Specifically, each lead 123 extends between the photosensitive chip 12 and the circuit board 11 in a curved manner, so as to electrically connect the photosensitive chip 12 to the circuit board 11 through the leads 123. Therefore, the circuit board 11 can supply power to the photosensitive chip 12 through the leads 123, and the photosensitive chip 12 can transmit the collected signals through the leads 123.

It is worth mentioning that, in this specific example, the type of the lead 123 is not limited in the present application. For example, the lead 123 may be a gold wire, a silver wire, or a copper wire. Moreover, the lead 123 can be mounted between the circuit board 11 and the photosensitive chip 12 through a process of "wire bonding", so as to realize the electrical connection between the two.

Specifically, the "wire bonding" process is generally divided into two types: "forward wire bonding" process and "reverse wire bonding" process. The "forward wire bonding" process means that in the process of laying the lead 123, one end of the lead 123 is first formed on a conductive end of the circuit board 11, the lead 123 is then bent and extended, and finally the other end of the lead 123 is formed on the conductive end of the photosensitive chip 12. In this way, the lead 123 is formed between the photosensitive chip 12 and the circuit board 11. The "reverse wire bonding" process means that in the process of laying the lead 123, one end of the lead 123 is first formed on the conductive end of the photosensitive chip 12, the lead 123 is then bent and extended, and finally the other end of the lead 123 is formed on the conductive end of the circuit board 11. In this way, the lead 123 is formed between the photosensitive chip 12 and the circuit board 11. It is worth mentioning that the height of the upward protrusion of the lead 123 formed through the "reverse wire bonding" process is lower relative to the height of the upward protrusion of the lead 123 formed through the "forward wire bonding" process. Therefore, preferably, In this specific implementation, the lead 123 is formed using the "reversed wire bonding" process.

Of course, it should be known by those skilled in the art that, in other examples of the embodiment of the present application, the photosensitive chip 12 and the circuit board 11 may be connected in other ways (the lead 123 may not be used). For example, a back-connected technical solution is used. In this regard, it is not limited in the present application.

As shown in FIG. 29, in the embodiment of the present application, the bracket 16 is disposed on the circuit board 11 for supporting the filter element 15. Specifically, in the embodiment of the present application, the bracket 16 is implemented as a conventional plastic bracket 16, which is prefabricated and attached to the top surface of the circuit board 11, wherein the filter element 15 is mounted on the top of the bracket 16 corresponding to at least the photosensitive area 1211 of the photosensitive chip 12, and is used for filtering the light entering the photosensitive chip 12 to improve the imaging quality. That is to say, in the embodiment of the present application, the photosensitive assembly 10 is based on a conventional COB process.

It should be known by those skilled in the art that the filter element 15 can be implemented in different types, including but not limited to the following: the filter element 15 can be implemented as an infrared cut-off filter, a full transmission spectrum filter and other filters or a combination of multiple filters. Specifically, for example, when the filter element 15 is implemented as a combination of an infrared cut-off filter and a full transmission spectrum filter, that is, the infrared cut-off filter and the full transmission spectrum filter can be switched to be selectively located on the photosensitive path of the photosensitive chip 12. In this way, when used in an environment with sufficient light such as daytime, the infrared cut-off filter can be switched to the photosensitive path of the photosensitive chip 12 to filter infrared rays in the light reflected by an object entering the photosensitive chip 12 through the infrared cut-off filter, and when used in an environment with less light such as night, the full transmission spectrum filter can be switched to the photosensitive path of the photosensitive chip 12 to allow the infrared part in the light reflected by the object entering the photosensitive chip 12 to transmit therethrough.

Figure 43:
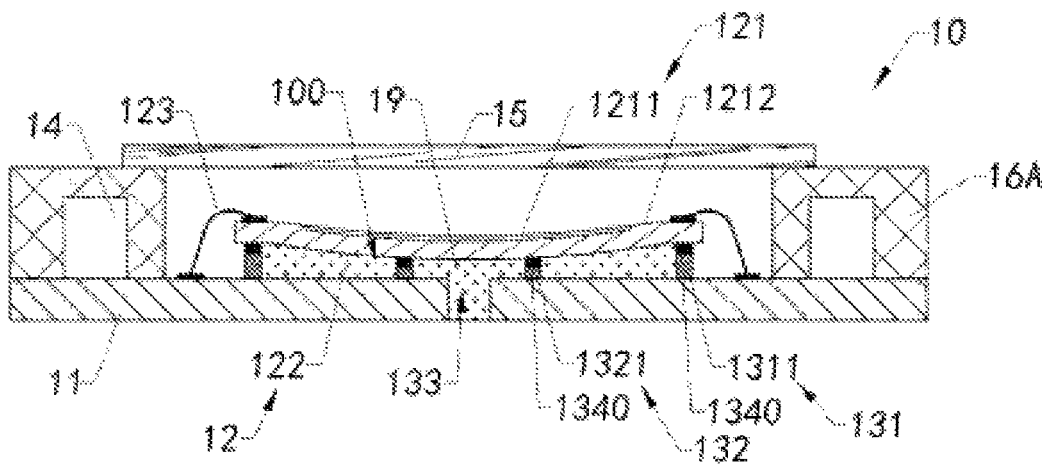
FIG. 43 illustrates a schematic view of still another modified implementation of the photosensitive assembly according to the embodiment of the present application.

FIG. 43 illustrates a schematic view of still another modified implementation of the photosensitive assembly according to the embodiment of the present application. As shown in FIG. 43, in this modified implementation, the photosensitive assembly 10 is fabricated based on a Molding on Board (MOB) process. Specifically, in this modified embodiment, the bracket 16 is implemented as a molded bracket 16A, which is integrally molded on the circuit board 11 through a molding process, so as to integrally cover at least a part of the circuit board 11 and at least part of the electronic components 14.

In a specific fabrication process, the circuit board 11 may be placed in a lower mold, and then an upper mold matched with the lower mold is provided to form a molding cavity between the upper and lower molds after the two molds are clamped, wherein the upper mold includes a pressing block that is pressed against the circuit board 11 when the molds are clamped. Further, the molding material is injected into the molding cavity, and after curing, molding, and drafting, the molded bracket 16A integrally covering at least a part of the circuit board 11 and at least a part of the electronic components 14 is obtained.

It is worth mentioning that the shape of the inner side surface of the molded bracket 16A is determined by the shape of the pressing block. For example, when the side surface of the pressing block is perpendicular to the circuit board 11, the inner side surface of the molded bracket 16A is perpendicular to the upper surface 121 of the photosensitive chip 12. For another example, when the inner side surface of the pressing block is inclined to the circuit board 11, the inner side surface of the molded bracket 16A extends obliquely outward.

It is worth mentioning that when the photosensitive assembly 10 is made based on the MOB process, preferably, the first shaping piece 131 and the second shaping piece 132 are mounted at preset positions of the circuit board 11 after the molded bracket 16 is integrally molded at a preset position of the circuit board 11. Such a manufacturing sequence is advantageous to engineering implementation.

Figure 44:
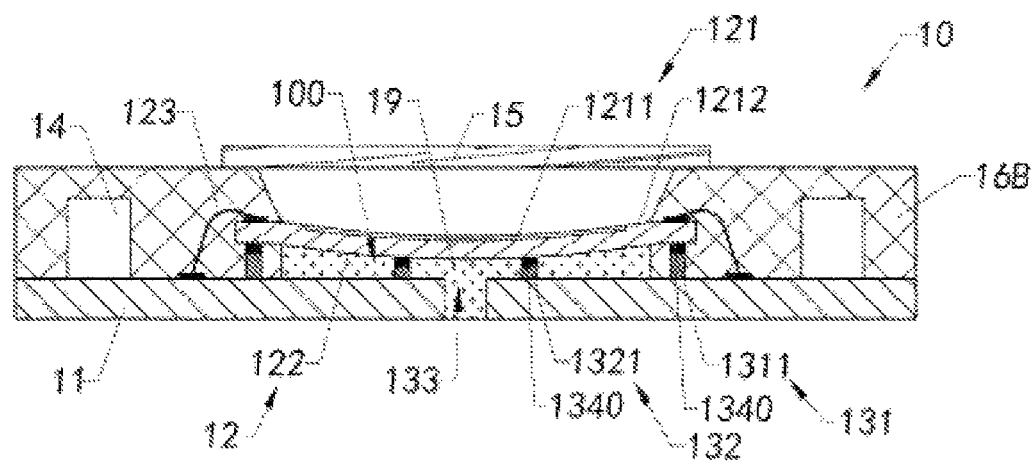
FIG. 44 illustrates a schematic view of still another modified implementation of the photosensitive assembly according to the embodiment of the present application.

FIG. 44 illustrates a schematic view of still another modified implementation of the photosensitive assembly according to the embodiment of the present application. As shown in FIG. 44, in this modified implementation, the photosensitive assembly 10 is fabricated based on the Molding on Chip (MOC) process. Specifically, in this modified embodiment, the bracket 16 is implemented as a molded bracket 16B, which is integrally molded on the circuit board 11 through a molding process to integrally cover at least a part of the circuit board 11, the at least one electronic component 14 and at least a part of the non-photosensitive area 1212 of the photosensitive chip 12.

In a specific fabrication process, after the photosensitive chip 12 is attached to the first shaping piece 131 and is bent and formed to be attached to the second shaping piece 132 (for the convenience of description, this state is called semi-finished assembly), the semi-finished assembly is placed in a lower mold, and an upper mold matched with the lower mold is provided to form a molding cavity between the upper and lower molds after the two molds are clamped. The upper mold includes a pressing block, wherein the pressing block is pressed against the non-photosensitive area 1212 of the photosensitive chip 12 when the molds are clamped. Further, the molding material is injected into the molding cavity, and after curing, molding and drafting, the molded bracket 16B integrally covering at least a part of the circuit board 11, the at least one electronic component 14, and at least a part of the non-photosensitive area 1212 of the photosensitive chip 12 is obtained, wherein the area occupied by the pressing block correspondingly forms the light-passing hole for the photosensitive chip 12.

Figure 45:
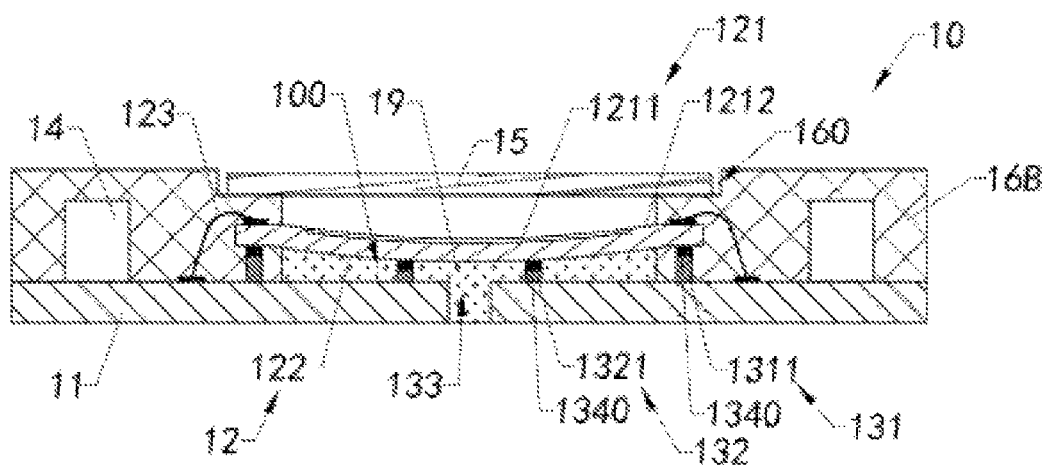
FIG. 45 illustrates a schematic view of still another modified implementation of the photosensitive assembly according to the embodiment of the present application.

It is worth mentioning that the shape of the inner side surface of the molded bracket 16B is determined by the shape of the pressing block. For example, when the side surface of the pressing block is perpendicular to the circuit board 121, the inner side surface of the molded bracket 16B is perpendicular to the upper surface 121 of the photosensitive chip 12. For another example, when the inner side surface of the pressing block is inclined to the upper surface 121 of the photosensitive chip 12, the inner side surface of the molded bracket 16B extends obliquely outward. In particular, when the inner side surface of the pressing block has a stepped shape, the inner side surface of the molded bracket 16 also has a stepped shape, so as to form a mounting platform 160 for mounting the filter element 15 on the top surface of the molded bracket 16B. For the convenience of description, this technical solution is defined as an IOM (IR Filter on Molding) solution in the present application, as shown in FIG. 45.

It is worth mentioning that when the photosensitive assembly 10 is made based on the MOC process, the first shaping piece 131 and the second shaping piece 132 of the shaping assembly are mounted or integrally molded at the preset positions of the circuit board 11 in advance before the molded bracket 16 is integrally molded at preset positions of the circuit board 11 and the photosensitive chip 12. Such a manufacturing sequence is advantageous to engineering implementation.

Figure 46:
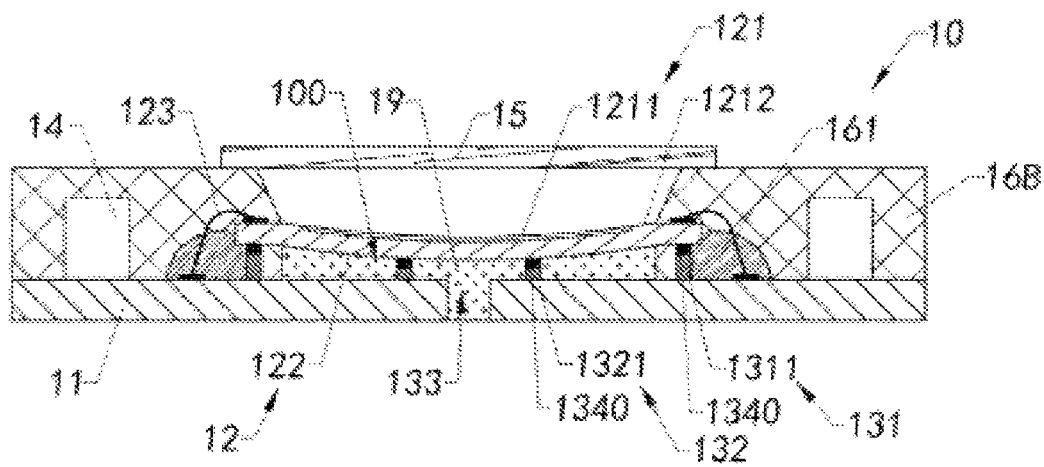
FIG. 46 illustrates a schematic view of still another modified implementation of the photosensitive assembly according to the embodiment of the present application.

It is worth mentioning that, in order to prevent the positional deviation caused by the photosensitive chip 12 being impacted by the injected molding material during the execution of the MOC process, in some examples of this modified embodiment of the present application, the photosensitive assembly 10 further includes a side encapsulation 161 that encloses side parts of the photosensitive chip 12 and the first shaping piece 131. The side encapsulation 161 is used to prevent the position of the photosensitive chip 12 from shifting during the execution of the molding process, as shown in FIG. 46. It should be understood that the side encapsulation 161 can not only prevent the position of the photosensitive chip 12 from shifting, but also effectively reduce the stress generated by the the molded bracket 16B from being transmitted to the photosensitive chip 12.

Figure 47:
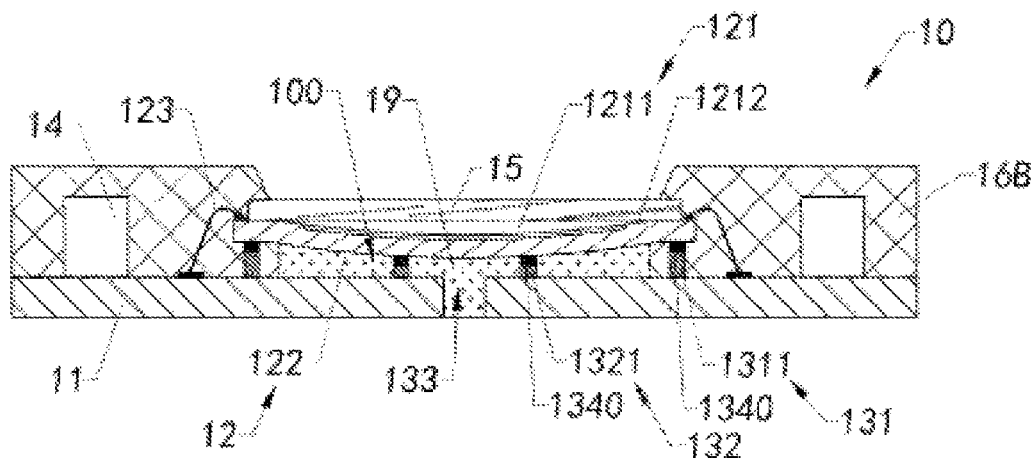
FIG. 47 illustrates a schematic view of still another modified implementation of the photosensitive assembly according to the embodiment of the present application.

FIG. 47 illustrates a schematic view of still another modified implementation of the photosensitive assembly according to the embodiment of the present application. As shown in FIG. 47, in this modified implementation, the filter element 15 is stacked above the photosensitive chip 12, and the bracket 16 is implemented as a molded bracket 16C, which is integrally molded through a molding process to cover at least a part of the circuit board 11, the at least one electronic component 14, at least a part of the non-photosensitive area 1212 of the photosensitive chip 12 and at least a part of the filter element 15.

In a specific manufacturing process, after the photosensitive chip 12 is attached to the first shaping piece 131 and is bent and formed to be attached to the second shaping piece 132, the filter element 15 is stacked above the photosensitive chip 12 to form a semi-finished assembly. Further, the semi-finished assembly is placed in a lower mold, and an upper mold matched with the lower mold is provided to form a molding cavity between the upper and lower molds after the two molds are clamped. The upper mold includes a pressing block, wherein the pressing block is pressed against the filter element 15 when the molds are clamped. Further, the molding material is injected into the molding cavity, and after curing, molding and drafting, the molded bracket 16C integrally covering at least a part of the circuit board 11, the at least one electronic component 14, and at least a part of the non-photosensitive area 1212 of the photosensitive chip 12 is obtained, wherein the area occupied by the pressing block correspondingly forms the light-passing hole for the photosensitive chip 12.

It is worth mentioning that the shape of the inner side surface of the molded bracket 16C is determined by the shape of the pressing block. For example, when the side surface of the pressing block is perpendicular to the filter element 15, the inner side surface of the molded bracket 16C is perpendicular to the filter element 15. For another example, when the inner side surface of the pressing block is inclined to the filter element 15, the inner side surface of the molded bracket 16C extends obliquely outward. For the convenience of description, this technical solution is defined as an IOC (IR Filter on Chip) solution in the present application.

It is worth mentioning that, in the embodiment of the present application, in addition to the filter element 15 being supported on the bracket 16 (including the plastic bracket 16, and the molded brackets 16A, 16B, 16C) and the photosensitive chip 12, the filter element 15 may also be mounted in other ways, as long as the filter element 15 is held in the photosensitive path of the photosensitive assembly 10. For example, in other examples of the embodiments of the present application, the photosensitive assembly 10 further includes a filter element holder 17, and the filter element holder 17 is mounted on the bracket 16, and is used for mounting the filter element 15. For another example, when the photosensitive assembly 10 cooperates with the optical lens 20 to form a camera module, the filter element 15 may also be supported in the optical lens 20, or may be formed on the surface of the lens element in the optical lens 20 in the form of coating. In this regard, it is not limited in the present application.

In summary, the photosensitive assembly based on the embodiment of the present application is explained, wherein the flat photosensitive chip is bent into a shape adapted to the actual focal imaging plane through a special manufacturing process, so as to improve the imaging quality of the camera module.

The manufacturing process for the photosensitive assembly 10 will be described below from the perspective of the manufacturing steps.

As shown in FIGS. 30A and 30B, the manufacturing process for the photosensitive assembly 10 based on the embodiment of the present application is explained, which is used for fabricating the photosensitive assembly as described above and its modified implementation.

Specifically, the method for manufacturing the photosensitive assembly 10 according to the embodiment of the present application includes the following steps:

First, a circuit board 11, a photosensitive chip 12, a first shaping piece 131 and a second shaping piece 132 are provided, wherein the circuit board 11 includes at least one opening 133.

Next, the first shaping piece 131 and the second shaping piece 132 are fixed at preset positions of the circuit board 11.

Then, the photosensitive chip 12 is attached to the first shaping piece 131 to define an accommodating space 100 between the first shaping piece 131, the circuit board 11 and the photosensitive chip 12, wherein the opening 133 formed in the circuit board 11 is communicated with the accommodating space 100, wherein the second shaping piece 132 is located in the accommodating space 100, and the height of the second shaping piece 132 is lower than that of the first shaping piece 131, and wherein the upper surface of at least one of the first shaping piece and the second shaping piece includes an arc-shaped surface recessed downward and inward.

Then, the gas in the accommodating space 100 is sucked out through the opening 133 to generate a pressure difference between the upper surface 121 and the lower surface of the photosensitive chip 12, thereby forcing the photosensitive chip 12 to bend downward until it is attached to the second shaping piece 132, so that the lower surface 122 of the photosensitive chip 12 is attached to the shaping surface 130 defined and formed by the first shaping piece 131 and the second shaping piece 132 in an adapted manner.

It is worth mentioning that the openings 133 in the circuit board 11 may also be formed through a perforation process after the accommodating space 100 is formed. In this regard, it is not limited in the present application.

Preferably, in the embodiment of the present application, the first shaping piece 131 should have a closed shape (for example, it is implemented to have a ⊔-like shape), the second shaping pieces 132 are symmetrically arranged with respect to the center of the photosensitive chip 12, and the position where the opening 133 is formed in the circuit board 11 corresponds to the central area of the photosensitive chip 12. Alternatively, the positions where the openings 133 are formed in the circuit board 11 are located between the first shaping piece 131 and the second shaping piece 132, and the positions where the openings 133 are formed in the circuit board 11 are arranged symmetrically with respect to the center of the photosensitive chip 12.

It is worth mentioning that the height setting of the second shaping piece 132 is related to the relative positional relationship between the second shaping piece 132 and the first shaping piece 131. Specifically, the shape of the shaping surface 130 defined by the first shaping piece 131 and the second shaping piece 132 for defining the curved shape of the photosensitive chip 12 is set based on the shape of the actual focal plane. More specifically, when the second shaping piece 132 is close to the first shaping piece 131, the height difference between the first shaping piece 131 and the second shaping piece 132 should be reduced (that is, the height of the second shaping piece 132 should be increased); and when the second shaping piece 132 is away from the first shaping piece 131, the height difference between the first shaping piece 131 and the second shaping piece 132 should be increased (that is, the height of the second shaping piece 132 should be reduced). It is worth mentioning that, in the embodiment of the present application, the shape of the shaping surface 130 matches the shape of the actual focal plane, which does not mean that the shape of the shaping surface 130 is completely consistent with or completely coincides with the shape of the actual focal plane, and simply means that the shape of the shaping surface 130 tends to be consistent with the shape of the actual focal plane.

In particular, in the embodiment of the present application, an upper surface of at least one of the first shaping piece 131 and the second shaping piece 132 includes an arc-shaped surface recessed downward and inward, and the arc-shaped surface is configured so that when the photosensitive chip 12 is bent downward, a lower surface 122 adapted to the focal imaging plane of the photosensitive assembly 10 is formed, so as to form a downward curved shaping surface 130 through the upper surfaces of the first shaping piece 131 and the second shaping piece 132. Preferably, in the embodiment of the present application, the upper surfaces of the first the first shaping piece 131 and the second shaping piece 132 both include arc-shaped surfaces recessed downward and inward.

Correspondingly, the process of bending the photosensitive chip 12 includes:

bending the photosensitive chip 12 until the lower surface 122 of the photosensitive chip 12 is attached to the arc-shaped surface, so that when the photosensitive chip 12 is bent downward, a lower surface adapted to a focal imaging plane of the photosensitive assembly 10 is formed.

As shown in FIG. 30B, the manufacturing method further includes the following step:

forming a heat dissipation member 19 in the accommodating space 100 defined by the first shaping piece 131, the photosensitive chip 12 and the circuit board 11, wherein the heat dissipation member 19 is attached to at least a part of the lower surface 122 of the photosensitive chip 12.

Preferably, in the embodiment of the present application, the entire accommodating space 100 is fully filled with the heat dissipation member 19, so that the lower surface 122 (a part corresponding to the accommodating space 100) of the photosensitive chip 12 is completely in contact with the heat dissipation member 19, so as to maximize the heat dissipation area and improve the heat dissipation performance.

In a specific implementation, when the heat dissipation material 190 is implemented as a fluid-like heat dissipation material 190, the process of forming the heat dissipation member 19 in the accommodating space 100 includes: injecting the fluid-like heat dissipation material 190 into the accommodating space 100 through the opening 133 to form the heat dissipation member 19 after curing and molding.

In order to facilitate the operation, when performing the injection process, the photosensitive assembly 10 may be turned upside down to prevent the fluid-like heat dissipation material 190 from flowing out of the opening 133. In particular, when the number of the openings 133 is only one, in order to balance the internal and external pressures so that the fluid-like heat dissipation material 190 can be smoothly injected into the accommodating space 100, a ventilation hole 135 may be further provided in the circuit board 11. Of course, when the number of the openings 133 exceeds one, the air intake holes, except those being used for injecting the heat dissipation material 190, are functionally equivalent to the ventilation hole 135. That is to say, when the number of the openings 133 exceeds one, at least one of the openings forms the ventilation hole 135.

After the heat dissipation member 19 is molded, a reinforcing plate 18 may be further attached to the bottom surface of the circuit board 11, wherein preferably, the reinforcing plate 18 is made of a metal material with relatively high thermal conductivity. In this way, the heat dissipation performance of the photosensitive assembly 10 is further enhanced.

In a specific implementation, the heat dissipation material 190 is implemented in a granular heat dissipation material 190. The process of forming the heat dissipation member 19 in the accommodating space 100 includes: injecting the fluid-like heat dissipation material 190 into the accommodating space 100 through the opening 133; and attaching a reinforcing plate 18 to the bottom surface of the circuit board 11 to seal the opening 133 through the reinforcing plate 18. Preferably, the reinforcing plate 18 is made of a metal material with relatively high thermal conductivity, so as to further enhance the heat dissipation performance of the photosensitive assembly 10 while sealing the opening 133.

Further, the manufacturing process for the photosensitive assembly 10 further includes: disposing the bracket 16 on the circuit board 11, and mounting a filter element 15 on the bracket 16.

Specifically, in the COB process, the bracket 16 is implemented as a conventional plastic bracket 16. Correspondingly, the process of disposing the bracket 16 on the circuit board 11 is embodied in the following step: attaching and mounting the plastic bracket 16 to the circuit board 11. Further, the filter element 15 is attached and mounted to the bracket 16.

In the MOB process, the bracket 16 is implemented as a molded bracket 16A. Correspondingly, the process of disposing the bracket 16 on the circuit board 11 includes: integrally molding the molded bracket 16A on the circuit board 11 through a molding process, wherein the molded bracket 16A covers at least a part of the circuit board 11 and at least a part of the at least one electronic component 14. Further, the filter element 15 is attached and mounted to the molded bracket 16A.

It is worth mentioning that, in the MOB process, the first shaping piece 131 and the second shaping piece 132 are mounted at preset positions of the circuit board 11 after the molded bracket 16 is integrally molded at a preset position of the circuit board 11. Such a manufacturing sequence is advantageous to engineering implementation.

In the MOC process, the bracket 16 is implemented as a molded bracket 16B. Correspondingly, the process of disposing the bracket 16 on the circuit board 11 includes: integrally forming the molded bracket 16B on the circuit board 11 through a molding process, wherein the molded bracket 16B covers at least a part of the circuit board 11, the at least one electronic component 14, and at least a part of the non-photosensitive area 1212 of the photosensitive chip 12. Further, the filter element 15 is attached and mounted to the molded bracket 16B.

In order to prevent the positional deviation caused by the photosensitive chip 12 being impacted by the injected molding material during the execution of the MOC process, before performing the MOC process to form the molded bracket 16B, the process further includes applying a side encapsulation 161 on the side parts of the photosensitive chip 12 and the first shaping piece 131, so that the side encapsulation 161 encloses the side parts of the photosensitive chip 12 and the first shaping piece 131. In this way, the position of the photosensitive chip 12 is prevented from being shifted during the molding process.

In the IOC process, the bracket 16 is implemented as a molded bracket 16C. Correspondingly, the process of disposing the bracket 16 on the circuit board 11 includes: stacking the filter element 15 on the photosensitive chip 12, and integrally molding the molded bracket 16C on the circuit board 11, wherein the molded bracket 16C integrally covers at least a part of the circuit board 11, the at least one electronic component 14, at least a part of a non-photosensitive area 1212 of the photosensitive chip 12, and at least a part of the filter element 15.

It is worth mentioning that in the MOB, MOC and IOC processes, the shape of the inner side surface of the molded bracket 16 is determined by the shape of the pressing block. In particular, when the inner side surface of the pressing block has a stepped shape, the inner side surface of the molded bracket 16 also has a stepped shape, so as to form a mounting platform 160 for mounting the filter element 15 on a top surface of the molded bracket 16. Correspondingly, in these examples, the filter element 15 is mounted on the mounting platform 160.

It is also worth mentioning that, in the embodiment of the present application, in addition to the filter element 15 being supported on the bracket 16 (including the plastic bracket 16, and the molded brackets 16A, 16B, 16C) and the photosensitive chip 12, the filter element 15 may also be mounted in other ways, as long as the filter element 15 is held in the photosensitive path of the photosensitive assembly 10. For example, in other examples of the embodiments of the present application, the photosensitive assembly 10 further includes a filter element holder 17, and the filter element holder 17 is mounted on the bracket 16, and is used for mounting the filter element 15. For another example, when the photosensitive assembly 10 cooperates with the optical lens 20 to form a camera module, the filter element 15 may also be supported in the optical lens 20, or may be formed on the surface of the lens element in the optical lens 20 in the form of coating. In this regard, it is not limited in the present application.

Figure 48A:
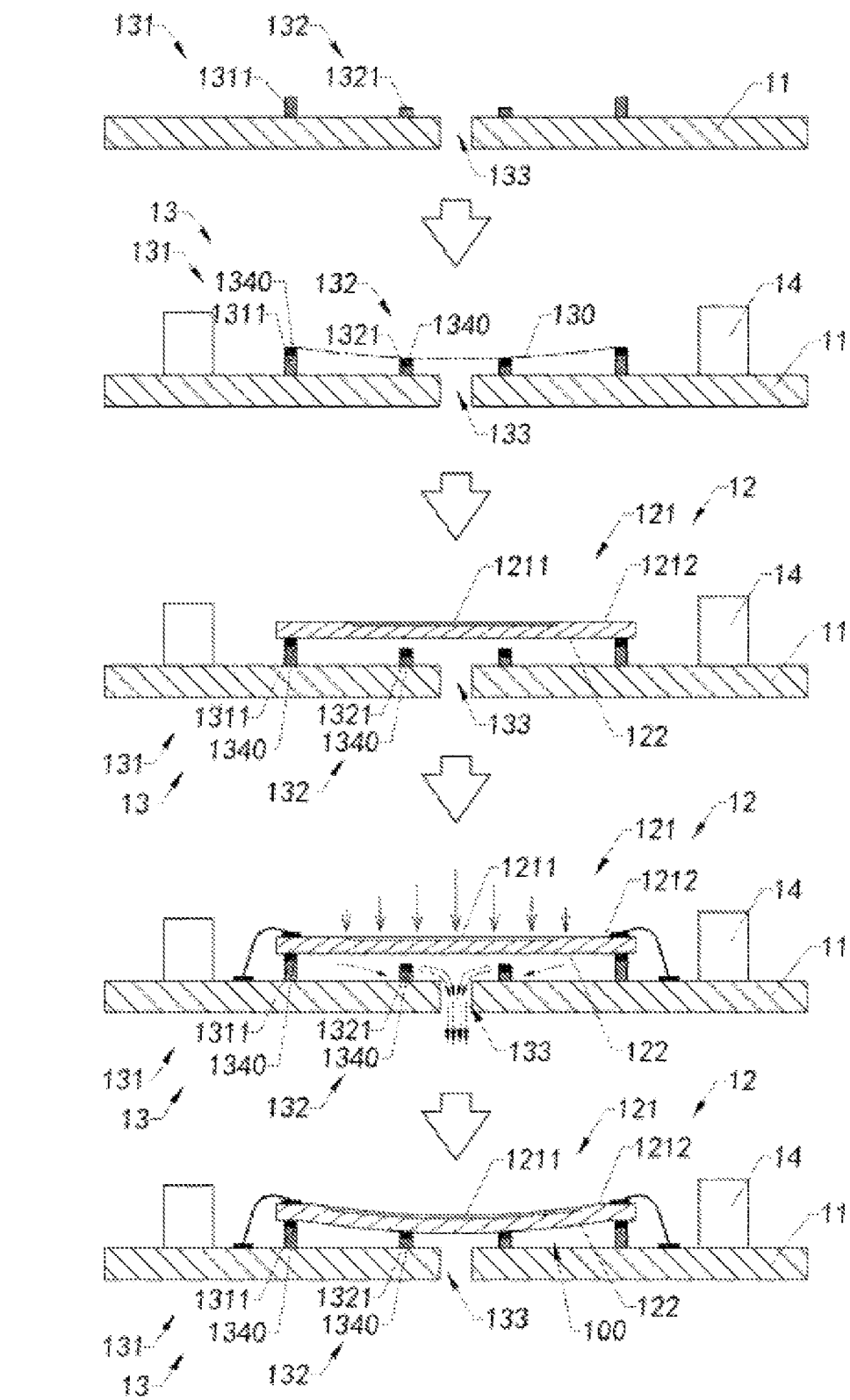
FIGS. 48A and 48B illustrate schematic views of another manufacturing process for the photosensitive assembly according to an embodiment of the present application.
Figure 48B:
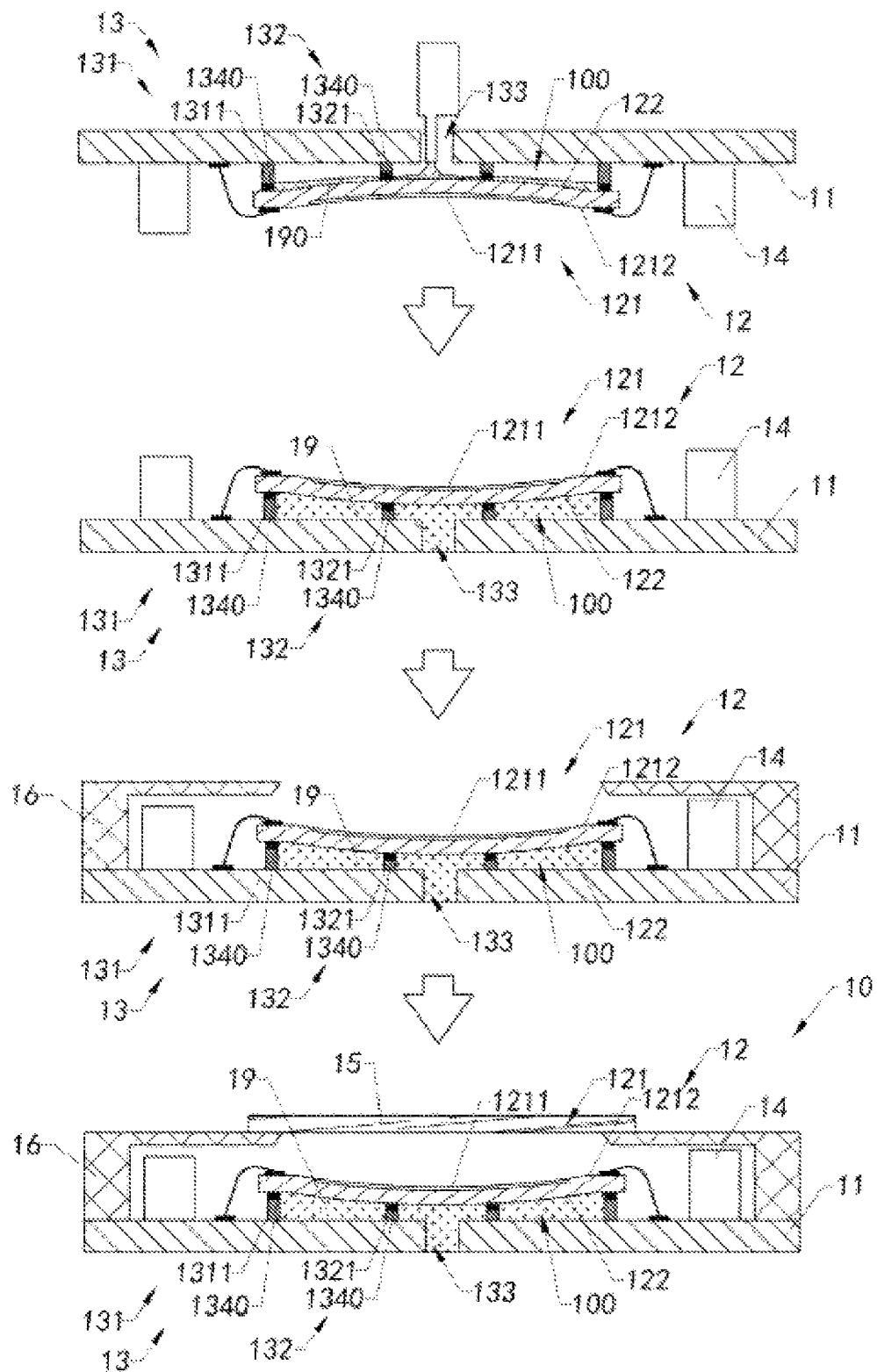
Figure 49:
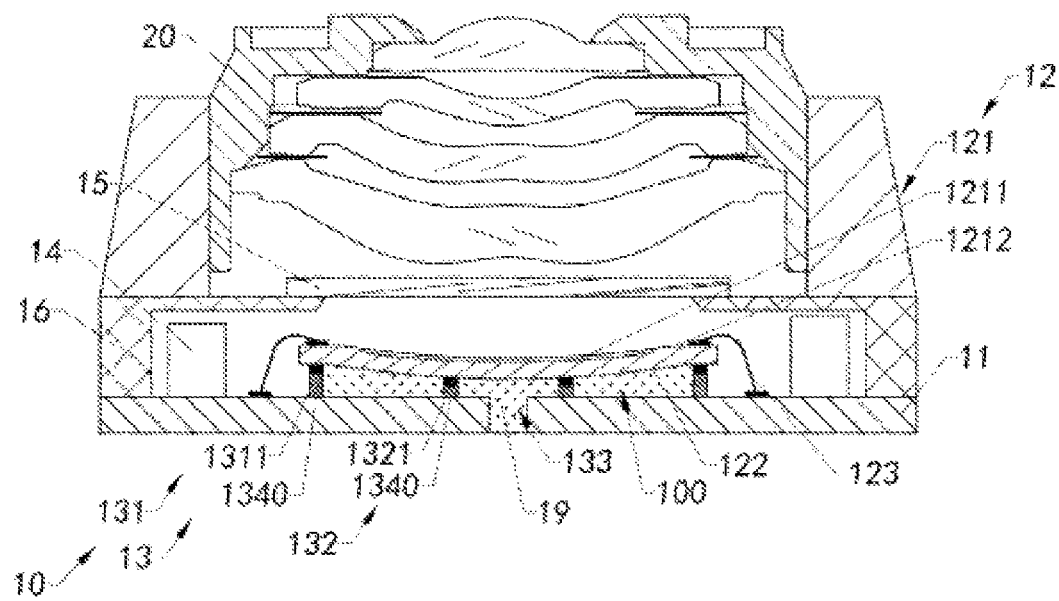
FIG. 49 illustrates a schematic view of a camera module according to an embodiment of the present application, wherein the camera module is a fixed-focus camera module.
Figure 50:
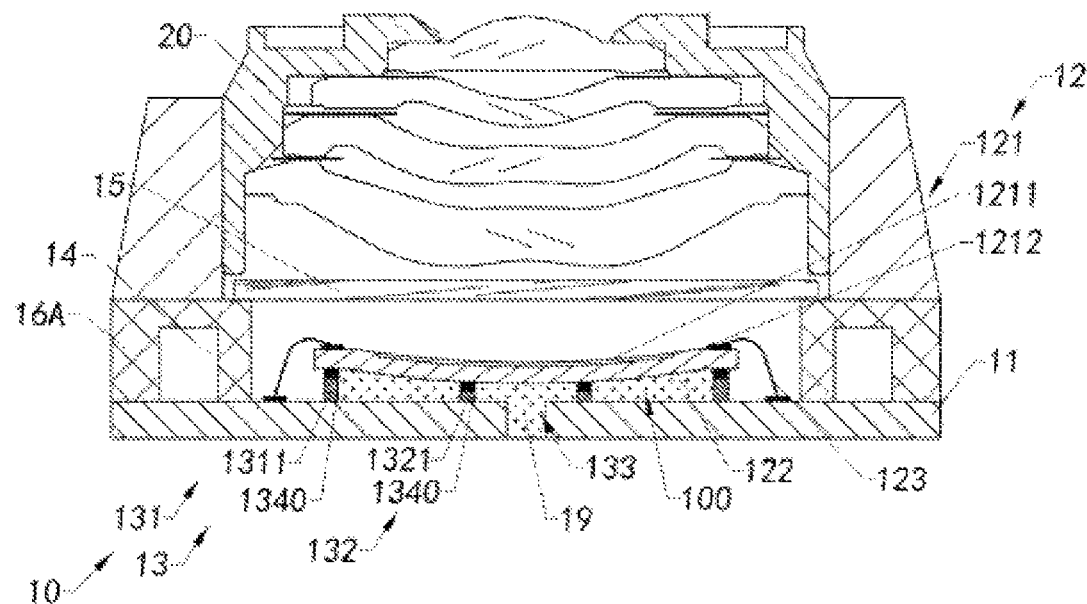
FIG. 50 illustrates a schematic view of another modified implementation of the camera module according to the embodiment of the present application.
Figure 51:
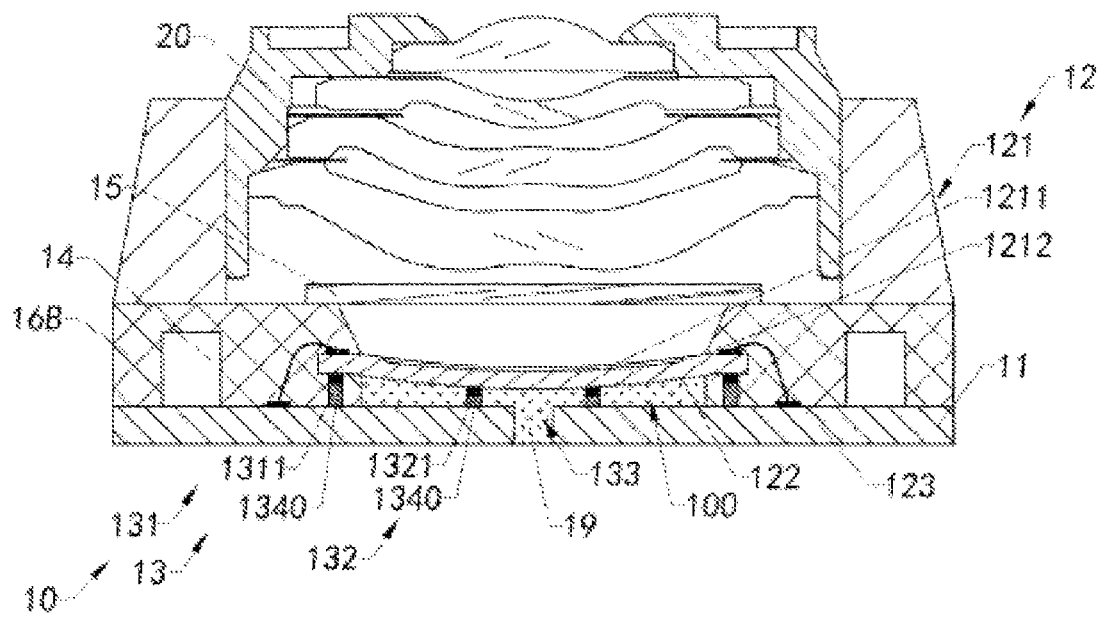
FIG. 51 illustrates a schematic view of still another modified implementation of the camera module according to the embodiment of the present application.
Figure 52:
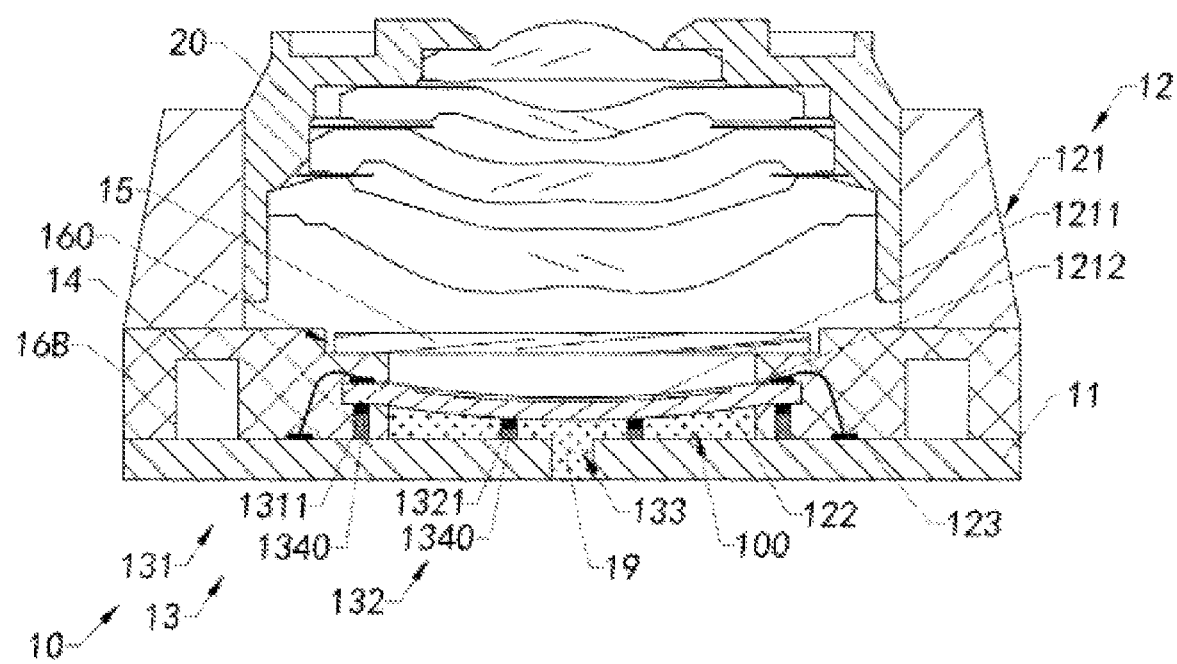
FIG. 52 illustrates a schematic view of still another modified implementation of the camera module according to the embodiment of the present application.
Figure 53:
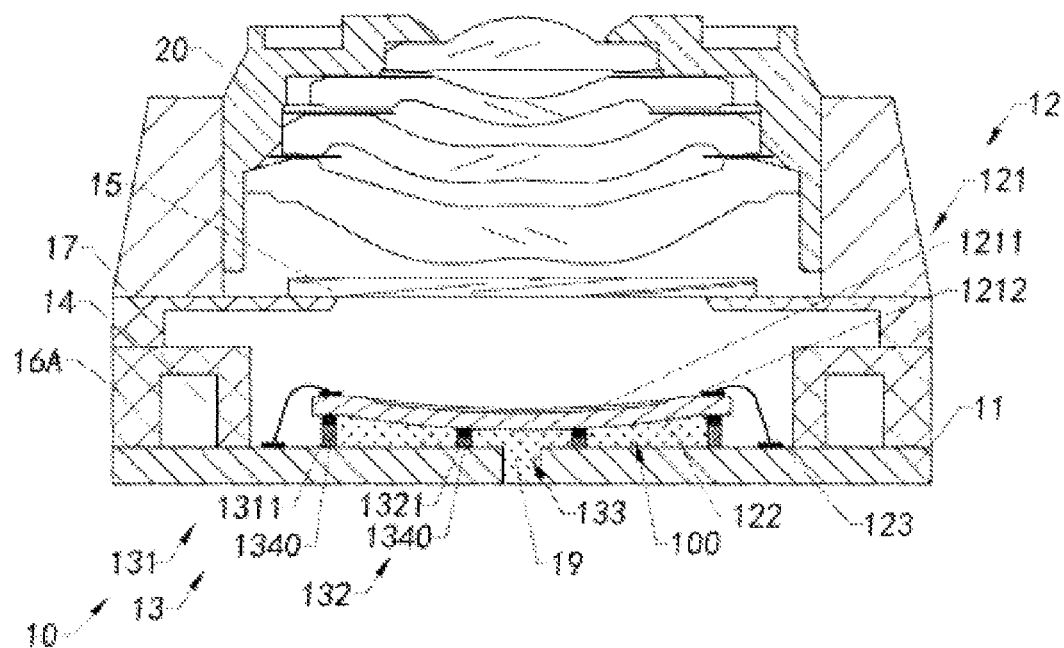
FIG. 53 illustrates a schematic view of still another modified implementation of the camera module according to the embodiment of the present application.

As shown in FIGS. 48A and 48B, a second manufacturing process for the photosensitive assembly based on the embodiment of the present application is explained, which is used for fabricating the photosensitive assembly as described above and its modified implementation.

Specifically, as shown in FIG. 48A, the manufacturing process for the photosensitive assembly 10 according to the embodiment of the present application includes the following steps:

First of all, a circuit board 11 and a photosensitive chip 12 are provided, wherein the circuit board 11 comprises at least one opening 133. It is worth mentioning that the openings 133 in the circuit board 11 may also be formed through a perforation process after the accommodating space 100 is formed. In this regard, it is not limited in the present application.

Next, a first shaping piece 131 and a second shaping piece 132 are integrally molded on the circuit board 11, wherein the height of the second shaping piece 132 is lower than that of the first shaping piece 131. In this way, the first shaping piece and the second shaping piece 132 define a recessed shaping surface 130.

Then, the photosensitive chip 12 is attached to the first shaping piece 131 to define an accommodating space 100 between the first shaping piece 131, the circuit board 11 and the photosensitive chip 12 in this way, wherein the opening 133 is communicated with the accommodating space 100.

Then, the gas in the accommodating space 100 is sucked out through the opening 133 to generate a pressure difference between the upper surface 121 and the lower surface of the photosensitive chip 12, thereby forcing the photosensitive chip 12 to bend downward until it is attached to the second shaping piece 132, so that the lower surface 122 of the photosensitive chip 12 is attached to the shaping surface 130 defined and formed by the first shaping piece 131 and the second shaping piece 132 in an adapted manner.

That is to say, compared with the first fabrication process, in the second fabrication process, the first shaping piece 131 and the second shaping piece 132 are integrally molded on the circuit board 11 instead of being prefabricated and then mounted.

Specifically, in the embodiment of the present application, the process of integrally molding a first shaping piece 131 and a second shaping piece 132 on the circuit board 11 includes:

integrally molding a first shaping piece body 1311 and a second shaping piece body 1321 on the circuit board 11 through an electroplating molded process; and applying an adhesive 1340 on the first shaping piece body 1311 and the second shaping piece body 1321 separately to form the first shaping piece 131 by the first shaping piece body 1311 and the adhesive 1340, and form the second shaping piece 132 by the second shaping piece body 1321 and the adhesive 1340.

Preferably, in the embodiment of the present application, the first shaping piece 131 should have a closed shape (for example, it is implemented to have a ⊓-like shape), the second shaping pieces 132 are symmetrically arranged with respect to the center of the photosensitive chip 12, and the position where the opening 133 is formed in the circuit board 11 corresponds to the central area of the photosensitive chip 12. Alternatively, the positions where the openings 133 are formed in the circuit board 11 are located between the first shaping piece 131 and the second shaping piece 132, and the positions where the openings 133 are formed in the circuit board 11 are arranged symmetrically with respect to the center of the photosensitive chip 12.

It is worth mentioning that the height setting of the second shaping piece 132 is related to the relative positional relationship between the second shaping piece 132 and the first shaping piece 131. Specifically, the shape of the shaping surface 130 defined by the first shaping piece 131 and the second shaping piece 132 for defining the curved shape of the photosensitive chip 12 is set based on the shape of the actual focal plane. More specifically, when the second shaping piece 132 is close to the first shaping piece 131, the height difference between the first shaping piece 131 and the second shaping piece 132 should be reduced (that is, the height of the second shaping piece 132 should be increased); and when the second shaping piece 132 is away from the first shaping piece 131, the height difference between the first shaping piece 131 and the second shaping piece 132 should be increased (that is, the height of the second shaping piece 132 should be reduced). Preferably, the top surface of the second shaping piece body 1321 is bent inward and downward.

It is worth mentioning that, in the embodiment of the present application, the shape of the shaping surface 130 matches the shape of the actual focal plane, which does not mean that the shape of the shaping surface 130 is completely consistent with or completely coincides with the shape of the actual focal plane, and simply means that the shape of the shaping surface 130 tends to be consistent with the shape of the actual focal plane.

In particular, in the embodiment of the present application, an upper surface of at least one of the first shaping piece 131 and the second shaping piece 132 includes an arc-shaped surface recessed downward and inward, and the arc-shaped surface is configured so that when the photosensitive chip 12 is bent downward, a lower surface 122 adapted to the focal imaging plane of the photosensitive assembly 10 is formed, so as to form a downward curved shaping surface 130 through the upper surfaces of the first shaping piece 131 and the second shaping piece 132. Preferably, in the embodiment of the present application, the upper surfaces of the first shaping piece 131 and the second shaping piece 132 both include arc-shaped surfaces recessed downward and inward.

Correspondingly, the process of bending the photosensitive chip 12 includes:

bending the photosensitive chip 12 until the lower surface 122 of the photosensitive chip 12 is attached to the arc-shaped surface, so that when the photosensitive chip 12 is bent downward, a lower surface adapted to a focal imaging plane of the photosensitive assembly 10 is formed.

As shown in FIG. 48B, the fabrication process for the photosensitive assembly 10 further includes the following step:

forming a heat dissipation member 19 in the accommodating space 100 defined by the first shaping piece 131, the photosensitive chip 12 and the circuit board 11, wherein the heat dissipation member 19 is attached to at least a part of the lower surface 122 of the photosensitive chip 12.

Preferably, in the embodiment of the present application, the entire accommodating space 100 is fully filled with the heat dissipation member 19, so that the lower surface 122 (a part corresponding to the accommodating space 100) of the photosensitive chip 12 is completely in contact with the heat dissipation member 19, so as to maximize the heat dissipation area and improve the heat dissipation performance.

In a specific implementation, when the heat dissipation material 190 is implemented as a fluid-like heat dissipation material 190, the process of forming the heat dissipation member 19 in the accommodating space 100 includes: injecting the fluid-like heat dissipation material 190 into the accommodating space 100 through the opening 133 to form the heat dissipation member 19 after curing and molding.

In order to facilitate the operation, when performing the injection process, the photosensitive assembly 10 may be turned upside down to prevent the fluid-like heat dissipation material 190 from flowing out of the opening 133. In particular, when the number of the openings 133 is only one, in order to balance the internal and external pressures so that the fluid-like heat dissipation material 190 can be smoothly injected into the accommodating space 100, a ventilation hole 135 may be further provided in the circuit board 11. Of course, when the number of the openings 133 exceeds one, the air intake holes, except those being used for injecting the heat dissipation material 190, are functionally equivalent to the ventilation hole 135. That is to say, when the number of the openings 133 exceeds one, at least one of the openings forms the ventilation hole 135.

After the heat dissipation member 19 is molded, a reinforcing plate 18 may be further attached to the bottom surface of the circuit board 11, wherein preferably, the reinforcing plate 18 is made of a metal material with relatively high thermal conductivity. In this way, the heat dissipation performance of the photosensitive assembly 10 is further enhanced.

In a specific implementation, the heat dissipation material 190 is implemented in a granular heat dissipation material 190. The process of forming the heat dissipation member 19 in the accommodating space 100 includes: injecting the fluid-like heat dissipation material 190 into the accommodating space 100 through the opening 133; and attaching a reinforcing plate 18 to the bottom surface of the circuit board 11 to seal the opening 133 through the reinforcing plate 18. Preferably, the reinforcing plate 18 is made of a metal material with relatively high thermal conductivity, so as to further enhance the heat dissipation performance of the photosensitive assembly 10 while sealing the opening 133.

Further, the manufacturing process for the photosensitive assembly 10 further includes: disposing the bracket 16 on the circuit board 11, and mounting a filter element 15 on the bracket 16.

Specifically, in the COB process, the bracket 16 is implemented as a conventional plastic bracket 16. Correspondingly, the process of disposing the bracket 16 on the circuit board 11 is embodied in the following step: attaching and mounting the plastic bracket 16 to the circuit board 11. Further, the filter element 15 is attached and mounted to the bracket 16.

In the MOB process, the bracket 16 is implemented as a molded bracket 16A. Correspondingly, the process of disposing the bracket 16 on the circuit board 11 includes: integrally molding the molded bracket 16A on the circuit board 11 through a molding process, wherein the molded bracket 16A covers at least a part of the circuit board 11 and at least a part of the at least one electronic component 14. Further, the filter element 15 is attached and mounted to the molded bracket 16A.

It is worth mentioning that, in the MOB process, the first shaping piece 131 and the second shaping piece 132 are mounted at preset positions of the circuit board 11 after the molded bracket 16 is integrally molded at a preset position of the circuit board 11. Such a manufacturing sequence is advantageous to engineering implementation.

In the MOC process, the bracket 16 is implemented as a molded bracket 16B. Correspondingly, the process of disposing the bracket 16 on the circuit board 11 includes: integrally forming the molded bracket 16B on the circuit board 11 through a molding process, wherein the molded bracket 16B covers at least a part of the circuit board 11, the at least one electronic component 14, and at least a part of the non-photosensitive area 1212 of the photosensitive chip 12. Further, the filter element 15 is attached and mounted to the molded bracket 16B.

In order to prevent the positional deviation caused by the photosensitive chip 12 being impacted by the injected molding material during the execution of the MOC process, before performing the MOC process to form the molded bracket 16B, the process further includes applying a side encapsulation 161 on the side parts of the photosensitive chip 12 and the first shaping piece 131, so that the side encapsulation 161 encloses the side parts of the photosensitive chip 12 and the first shaping piece 131. In this way, the position of the photosensitive chip 12 is prevented from being shifted during the molding process. Further, the side encapsulation 161 can also play a buffering role, which reduces the stress transmitted from the molded bracket 16B to the photosensitive chip 12.

In the IOC process, the bracket 16 is implemented as a molded bracket 16C. Correspondingly, the process of disposing the bracket 16 on the circuit board 11 includes: stacking the filter element 15 on the photosensitive chip 12, and integrally molding the molded bracket 16C on the circuit board 11, wherein the molded bracket 16C integrally covers at least a part of the circuit board 11, the at least one electronic component 14, at least a part of a non-photosensitive area 1212 of the photosensitive chip 12, and at least a part of the filter element 15.

It is worth mentioning that in the MOB, MOC and IOC processes, the shape of the inner side surface of the molded bracket 16 is determined by the shape of the pressing block. In particular, when the inner side surface of the pressing block has a stepped shape, the inner side surface of the molded bracket 16 also has a stepped shape, so as to form a mounting platform 160 for mounting the filter element 15 on a top surface of the molded bracket 16. Correspondingly, in these examples, the filter element 15 is mounted on the mounting platform 160.

It is also worth mentioning that, in the embodiment of the present application, in addition to the filter element 15 being supported on the bracket 16 (including the plastic bracket 16, and the molded brackets 16A, 16B, 16C) and the photosensitive chip 12, the filter element 15 may also be mounted in other ways, as long as the filter element 15 is held in the photosensitive path of the photosensitive assembly 10. For example, in other examples of the embodiments of the present application, the photosensitive assembly 10 further includes a filter element holder 17, and the filter element holder 17 is mounted on the bracket 16, and is used for mounting the filter element 15. For another example, when the photosensitive assembly 10 cooperates with the optical lens 20 to form a camera module, the filter element 15 may also be supported in the optical lens 20, or may be formed on the surface of the lens element in the optical lens 20 in the form of coating. In this regard, it is not limited in the present application.

In summary, the manufacturing method for the photosensitive assembly based on the embodiment of the present application is explained, wherein the flat photosensitive chip is bent into a shape adapted to the actual focal imaging plane through the special manufacturing process, so as to improve the imaging quality of the camera module. Moreover, the heat dissipation member for enhancing heat dissipation is formed on the lower surface of the photosensitive chip, so as to improve the heat dissipation performance.

Exemplary Second Camera Module

The application of the photosensitive assembly 10 as described above to a camera module will be specifically described below. It is known by those skilled in the art that the camera module includes an auto-focus camera module and a fixed-focus camera module.

When the camera module is implemented as a fixed-focus camera module, the camera module includes the above-mentioned photosensitive assembly and an optical lens 20, wherein the optical lens 20 is held in a photosensitive path of the photosensitive assembly 10. Specifically, the optical lens 20 is usually mounted on the bracket 16 to hold the optical lens 20 on the photosensitive path of the photosensitive assembly 10, and for its specific effect, reference may be made to FIGS. 49 to 53. It is worth mentioning that the drawings only illustrate several typical photosensitive assemblies in the embodiments of the present application, and the corresponding modified implementations thereof are not listed one by one. In this regard, it should be fully understood by those skilled in the art.

During the imaging process, the external light first passes through the optical lens 20, and is then collected by the photosensitive chip 12 after being filtered by the filter element 15. In particular, in the embodiment of the present application, the photosensitive chip 12 is bent based on the shape of the actual focal plane, and in this way, the imaging quality of the camera module is improved.

Figure 54:
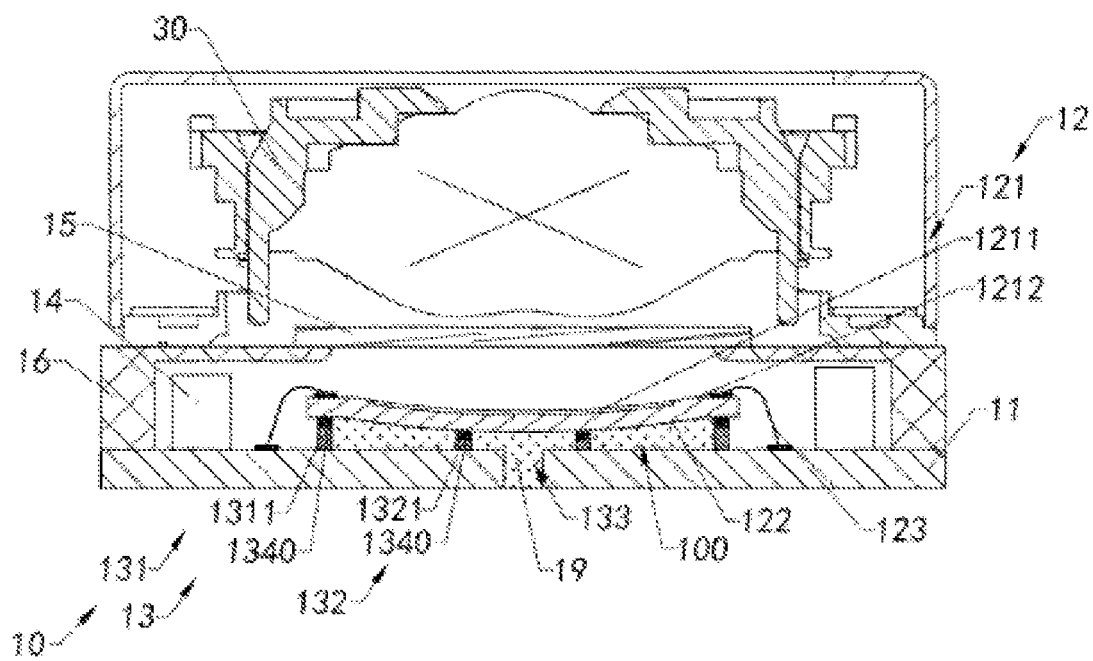
FIG. 54 illustrates a schematic view of a camera module according to an embodiment of the present application, wherein the camera module is an auto-focus camera module.

When the camera module is implemented as an auto-focus camera module, as shown in FIG. 54, the camera module includes photosensitive assembly as described above, an optical lens 20 and a driving element 30, wherein the driving element 30 is mounted on the bracket 16, and the optical lens 20 is mounted on the driving element 30. In this way, the driving element 30 can carry the optical lens 20 to move along the photosensitive path of the photosensitive assembly 10, so as to realize the auto-focus function. It is worth mentioning that the drawings only illustrate a typical photosensitive assembly in the embodiment of the present application, and the corresponding modified implementations are not listed one by one. In this regard, it should be fully understood by those skilled in the art.

In summary, the camera module based on the embodiment of the present application is explained, wherein the flat photosensitive chip 12 is bent into a shape adapted to the actual focal imaging plane through the special manufacturing process, so as to improve the imaging quality of the camera module.

It should be understood by those skilled in the art that the embodiments of the present invention described in the above description and shown in the drawings are only examples and do not limit the present invention. The objectives of the present invention have been achieved completely and efficiently. The function and structural principles of the present invention have been presented and described in the embodiments, and the implementations of the present invention may be varied or modified without departing from the principles.

The invention claimed is:

1. A photosensitive assembly, characterized in that it comprises:
   a circuit board;
   a photosensitive chip electrically connected to the circuit board; and
   a shaping member disposed on the circuit board, wherein a lower surface of the photosensitive chip is attached to the shaping member to form an accommodating space with the shaping member and the circuit board, wherein the circuit board has at least one opening formed therethrough and communicated with the accommodating space, and wherein the accommodating space and the at least one opening are configured so that the photosensitive chip is bent downward during a process of assembling the photosensitive assembly, and the shaping member comprises a first shaping piece and a second shaping piece, and a cross-sectional shape of the first shaping piece is a closed annular shape.

2. The photosensitive assembly according to claim 1, wherein the at least one opening is configured so that at least one suction device can be inserted into the accommodating space by means of the at least one opening and attached to at least a part of the lower surface of the photosensitive chip, so as to cause the photosensitive chip to be bent downward by pulling force.

3. The photosensitive assembly according to claim 2, wherein the first shaping piece forms the accommodating space with the photosensitive chip and the circuit board, the second shaping piece is disposed on the circuit board and is located in the accommodating space, and a height of the second shaping piece is lower than that of the first shaping piece.

4. The photosensitive assembly according to claim 3, wherein an upper surface of at least one of the first shaping piece and the second shaping piece comprises an arc-shaped surface recessed downward and inward, and the arc-shaped surface is configured so that when the photosensitive chip is bent downward, a lower surface adapted to a focal imaging plane of the photosensitive assembly is formed.

5. The photosensitive assembly according to claim 2, wherein a position where the at least one opening is formed in the circuit board corresponds to a central area of the photosensitive chip.

6. The photosensitive assembly according to claim 5, wherein a position where the suction device is attached to the lower surface of the photosensitive chip is a central area of the lower surface of the photosensitive chip.

7. The photosensitive assembly according to claim 4, wherein the second shaping pieces are symmetrically arranged with respect to a center of the photosensitive chip.

8. The photosensitive assembly according to claim 7, wherein the second shaping pieces are symmetrically arranged on both sides of a center line set by longer sides of the photosensitive chip.

9. The photosensitive assembly according to claim 1, wherein a cross-sectional shape of the second shaping piece is a closed annular shape, wherein the shaping member further comprises an adhesive disposed between the first shaping piece and the second shaping piece, and wherein a height of the adhesive is higher than the height of the second shaping piece.

10. The photosensitive assembly according to claim 3, wherein the first shaping piece comprises a first shaping piece body and an adhesive applied to the first shaping piece body, and wherein the second shaping piece comprises a second shaping piece body and an adhesive applied to the second shaping piece body.

11. The photosensitive assembly according to claim 9, wherein the first shaping piece body and the second shaping piece body are integrally molded on a top surface of the circuit board.

12. The photosensitive assembly according to claim 11, wherein the first shaping piece body and the second shaping piece body are prefabricated and mounted on the circuit board.

13. The photosensitive assembly according to claim 3, further comprising a heat dissipation member, wherein the heat dissipation member is formed in the accommodating space and attached to at least a part of the lower surface of the photosensitive chip.

14. The photosensitive assembly according to claim 13, wherein the heat dissipation member is formed by a heat dissipation material entering the accommodating space via the at least one opening.

15. A camera module, characterized in that it comprises:
    an optical lens; and the camera module according to claim 1, wherein the optical lens is held in a photosensitive path of the photosensitive assembly.

16. The camera module according to claim 15, wherein a curved shape of the lower surface of the photosensitive chip is adapted to a shape of an actual focal imaging plane of the camera module.

17. A photosensitive assembly, characterized in that it comprises:
- a circuit board;
- a photosensitive chip electrically connected to the circuit board; and
- a shaping member disposed on the circuit board, wherein a lower surface of the photosensitive chip is attached to the shaping member to form an accommodating space with the shaping member and the circuit board, and wherein the accommodating space is configured so that the photosensitive chip is bent downward during a process of assembling the photosensitive assembly, and the shaping member comprises a first shaping piece and a second shaping piece, and a cross-sectional shape of the first shaping piece is a closed annular shape.

18. The photosensitive assembly according to claim 17, wherein the first shaping piece forms the accommodating space with the photosensitive chip and the circuit board, the second shaping piece is disposed on the circuit board and is located in the accommodating space, and a height of the second shaping piece is lower than that of the first shaping piece.

19. The photosensitive assembly according to claim 18, wherein an upper surface of at least one of the first shaping piece and the second shaping piece comprises an arc-shaped surface recessed downward and inward, and the arc-shaped surface is configured so that when the photosensitive chip is bent downward, a lower surface adapted to a focal imaging plane of the photosensitive assembly is formed.

* * * * *